(12) United States Patent
Shintani et al.

(10) Patent No.: US 8,068,728 B2
(45) Date of Patent: Nov. 29, 2011

(54) IMAGING APPARATUS

(75) Inventors: Dai Shintani, Osaka (JP); Masato Murayama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/918,599

(22) PCT Filed: Feb. 20, 2009

(86) PCT No.: PCT/JP2009/000743
§ 371 (c)(1),
(2), (4) Date: Aug. 20, 2010

(87) PCT Pub. No.: WO2009/104418
PCT Pub. Date: Aug. 27, 2009

(65) Prior Publication Data
US 2010/0329655 A1  Dec. 30, 2010

(30) Foreign Application Priority Data
Feb. 22, 2008  (JP) .................. 2008-041577

(51) Int. Cl.
*G02B 7/28* (2006.01)
(52) U.S. Cl. ...................... 396/311; 348/335
(58) Field of Classification Search .......... 396/111; 348/272, 311, 360
See application file for complete search history.

(56) References Cited

U.S. PATENT DOCUMENTS

| | | |
|---|---|---|
| 4,500,189 A | 2/1985 | Aoki |
| 6,346,694 B1 | 2/2002 | Kimba et al. |
| 2004/0042780 A1 | 3/2004 | Kindaichi et al. |
| 2006/0120710 A1* | 6/2006 | Nagano et al. ............ 396/111 |

FOREIGN PATENT DOCUMENTS

| | | |
|---|---|---|
| JP | 59-62809 | 4/1984 |
| JP | 10-161014 | 6/1998 |
| JP | 11-352394 | 12/1999 |
| JP | 2004-46132 | 2/2004 |
| JP | 2005-175976 | 6/2005 |
| JP | 2007-135140 | 5/2007 |
| JP | 2007-163545 | 6/2007 |

* cited by examiner

*Primary Examiner* — Clayton E LaBalle
*Assistant Examiner* — Dennis Hancock
(74) *Attorney, Agent, or Firm* — McDermott Will & Emery LLP

(57) ABSTRACT

An imaging apparatus which can perform phase difference detection while causing light to enter an imaging device is provided.

An imaging unit (1) includes an imaging device (10) for receiving light to perform photoelectric conversion, the imaging device (10) being configured so that light passes through the imaging device (10), a phase difference detection unit (20) including a line sensor (24a) for receiving the light which has passed through the imaging device (10) to perform phase difference detection, and a condenser lens (21a), provided between the imaging device (10) and the line sensor (24a), for bending an optical path of the light which has passed through the imaging device (10) to direct the light to the line sensor (24a).

6 Claims, 29 Drawing Sheets

FIG. 27
(A) 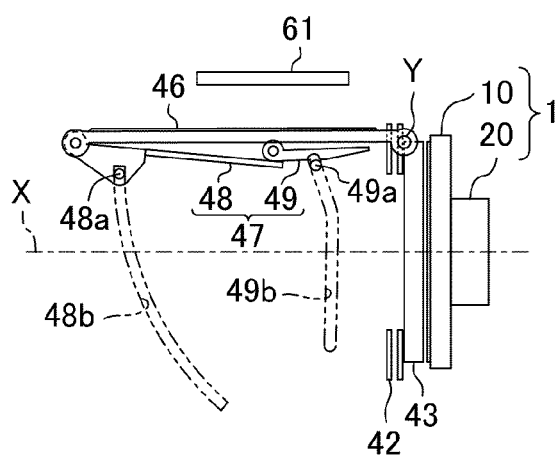
(B) 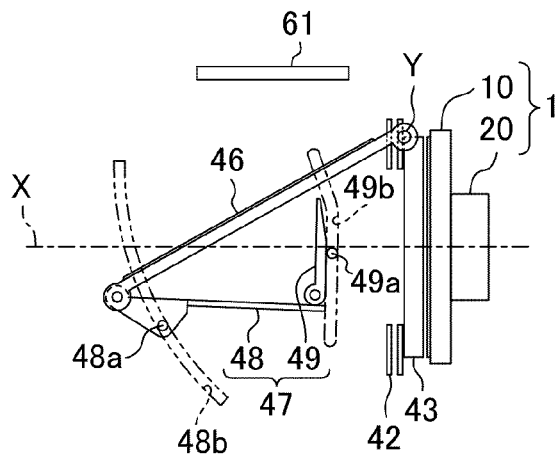
(C) 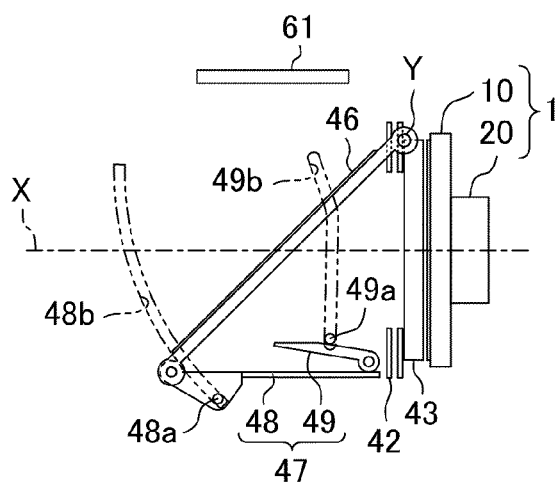

IMAGING APPARATUS

RELATED APPLICATIONS

This application is the U.S. National Phase under 35 U.S.C. §371 of International Application No. PCT/JP2009/000743, filed on Feb. 20, 2009, which in turn claims the benefit of Japanese Application No. 2008-041577, filed on Feb. 22, 2008, the disclosures of which Applications are incorporated by reference herein.

TECHNICAL FIELD

The present invention relates to an imaging apparatus including an imaging device for performing photoelectric conversion.

BACKGROUND ART

In recent years, digital cameras that convert an object image into an electrical signal using an imaging device such as a charge coupled device (CCD) image sensor, a complementary metal-oxide semiconductor (CMOS) image sensor or the like, digitizes the electrical signal, and records the obtained digital signal have been widely used.

Single-lens reflex digital cameras include a phase difference detection section for detecting a phase difference between object images, and have the phase difference detection AF function of performing autofocusing (hereinafter also simply referred to as "AF") by the phase difference detection section. Since the phase difference detection AF function allows detection of defocus direction and defocus amount, the moving time of a focus lens can be reduced, thereby achieving fast-focusing (see, for example, Patent Document 1). In known single-lens reflex digital cameras, provided is a movable mirror capable of moving in or out of an optical path from a lens tube to an imaging device in order to guide light from an object to a phase difference detection section.

In so-called compact digital cameras, the autofocus function by video AF using an imaging device (see, for example, Patent Document 2) is employed. Therefore, in compact digital cameras, a mirror for guiding light from an object to a phase difference detection section is not provided, thus achieving reduction in the size of compact digital cameras. In such compact digital cameras, autofocusing can be performed with the imaging device exposed to light. That is, it is possible to perform various types of processing using the imaging device, including, for example, obtaining an image signal from an object image formed on the imaging device to display the object image on an image display section provided on a back surface of the camera, or to record the object image in a recording section, while performing autofocusing. In general, this autofocus function by video AF advantageously has higher accuracy than that of phase difference detection AF.

Citation List

Patent Document

PATENT DOCUMENT 1: Japanese Patent Application No. 2007-163545

PATENT DOCUMENT 2: Japanese Patent Application No. 2007-135140

SUMMARY OF THE INVENTION

Technical Problem

However, a defocus direction cannot be instantaneously detected by video AF. For example, when contrast detection AF is employed, a focus is detected by detecting a contrast peak, but a contrast peak direction, i.e., a defocus direction cannot be detected unless a focus lens is shifted to back and forth from its current position, or the like. Therefore, it takes a longer time to detect a focus.

In view of reducing a time required for detecting a focus, phase difference detection AF is more advantageous. However, in an imaging apparatus such as a single-lens reflex digital camera according to Patent Document 1 employing phase difference detection AF, a movable mirror has to be moved to be on an optical path from a lens tube to an imaging device in order to guide light from an object to a phase difference detection section. Thus, various types of processing using the imaging device cannot be performed while phase difference detection AF is performed. Also, even if the time required for detecting a focus is reduced by using phase difference detection AF, the movable mirror still has to be moved when an optical path of incident light is switched between a path toward the phase difference detection section and a path toward the imaging device. Thus, disadvantageously, a time lag is generated by moving the movable mirror.

In view of the above-described points, the present invention has been devised, and it is therefore an object of the present invention to provide an imaging apparatus which can perform phase difference detection while causing light to enter an imaging device.

Solution to the Problem

To solve the above-described problems, after diligent study, the present inventor has devised an imaging apparatus which is configured so that light passes through an imaging device, and a phase difference detection section for performing phase difference detection is provided in a back surface side of the imaging device, and thus, can detect a phase difference of object images with the phase detection section using light which has passed through the imaging device, while causing light to enter an imaging device to perform various types of processing using the imaging device. To realize a compact configuration which meets the recent demand for reduction in size of imaging apparatuses, the inventor devised an imaging device having the above-described configuration according to the present invention.

Specifically, an imaging apparatus according to the present invention includes an imaging device for receiving light to perform photoelectric conversion, the device being configured so that light passes through the imaging device, a phase difference detection section including a sensor for receiving light which has passed through the imaging device to perform phase difference detection, and a bending section, provided between the imaging device and the sensor, for bending an optical path of light which has passed through the imaging device to direct the light to the sensor.

Advantages of the Invention

According to the present invention, the bending section is provided between the imaging device and the sensor, thereby bending an optical path of light which has passed through the imaging device to direct the light to the sensor. Thus, the sensor does not have to be arranged on an extension of the optical path in a direction in which light passes through the imaging device, and may be arranged at a position to which the bent optical path of light which has passed through the imaging device extends. Therefore, a dimension of the imaging apparatus in the direction in which light passes through the imaging device can be reduced.

BRIEF DESCRIPTION OF THE DRAWINGS

FIGS. 27(A) through 27(C) are perspective views illustrating a configuration of a quick return mirror. FIG. 27(A) illustrates the quick return mirror in a retracted position. FIG. 27(B) illustrates the quick return mirror in a position between the retracted position and a reflection position. FIG. 27(C) illustrates the quick return mirror in the reflection position.

DESCRIPTION OF REFERENCE CHARACTERS

1, 201, 301, 401, 501, 601, 701 Imaging Unit (Imaging Apparatus)
10, 210, 310 Imaging Device
20, 220, 320, 420, 520, 620, 720 Phase Difference Detection Unit (Phase Difference Detection Section)
21a, 521a Condenser Lens (Bending Section)
23a, 723a Separator Lens (Bending Section)
24a Line Sensor (Sensor)
228 Prism
329 Reflector
100, 200 Camera

DESCRIPTION OF EMBODIMENTS

Embodiments of the present invention will be described hereinafter in detail with reference to the accompanying drawings.

First Embodiment

Figure 1:
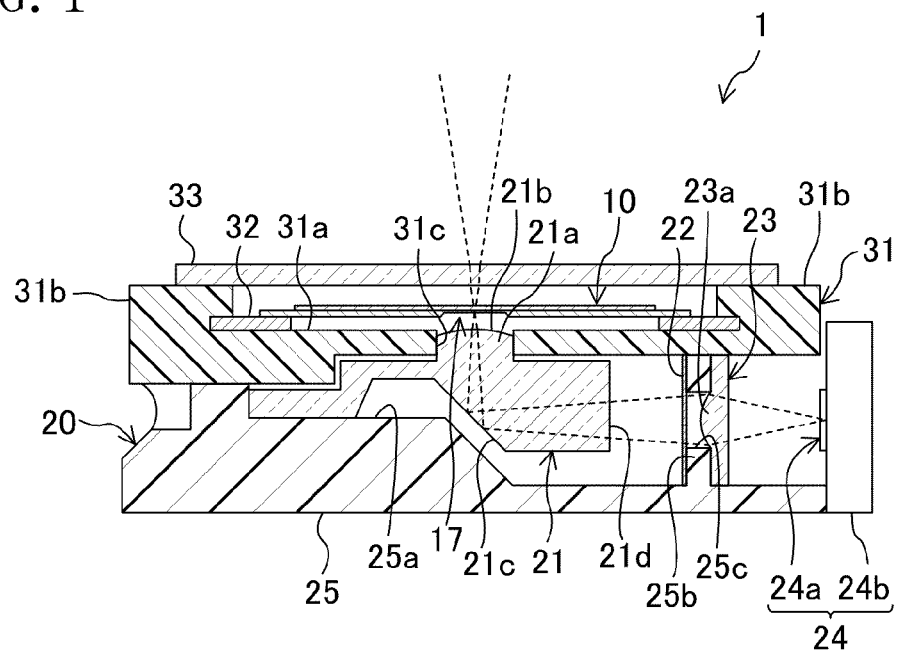
FIG. 1 is a cross-sectional view of an imaging unit according to a first embodiment of the present invention.
Figure 2:
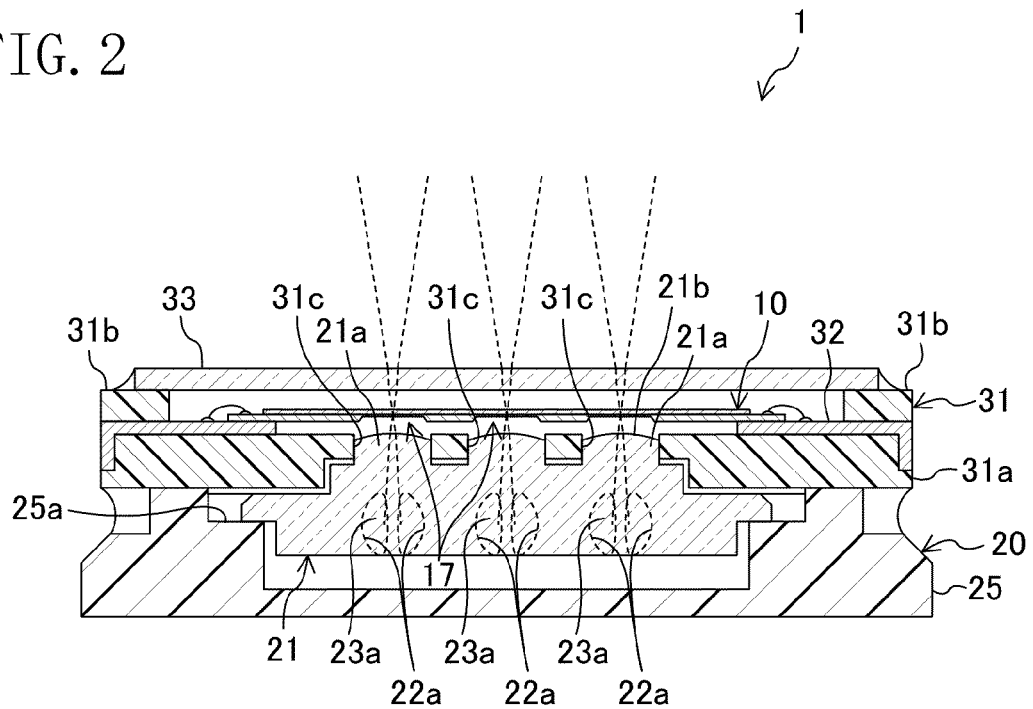
FIG. 2 is a cross-sectional view illustrating a cross section of the imaging unit, which is perpendicular to the cross section thereof corresponding to FIG. 1.

An imaging unit 1 as an imaging apparatus according to a first embodiment of the present invention is shown in FIGS. 1 and 2. The imaging unit 1 includes an imaging device 10 for converting an object image into an electrical signal, a package 31 for holding the imaging device 10, and a phase difference detection unit 20 for performing focus detection using a phase difference detection.

Figure 3:
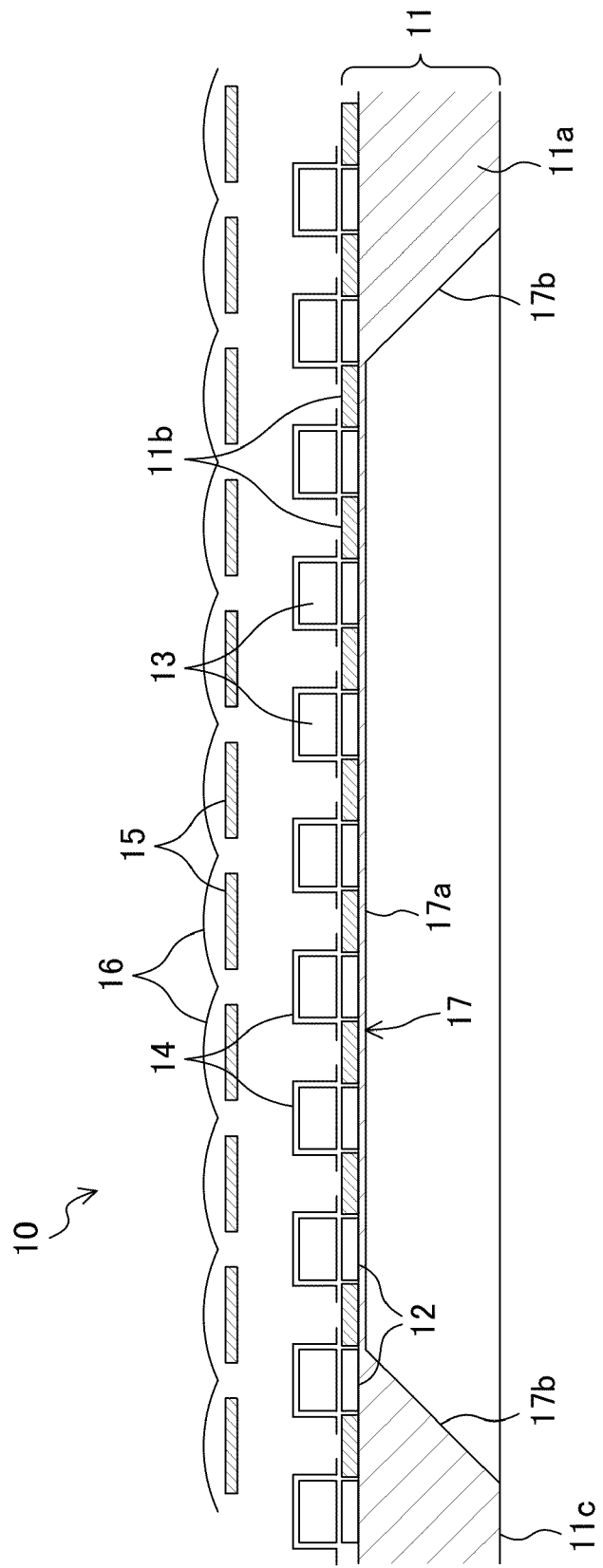
FIG. 3 is a cross-sectional view of the imaging device.

The imaging device 10 is an interline type CCD image sensor, and, as shown in FIG. 3, includes a photoelectric conversion section 11 made of a semiconductor material, vertical registers 12, transfer paths 13, masks 14, color filters 15, and microlenses 16.

The photoelectric conversion section 11 includes a substrate 11a and a plurality of light receiving sections (also referred to as "pixels") 11b arranged on the substrate 11a.

The substrate 11a is made of a Si (silicon) based substrate. Specifically, the substrate 11a is made of a Si single crystal substrate or a SOI (silicon-on-insulator wafer). In particular, an SOI substrate has a sandwich structure of Si thin films and a $SiO_2$ thin film, and chemical reaction can be stopped at the $SiO_2$ film in etching or like processing. Thus, in terms of performing stable substrate processing, it is advantageous to use an SOI substrate.

Each of the light receiving sections 11b is made of a photodiode, and absorbs light to generate electrical charges. The light receiving sections 11b are provided in micro pixel regions each having a square shape, arranged in matrix on the substrate 11a (see FIG. 4).

The vertical register 12 is provided for each light receiving section 11b, and serves to temporarily store electrical charges stored in the light receiving section 11b. The electrical charges stored in the light receiving section 11b are transferred to the vertical register 12. The electrical charges transferred to the vertical register 12 are transferred to a horizontal register (not shown) via the transfer path 13, and then, to an amplifier (not shown). The electrical charges transferred to the amplifier are amplified and pulled out as an electrical signal.

The mask 14 is provided so that the light receiving sections 11b is exposed toward an object while the vertical register 12 and the transfer path 13 are covered by the mask 14, thereby preventing light from entering the vertical register 12 and the transfer path 13.

Figure 4:
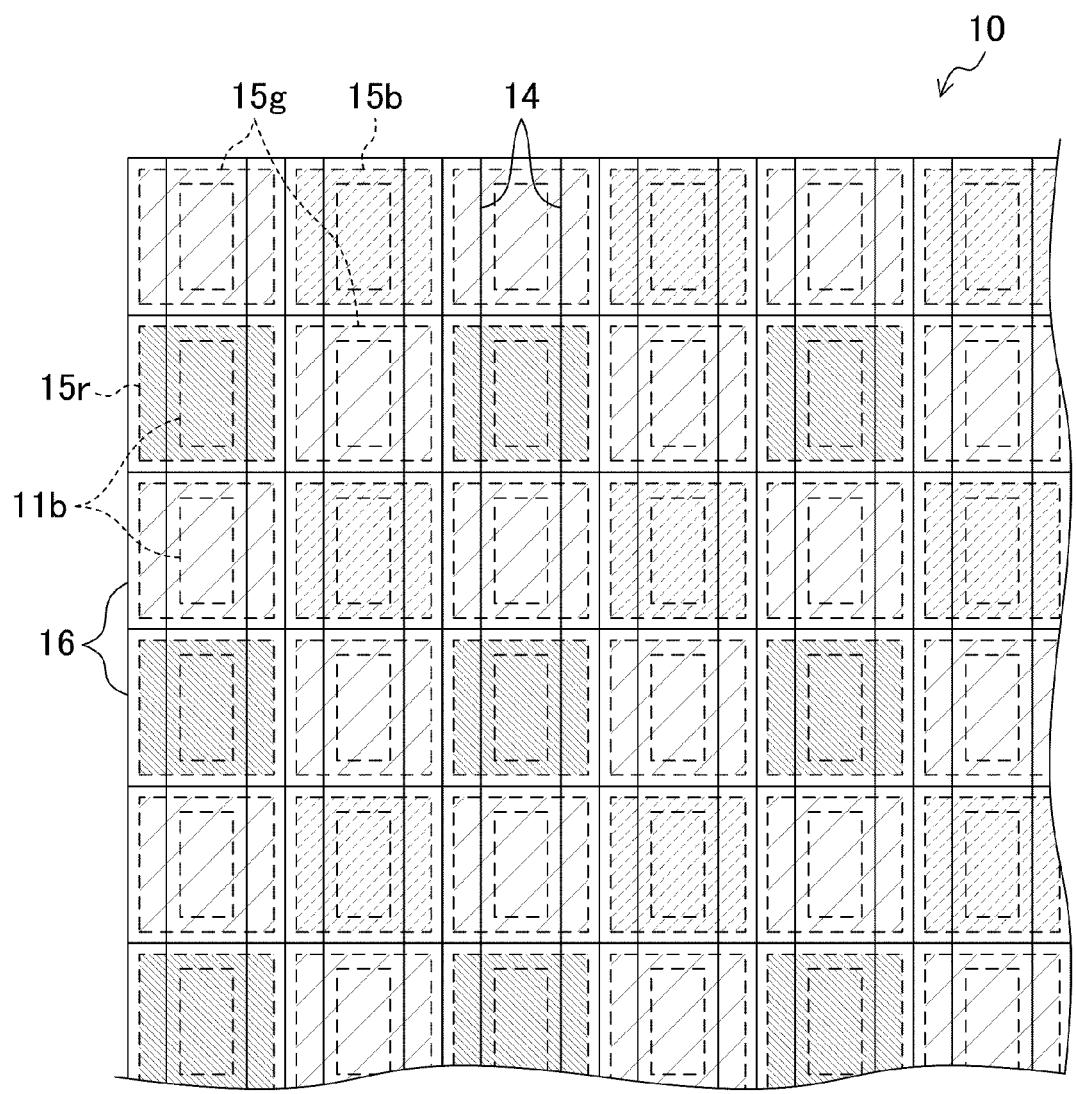
FIG. 4 is a plan view of the imaging device.

The color filter 15 and the microlens 16 are provided in each micro pixel region having a square shape to correspond to an associated one of the light receiving sections 11b. Each of the color filters 15 transmits only a specific color, and primary color filters or complementary color filters are used as the color filters 15. In this embodiment, as shown in FIG. 4, so-called Bayer primary color filters are used. That is, assuming that four color filters 15 arranged adjacent to one another in two rows and two columns (or in four pixel regions) are a repeat unit throughout the entire imaging device 10, two green color filters 15g (i.e., color filters having a higher transmittance in a green visible light wavelength range than in the other color visible light wavelength ranges) are arranged in a diagonal direction, and a red color filter 15r (i.e., a color filter having a higher transmittance in a red visible light wavelength range than in the other color visible light wavelength ranges) and a blue color filter 15b (i.e., a color filter having a higher transmittance in a blue visible light wavelength range than in the other color visible light wavelength ranges) are arranged in another diagonal direction. When the entire set of the color filters 15 is viewed, every second color filter in the row and column directions is the green color filter 15g.

The microlenses 16 collect light to cause the light to enter the light receiving sections 11b. The light receiving sections 11b can be efficiently irradiated with light by the microlenses 16.

In the imaging device 10 configured in the above-described manner, light collected by the microlens 16 enters the color filters 15r, 15g and 15b. Then, only light having a corresponding color to each color filter is transmitted through the color filter, and an associated one of the light receiving sections 11b is irradiated with the light. Each of the light receiving sections 11b absorbs light to generate electrical charges. The electrical charges generated by the light receiving sections 11b are transferred to the amplifier via the vertical register 12 and the transfer path 13, and are output as an electrical signal. That is, the amount of received light having a corresponding color to each color filter is obtained from each of the light receiving sections 11b as an output.

Thus, the imaging device 10 performs photoelectric conversion at the light receiving sections 11b provided throughout the entire imaging plane, thereby converting an object image formed on an imaging plane into an electrical signal.

In this case, a plurality of light transmitting portions 17 for transmitting irradiation light are formed in the substrate 11a. The light transmitting portions 17 are formed by cutting, polishing or etching an opposite surface (hereinafter also referred to as a "back surface") 11c of the substrate 11a to a surface thereof on which the light receiving sections 11b are provided to provide concave-shaped recesses, and each of the light transmitting portions 17 has a smaller thickness than that of a part of the substrate 11a located around each of the light transmitting portions 17. More specifically, each of the light transmitting portions 17 includes a recess-bottom surface 17a having a smallest thickness and an inclined surfaces 17b for connecting the recess-bottom surface 17a with the back surface 11c.

Each of the light transmitting portions 17 in the substrate 11a is formed to have a thickness which allows light to transmit through the light transmitting portion 17, so that a part of irradiation light onto the light transmitting portions 17 is not converted into electrical charges and is transmitted through the photoelectric conversion section 11. For example, by forming the substrate 11a so that each of parts thereof located in the light transmitting portions 17 has a thickness of 2-3 µm, about 50% of light having a longer wavelength than that of near infrared light can be caused to transmit through the light transmitting portions 17.

Each of the inclined surfaces 17b is set to be at an angle at which light reflected with the inclined surfaces 17b is not directed to condenser lenses 21a of the phase difference detection unit 20, which will be described later, when light is transmitted through the light transmitting portions 17. Thus, formation of a non-real image on a line sensor 24a, which will be described later, is prevented.

Each of the light transmitting portions 17 serves as a reduced-thickness portion, which transmits light entering the imaging device 10, i.e., which allows light entering the imaging device 10 to pass therethrough. The term "passing" includes the concept of "to be transmitted" at least in this specification.

The imaging device 10 configured in the above-described manner is held in the package 31 (see FIG. 1). The package 31 serves as a holding portion.

Specifically, the package 31 includes a flat bottom plate 31a provided with a frame 32, and upright walls 31b provided in four directions. The imaging device 10 is mounted on the frame 32 to be surrounded by the upright walls 31b in four directions, and is electrically connected to the frame 32 via bonding wires.

Moreover, a cover glass 33 is attached to ends of the upright walls 31b of the package 31 to cover the imaging plane of the imaging device 10 (on which the light receiving sections 11b are provided). The imaging plane of the imaging device 10 is protected by the cover glass 33 from dust and the like being attached thereto.

In this case, the same number of openings 31c as the number of the light transmitting portions 17 are formed in the bottom plate 31a of the package 31 to pass through the bottom plate 31a and be located at corresponding positions to the positions of the light transmitting portions 17 of the imaging device 10. With the openings 31c provided, light transmitted through the imaging device 10 reaches the phase difference detection unit 20, which will be described later. The openings 31c serve as light passing portions.

In the bottom plate 31a of the package 31, the openings 31c do not have to be necessarily formed to pass through the bottom plate 31a. That is, as long as light transmitted through the imaging device 10 can reach the phase difference detection unit 20, a configuration in which transparent portions or semi-transparent portions are formed in the bottom plate 31a, or like configuration may be employed.

The phase difference detection unit 20 is provided in the back surface (an opposite surface to a surface facing an object) side of the imaging device 10 and receives light transmitted through the imaging device 10 to perform phase difference detection. Specifically, the phase difference detection unit 20 converts the received transmitted light into an electrical signal to be used for distance measurement. The phase difference detection unit 20 serves as a phase difference detection section.

Figure 5:
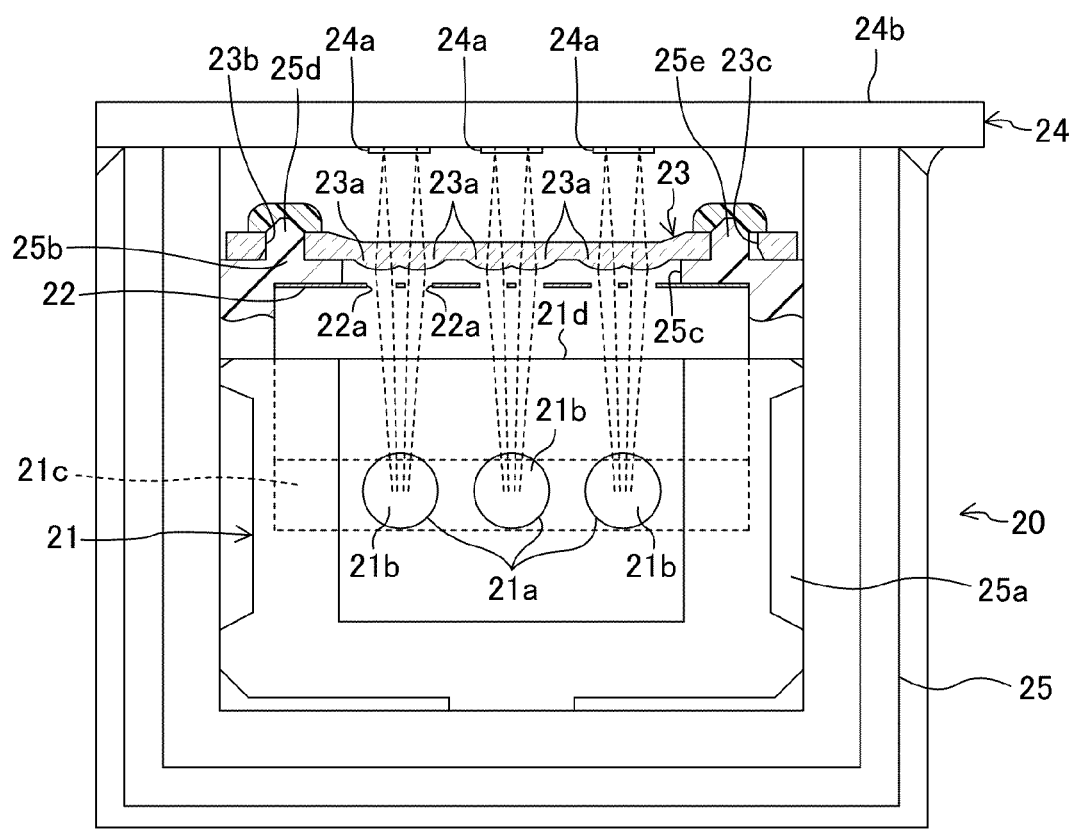
FIG. 5 is a plan view of a phase difference detection unit.

As shown in FIGS. 1, 2 and 5, the phase difference detection unit 20 includes a condenser lens unit 21, a mask member 22, a separator lens unit 23, a line sensor unit 24, a module frame 25 to which the condenser lens unit 21, the mask member 22, the separator lens unit 23 and the line sensor unit 24 are attached. The condenser lens unit 21, the mask member 22, the separator lens unit 23 and the line sensor unit 24 are arranged in this order from the imaging device 10 side.

The plurality of condenser lenses 21a integrated into a single unit form the condenser lens unit 21. The same number of the condenser lenses 21a as the number of the light transmitting portions 17 are provided. Each of the condenser lenses 21a collects incident light. The condenser lens 21a collects light transmitted through the imaging device 10 and spreading out, and guides the light to a separator lens 23a of the separator lens unit 23, which will be described later. Each of the condenser lenses 21a is formed so that an incident surface 21b of the condenser lens 21a has a convex shape and a part thereof located close to the incident surface 21b has a circular column shape.

Since an incident angle of light entering each of the separator lenses 23a is reduced by providing the condenser lenses 21a, an aberration of the separator lens 23a can be reduced, and a distance between object images on a line sensor 24a which will be described later can be reduced. As a result, the size of each of the separator lenses 23a and the line sensor 24a can be reduced. Additionally, when a focus position of an object image from the imaging optical system greatly diverges from the imaging unit 1 (specifically, greatly diverges from the imaging device 10 of the imaging unit 1), the contrast of the image is remarkably reduced. According to this embodiment, however, due to the size-reduction effect of the condenser lenses 21a and the separator lenses 23a, reduction in contrast can be prevented, so that a focus detection range can be increased. If highly accurate phase difference detection around a focus position is performed, or if the separator lenses 23a, the line sensors 24a and the like are of sufficient dimensions, the condenser lens unit 21 does not have to be provided. In such a case, a prism including a reflection surface 21c, or the like has to be additionally provided.

The condenser lens unit 21 further includes a reflection surface 21c and an output surface 21d and, in the condenser lens unit 21, light collected by the condenser lenses 21a is reflected on the reflection surface 21c at an angle of about 90 degrees, and is output from the output surface 21d. That is, an optical path of light which has been transmitted through the imaging device 10 and has entered the condenser lens unit 21 is bent substantially at a right angle by the reflection surface 21c and is output from the output surface 21d to the separator lens unit 23. The condenser lens unit 21, i.e., the condenser lenses 21a serve as a bending section.

The mask member 22 is provided between the condenser lens unit 21 and the separator lens unit 23. In the mask member 22, two mask openings 22a are formed in a part thereof corresponding to each of the separator lenses 23a. That is, the mask member 22 divides a lens surface of each of the separator lenses 23a into two areas, so that only the two areas are exposed toward the condenser lenses 21a. More specifically, the mask member 22 performs pupil division to divide light transmitted through each condenser lens unit 21 into two light beams and causes the two light beams to enter the separator lens 23a. The mask member 22 can prevent harmful light from one of adjacent two of the separator lenses 23a from entering the other one of the adjacent two. Note that the mask member 22 does not have to be provided.

The separator lens unit 23 includes a plurality of separator lenses 23a. In other words, the separator lenses 23a are integrated into a single unit to form the separator lens unit 23. Like the condenser lenses 21a, the same number of the separator lens 23a as the number of light transmitting portions 17 are provided. Each of the separator lenses 23a forms two identical object images on the line sensor 24a from two light beams which have passed through the mask member 22 and has entered the separator lens 23a.

The line sensor unit 24 includes a plurality of line sensors 24a and a mounting portion 24b on which the line sensors 24a are mounted. Like the condenser lenses 21a, the same number of the line sensors 24a as the number of the light transmitting portions 17 are provided. Each of the line sensors 24a receives an image formed on an imaging plane and converts the image into an electrical signal. That is, a distance between the two object images can be detected from an output of the line sensor 24a, and a shift amount (defocus amount: Df amount) of a focus of an object image to be formed on the imaging device 10, and the direction (defocus direction) in which the focus is shifted can be obtained based on the distance. (The Df amount, the defocus direction and the like will be hereinafter also referred to as "defocus information.")

The condenser lens unit 21, the mask member 22, the separator lens unit 23 and the line sensor unit 24, configured in the above-described manner, are provided in the module frame 25.

The module frame 25 is formed to have a box shape, and a step portion 25a for attaching the condenser lens unit 21 is provided in the module frame 25. The condenser lens unit 21 is attached to the step portion 25a so that the condenser lenses 21a face outward from the module frame 25.

Moreover, in the module frame 25, an attachment wall potion 25b for attaching the mask member 22 and the separator lens unit 23 is provided at a part facing the output surface 21d of the condenser lens unit 21. An opening 25c is formed in the attachment wall potion 25b.

The mask member 22 is attached to a side of the attachment wall potion 25b located closer to the condenser lens unit 21. In this state, the mask openings 22a of the mask member 22 overlap with the opening 25c of the attachment wall potion 25b, and the mask openings 22a communicates with the opening 25c.

The separator lens unit 23 is attached to the attachment wall potion 25b from an opposite side to a side of the attachment wall potion 25b facing the condenser lens unit 21. The attachment wall potion 25b is provided with positioning pins 25d and direction reference pins 25e each protruding at the opposite side to the side of the attachment wall potion 25b facing the condenser lens unit 21. The separator lens unit 23 is provided with positioning holes 23b and direction reference holes 23c corresponding respectively to the positioning pins 25d and the direction reference pins 25e. Respective diameters of the positioning pins 25d and the positioning holes 23b are determined so that the positioning pins 25d closely fit in the positioning holes 23b. Respective diameters of the direction reference pins 25e and the direction reference holes 23c are determined so that the direction reference pins 25e loosely fit in the direction reference holes 23c. That is, the attitude of the separator lens unit 23, such as the direction in which the separator lens unit 23 is arranged when being attached to the attachment wall potion 25b, is defined by inserting the positioning pins 25d and the direction reference pins 25e of the attachment wall potion 25b in the positioning holes 23b and the direction reference holes 23c, and the position of the separator lens unit 23 is determined relative to the attachment wall potion 25b by providing a close fit of the positioning pins 25d with the positioning holes 23b. Thus, when the attitude and position of the separator lens unit 23 are determined and then the separator lens unit 23 is attached, the lens surface of each of the separator lenses 23a is directed toward the condenser lens unit 21 and bulges in the opening 25c.

That is, in the state where the mask member 22 and the separator lens unit 23 are attached to the attachment wall potion 25b, a pair of the mask openings 22a of the mask member 22 and the separator lens 23a of the separator lens unit 23 are arranged so that light output from the condenser lens unit 21 enters the pair of mask openings 22a and the separator lens 23a (i.e., the mask openings 22a overlap the separator lens 23a in the direction in which the light from the condenser lens unit 21 is output).

Then, the line sensor unit 24 is attached to the module frame 25 from the back surface side of the separator lens unit 23 (which is an opposite side to the side facing the condenser lens unit 21). In this case, the line sensor unit 24 is attached to the module frame 25 while being held in a position which allows light transmitted through each of the separator lenses 23a to enter an associated one of the line sensors 24a.

Thus, the condenser lens unit 21, the mask member 22, the separator lens unit 23 and the line sensor unit 24 are attached to the module frame 25, and thereby, the condenser lenses 21a, the mask member 22, the separator lenses 23a and the line sensor 24a are arranged to be located at determined positions so that incident light to the condenser lenses 21a is transmitted through the condenser lenses 21a to enter the separator lenses 23a via the mask member 22, and then, the light transmitted through the separator lenses 23a forms an image on each of the line sensors 24a.

The imaging device 10 and the phase difference detection unit 20 configured in the above-described manner are joined together. Specifically, the imaging device 10 and the phase difference detection unit 20 are configured so that the openings 31c of the package 31 in the imaging device 10 closely fit the condenser lenses 21a in the phase difference detection unit 20. That is, with the condenser lenses 21a in the phase difference detection unit 20 inserted in the openings 31c of the package 31 in the imaging device 10, the module frame 25 is bonded to the package 31. Thus, the respective positions of the imaging device 10 and the phase difference detection unit 20 are determined, and then, the imaging device 10 and the phase difference detection unit 20 are joined together while being held in the positions. As described above, the condenser lenses 21a, the separator lenses 23a and the line sensors 24a are integrated into a single unit, and then are attached as a signal unit to the package 31.

The imaging device 10 and the phase difference detection unit 20 may be configured so that all of the openings 31c closely fit all of the condenser lenses 21a. Alternatively, the imaging device 10 and the phase difference detection unit 20 may be also configured so that only some of the openings 31c closely fit associated ones of the condenser lenses 21a, and the rest of the openings 31c loosely fit associated ones of the condenser lenses 21a. In the latter case, the imaging device 10 and the phase difference detection unit 20 are preferably configured so that one of the condenser lenses 21a and one of the openings 31c located closest to the center of the imaging plane closely fit each other to determine positions in the imaging plane, and furthermore, one of the condenser lenses 21a and one of the openings 31c located most distant from the center of the imaging plane closely fit each other to determine circumferential positions (rotation angles) of the condenser lens 21a and the opening 31c which are located at the center of the imaging plane.

As a result of joining the imaging device 10 and the phase difference detection unit 20 together, the condenser lens 21a, the pair of the mask openings 22a of the mask member 22, the separator lens 23a and the line sensor 24a are arranged in the back surface side of the substrate 11b to correspond to each of the light transmitting portions 17.

It should be noted that only the condenser lenses 21a align with the light transmitting portions 17 in the thickness direction of the imaging device 10. Although the mask member 22, the separator lens unit 23 and the line sensor unit 24 are provided in the back surface side of the imaging device 10, they are arranged relative to the condenser lenses 21a in the direction parallel to the imaging plane of the imaging device 10. That is, the condenser lenses 21a, the mask member 22, the separator lens unit 23 and the line sensor unit 24 are arranged in the back surface side of the imaging device 10 in the direction parallel to the imaging plane of the imaging device 10. Therefore, a dimension of the imaging unit 1 in the thickness direction of the imaging device 10 can be reduced.

Relative to the imaging device 10 configured to transmit light therethrough, the openings 31c are formed in the bottom plate 31a of the package 31 for housing the imaging device 10, and thereby, light transmitted through the imaging device 10 is easily caused to reach the back surface side of the package 31. Also, the phase difference detection unit 20 is arranged in the back surface side of the package 31, and thus, a configuration where light transmitted through the imaging device 10 is received at the phase difference detection unit 20 can be easily realized.

As long as light transmitted through the imaging device 10 can pass through the openings 31c formed in the bottom plate 31a of the package 31 to the back surface side of the package 31, any configuration can be employed for the openings 31c. However, by forming the openings 31c as through holes, light transmitted through the imaging device 10 can be caused to reach the back surface side of the package 31 without attenuating light transmitted through the imaging device 10.

With the openings 31c provided to closely fit the condenser lenses 21a, positioning of the phase difference detection unit 20 relative to the imaging device 10 can be performed using the openings 31c. If the condenser lenses 21a are not provided, the separator lenses 23a are configured to fit the openings 31c. Thus, positioning of the phase difference detection unit 20 relative to the imaging device 10 can be performed in the same manner.

In addition, the condenser lenses 21a can be provided to pass through the bottom plate 31a of the package 31 and reach a close point to the substrate 11a. Thus, the dimension of the imaging unit 1 in the thickness direction of the imaging device 10 can be further reduced.

The operation of the imaging unit 1 configured in the above-described manner will be described hereinafter.

When light enters the imaging unit 1 from an object, the light is transmitted through the cover glass 33 and enters the imaging device 10. The light is collected by the microlenses 16 of the imaging device 10, and then, is transmitted through the color filters 15, so that only light of a specific color reaches the light receiving sections 11b. The light receiving sections 11b absorbs light to generate electrical charges. Generated electrical charges are transferred to the amplifier via the vertical register 12 and the transfer path 13, and are output as an electrical signal. Thus, each of the light receiving sections 11b converts light into an electrical signal throughout the entire imaging plane, and thereby, the imaging device 10 converts an object image formed on the imaging plane into an electrical signal for generating an image signal.

In the light transmitting portions 17, a part of irradiation light to the imaging device 10 is transmitted through the imaging device 10. The light transmitted through the imaging device 10 enters the condenser lenses 21a which are provided to closely fit the openings 31c of the package 31. The light which has entered each of the condenser lenses 21a is reflected on the reflection surface 21c at an angle of about 90 degrees, and is output from the condenser lens unit 21 via the output surface 21d while being collected. That is, while the light transmitted through the condenser lens unit 21 is collected, the optical path of the light is bent substantially at a right angle. The light transmitted through each of the condenser lens unit 21 is divided into two light beams, when passing through each pair of mask openings 22a formed in the mask member 22, and then, enters each of the separator lenses 23a. Light subjected to pupil division is transmitted through the separator lens 23a, and identical object images are formed at two positions on the line sensor 24a. Similarly to the photoelectric conversion section 11, the line sensor 24a performs photoelectric conversion to output the amount of light at each of the light receiving sections as an electrical signal.

The imaging device 10 is connected to a control section (to which, for example, a body control section 5 according to a second embodiment described below corresponds, although not shown in the drawings) for processing an electrical signal from the imaging device 10 to generate an image signal. In this embodiment, the control section is not provided in the imaging unit 1, but the control section may be configured so that the imaging unit 1 includes the control section.

The control section obtains output data corresponding to positional information of each of the light receiving sections 11b and the amount of light received by the light receiving section 11b from the entire imaging plane of the imaging device 10, thereby obtaining an object image formed on the image plane as an electrical signal.

In this case, in the light receiving sections 11b, even when the same light amount is received, the amount of accumulated charges are different among different lights having different wavelengths. Thus, outputs from the light receiving sections 11b of the imaging device 10 are corrected according to the types of the color filters 15r, 15g and 15b provided to the light receiving sections 11b. For example, a correction amount for each pixel is determined so that, when each of a R pixel 11b to which the red color filter 15r is provided, a G pixel 11b to which the green color filter 15g is provided, and a B pixel 11b to which the blue color filter 15b is provided receives the same amount of light corresponding to the color of each color filter, respective outputs of the R pixel 11b, the G pixel 11b and the B pixel 11b become at the same level.

In this embodiment, the light transmitting portions 17 are provided in the substrate 11a, and thus, the photoelectric conversion efficiency is reduced in the light transmitting portions 17, compared to the other portions. That is, even when the pixels 11b receive the same light amount, the amount of accumulated charges is smaller in ones of the pixels 11b provided in positions corresponding to the light transmitting portions 17 than in the other ones of the pixels 11b provided in positions corresponding to the other portions. Accordingly, when the same image processing as image processing for output data from the pixels 11b provided in positions corresponding to the other portions is performed to output data from the pixels 11b provided in positions corresponding to the light transmitting portions 17, parts of an image corresponding to the light transmitting portions 17 might not be able to be properly shot (for example, shooting image is dark). Therefore, an output of each of the pixels 11b in the light transmitting portions 17 is corrected to eliminate or reduce influences of the light transmitting portions 17 (for example, by amplifying an output of each of the pixels 11b in the light transmitting portions 17 or like method).

Reduction in output varies depending on the wavelength of light. That is, as the wavelength increases, the transmittance of the substrate 11a increases. Thus, depending on the types of the color filters 15r, 15g and 15b, the amount of light transmitted through the substrate 11a differs. Therefore, when correction to eliminate or reduce influences of the light transmitting portions 17 on each of the pixels 11b corresponding to the light transmitting portions 17 is performed, the correction amount is changed according to the wavelength of light received by each of the pixels 11b. That is, for each of the pixels 11b corresponding to the light transmitting portions 17, the correction amount is increased as the wavelength of light received by the pixel 11b increases.

As described above, in each of the pixels 11b, the correction amount for eliminating or reducing the difference of the amount of accumulated charges depending on the types of color of received light is determined. In addition to the correction to eliminate or reduce the difference of the amount of accumulated charges depending on the types of color of received light, correction to eliminate or reduce influences of the light transmitting portions 17 is performed. That is, the correction amount for eliminating or reducing influences of the light transmitting portions 17 is a difference between the correction amount for each of the pixels 11b corresponding to the light transmitting portions 17 and the correction amount for the pixels 11b which correspond to the other portions than the light transmitting portions 17 and receive light having the same color. In this embodiment, different correction amounts are determined for different colors, based on the following relationship. Thus, a stable image output can be obtained.

$$Rk > Gk > Bk \qquad \text{[Expression 1]}$$

where Rk is: a difference obtained by deducting the correction amount for R pixels in the other portions than the light transmitting portions 17 from the correction amount for R pixels in the light transmitting portions 17, Gk is: a difference obtained by deducting the correction amount for G pixels in the other portions than the light transmitting portions 17 from the correction amount for G pixels in the light transmitting portions 17, and Bk is: a difference obtained by deducting the correction amount for B pixels in the other portions than the light transmitting portions 17 from the correction amount for B pixels in the light transmitting portions 17.

Specifically, since the transmittance of red light having the largest wavelength is the highest of the transmittances of red, green and blue lights, the difference in the correction amount for red pixels is the largest. Also, since the transmittance of blue light having the smallest wavelength is the lowest of the transmittances of red, green and blue lights, the difference in the correction amount for blue pixels is the smallest.

That is, the correction amount of an output of each of the pixels 11b in the imaging device 10 is determined based on whether or not the pixel 11b is provided on a position corresponding to the light transmitting portion 17, and the type of color of the color filter 15 corresponding to the pixel 11b. For example, the correction amount of an output of each of the pixels 11b is determined so that the white balance and/or intensity is equal for an image displayed by an output from the light transmitting portion 17 and an image displayed by an output from some other portion than the light transmitting portion 17.

The control section corrects output data from the light receiving sections 11b in the above-described manner, and then, generates, based on the output data, an image signal including positional information, color information and intensity information in each of the light receiving sections, i.e., the pixels 11b. Thus, an image signal of an object image formed on the imaging plane of the imaging device 10 is obtained.

By performing the above-described correction to an output from the imaging device 10 to perform image processing, an image signal of an object image can be properly captured even by the imaging device 10 provided with the light transmitting portions 17.

An electrical signal output from the line sensor unit 24 is also input to a control section. This control section may be implemented by the control section of the imaging device 10, or alternatively by a different control section. The control section can obtain a distance between two object images formed on the line sensor 24a, based on the output from the line sensor unit 24, and then, can detect an in-focus state of an object image formed on the imaging device 10 from the obtained distance. For example, when an object image is transmitted through an imaging lens and is correctly formed on the imaging device 10 (in focus), the two object images formed on the line sensor 24a are located at predetermined reference positions with a predetermined reference distance therebetween. In contrast, when an object image is formed before the imaging device 10 in the direction along the optical axis (at a front pin), the distance between the two object images is smaller than the reference distance when the object image is in focus. When an object image is formed behind the imaging device 10 in the direction along the optical axis (at a rear pin), the distance between the two object images is larger than the reference distance when the object image is in focus. That is, an output from the line sensor 24a is amplified, and then, an arithmetic circuit performs an operation, so that whether or not an object image is in focus, at which the front pin or the rear pin an object image is formed, and the Df amount can be known.

Therefore, according to this embodiment, the reflection surface 21c is provided to the condenser lens unit 21, and thereby, the optical path of light which is transmitted through the imaging device 10 and then passes through the condenser lens unit 21, the mask member 22 and the separator lens unit 23 in this order to be directed to the line sensor unit 24 can be bent. Thus, the imaging unit 1 can be configured as a compact size imaging unit.

If the reflection surface 21c is not provided, the condenser lens unit 21, the mask member 22, the separator lens unit 23 and the line sensor unit 24 are arranged in this order on an extension of the optical path in a direction in which light passes through the imaging device 10, i.e., in the thickness direction of the imaging device 10. As a result, the imaging unit 1 has a large dimension in the thickness direction of the imaging device 10. In contrast, when the optical path of light transmitted through the imaging device 10 is bent, the mask member 22, the separator lens unit 23 and the line sensor unit 24 located behind the reflection surface 21c (i.e., at a further point in the traveling direction of the light) can be arranged in this order relative to the imaging device 10 not in the thickness direction of the imaging device 10 but in the direction in which the optical path is bent. That is, the condenser lens unit 21, the mask member 22, the separator lens unit 23 and the line sensor unit 24 can be arranged in the direction parallel to the imaging plane of the imaging device 10. As a result, the dimension of the imaging unit 1 in the thickness direction of the imaging device 10 can be reduced.

Also, by arranging the reflection surface 21c to be located behind the condenser lenses 21a, light transmitted through the imaging device 10 can be caused to enter the reflection surface 21c while being collected, so that dimensions of the reflection surface 21c can be reduced.

Moreover, by forming the reflection surface 21c in the condenser lens unit 21 (specifically, the condenser lenses 21a), the number of components can be reduced, and also, the dimension of the imaging unit 1 in the thickness direction of the imaging device 10 can be further reduced, as compared to a configuration in which a prism or a reflection mirror including the reflection surface 21c is additionally provided.

Furthermore, by bending the optical path at an angle of about 90 degrees by the reflection surface 21c, the mask member 22, the separator lens unit 23 and the line sensor unit 24 can be arranged substantially in the direction parallel to the imaging plane of the imaging device 10, so that the dimension of the imaging unit 1 in the thickness direction of the imaging device 10 can be further reduced.

In this embodiment, the optical path is bent at an angle of about 90 degrees by the reflection surface 21c. However, the angle at which the optical path is bent is not limited thereto, but may be any angle. That is, by bending the optical path regardless of the angle, the condenser lens unit 21, the mask member 22, the separator lens unit 23 and the line sensor unit 24 provided in the back surface side of the imaging device 10 are not arranged in the thickness direction of the imaging device 10 but can be arranged in the direction in which the optical path has been bent. Thus, the dimension of the entire imaging unit 1 in the thickness direction of the imaging device 10 can be reduced.

Each of the light transmitting portions 17 is formed in the substrate 11a so as to have a smaller thickness than that of a part of the substrate 11a located around the light transmitting portion 17. However, the present invention is not limited thereto. For example, the thickness of the entire substrate 11a may be determined so that a part of irradiation light onto the substrate 11a in a sufficient amount is transmitted through the substrate 11a to reach the phase difference detection unit 20 provided in the back surface side of the substrate 11a. In such a case, the entire substrate 11a serves as the light transmitting portion 17.

Figure 6:
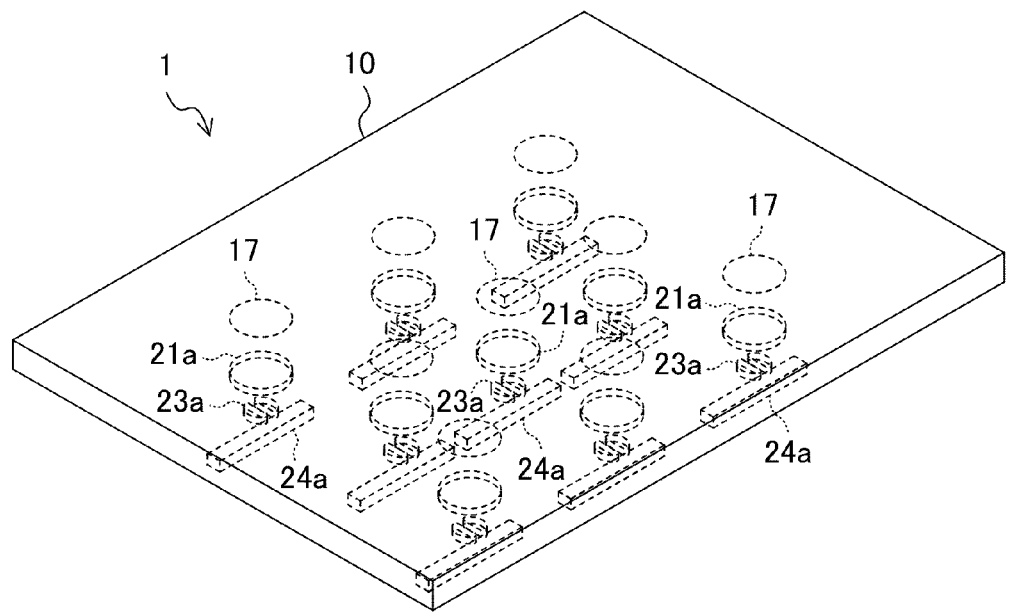
FIG. 6 is a schematic perspective view of an imaging apparatus according to a variation.

According to this embodiment, three light transmitting portions 17 are formed in the substrate 11a, and three sets of the condenser lens 21a, the separator lens 23a and the line sensor 24a are provided to correspond to the three light transmitting portions 17. However, the present invention is not limited thereto. The number of sets of those components is not limited to three, but may be any number. For example, as shown in FIG. 6, nine light transmitting portions 17 may be formed in the substrate 11a, and accordingly, nine sets of the condenser lens 21a, the separator lens 23a and the line sensor 24a may be provided.

Figure 7:
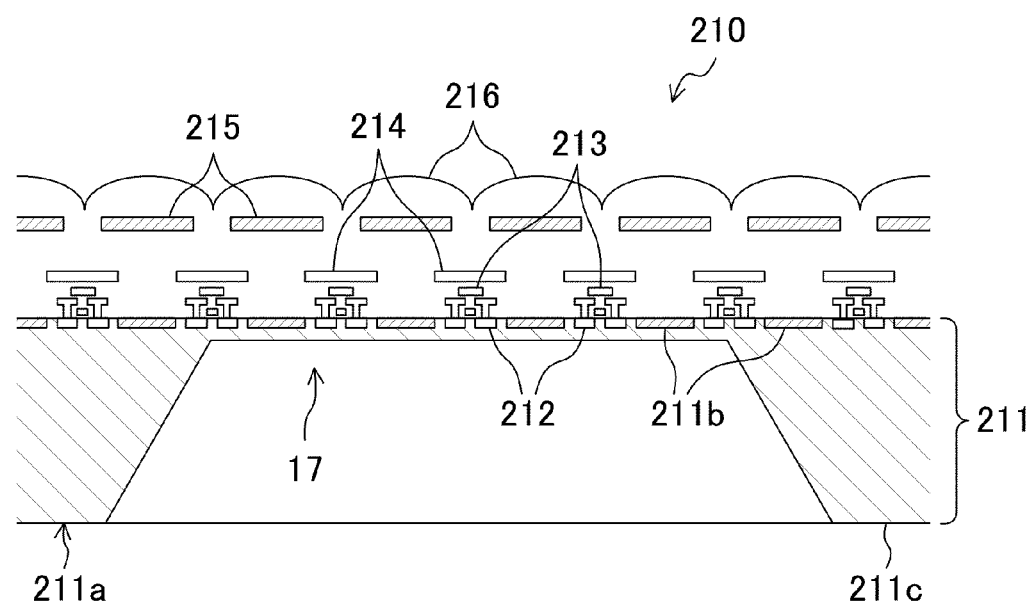
FIG. 7 is a cross-sectional view of an imaging device according to the variation.

Furthermore, the imaging device 10 is not limited to a CCD image sensor, but may be, as shown in FIG. 7, a CMOS image sensor.

An imaging device 210 is a CMOS image sensor, and includes a photoelectric conversion section 211 made of a semiconductor material, transistors 212, signal lines 213, masks 214, color filters 215, and microlenses 216.

The photoelectric conversion section 211 includes a substrate 211a, and light receiving sections 211b each being made of a photodiode. The transistor 212 is provided for each of the light receiving sections 211b. Electrical charges accumulated in the light receiving sections 211b are amplified by the transistors 212 and are output to the outside via the signal lines 213. Respective configurations of the masks 214, the color filters 215 and the microlenses 216 are the same as those of the mask 14, the color filter 15 and the microlens 16.

As in the CCD image sensor, the light transmitting portions 17 for transmitting irradiation light are formed in the substrate 211a. The light transmitting portions 17 are formed by cutting, polishing or etching an opposite surface (hereinafter also referred to as a "back surface") 211c of the substrate 211a to a surface thereof on which the light receiving sections 211b are provided to provide concave-shaped recesses, and each of the light transmitting portions 17 is formed to have a smaller thickness than that of a part of the substrate 11a located around each of the light transmitting portions 17.

In the CMOS image sensor, an amplification rate of the transistor 212 can be determined for each light receiving section 211b. Therefore, by determining the amplification rate of each transistor 212 based on whether or not each light receiving section 11b is located at a position corresponding to the light transmitting portion 17 and the type of color of the color filter 15 corresponding to the light receiving section 11b, parts of an image corresponding to the light transmitting portions 17 can be prevented from being not properly shot.

Figure 8:
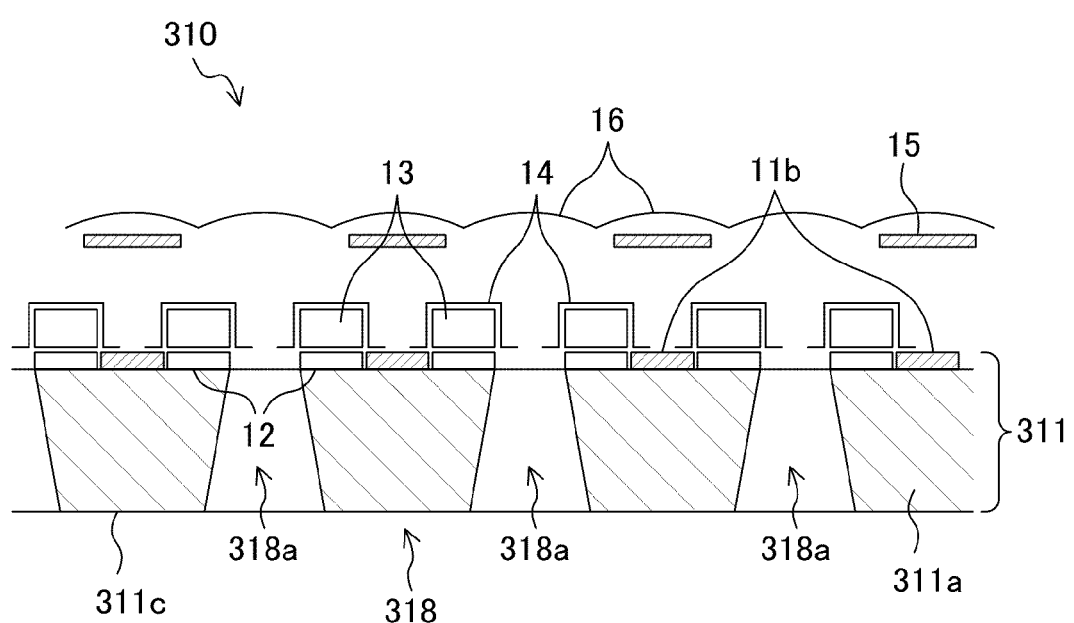
FIG. 8 is a cross-sectional view of an imaging device according to another variation.

The configuration of an imaging device through which light passes is not limited to the configuration in which the light transmitting portions 17 are provided in the manner described above. As long as light passes (or is transmitted, as described above) through the imaging device, any configuration can be employed. For example, as shown in FIG. 8, an imaging device 310 including light passing portions 318 each of which includes a plurality of through holes 318a formed in a substrate 311a may be employed.

Each of the through holes 318a is formed to pass through the substrate 311a in the thickness direction of the substrate 311a. Specifically, regarding pixel regions formed on the substrate 311a to be arranged in matrix, when it is assumed that four pixel regions located in two adjacent columns and two adjacent rows are as a single unit, the light receiving sections 11b are provided in three of the four pixel regions, and the through hole 318a is formed in the other one of the four pixels.

In the three pixel regions of the four pixel regions in which the light receiving sections 11b are provided, three color filters 15r, 15g and 15b corresponding to respective colors of the three light receiving sections 11b are provided. Specifically, a green color filter 15g is provided in the light receiving section 11b located in a diagonal position to the through hole 318a, a red color filter 15r is provided in one of the light receiving sections 11b located adjacent to the through hole 318a, and a blue color filter 15b is provided in the other one of the light receiving sections 11b located adjacent to the through hole 318a. No color filter is provided in the pixel region corresponding to the through hole 318a.

In the imaging device 10, a pixel corresponding to each through hole 318a is interpolated using outputs of the light receiving sections 11b located adjacent to the through hole 318a. Specifically, interpolation (standard interpolation) of a signal of the pixel corresponding to the through hole 318a is performed using an average value of outputs of the four light receiving sections 11b each of which is located diagonally adjacent to the through hole 318a in the pixel regions and in which the green color filters 15g are provided. Alternatively, in the four light receiving sections 11b each of which is located diagonally adjacent to the through hole 318a in the pixel regions and in which the green color filters 15g are provided, change in output of one pair of the light receiving sections 11b located adjacent to each other in one diagonal direction is compared to change in output of the other pair of the light receiving sections 11b located adjacent to each other in the other diagonal direction, and then, interpolation (slope interpolation) of a signal of a pixel corresponding to the through hole 318a is performed using an average value of outputs of the pair of the light receiving sections 11b, located diagonally adjacent, whose change in output is larger, or an average value of outputs of the pair of the light receiving sections 11b, located diagonally adjacent, whose change in output is smaller. Assume that a pixel desired to be interpolated is an edge of a focus object. If interpolation is performed using the pair of the light receiving sections 11b whose change in output is larger, the edge is undesirably caused to be loose. Therefore, the smaller change is used when each of the changes are equal to or larger than a predetermined threshold, and the larger change is used when each of the changes is smaller than the predetermine threshold so that as small change rate (slope) as possible is employed.

Then, after performing the interpolation of output data of the light receiving sections 11b corresponding to the through holes 318a, intensity information and color information for the pixel corresponding to each of the light receiving sections 11b are obtained using output data of each of the light receiving sections 11b, and furthermore, predetermined image processing or image synthesis is performed to generate an image signal.

Thus, it is possible to prevent parts of an image at the light passing portions 318 from becoming dark.

The imaging device 310 configured in the above-described manner can cause incident light to pass therethrough via the plurality of the through holes 318a.

The condenser lenses 21a and the like are arranged in the back surface side of the light passing portions 318 each of which includes the plurality of through holes 318a, and thus, phase difference detection can be performed using light transmitted through the imaging device 310 via the through holes 318a. In this case, the condenser lens unit 21, the mask member 22, the separator lens unit 23 and the line sensor unit 24 are arranged along the optical path which has been bent, in the manner described above, so that the dimension of the entire imaging unit in the thickness direction of the imaging device 310 can be reduced. That is, the above-described configuration of the phase difference detection unit can be employed regardless of the configuration of the imaging device. Moreover, the imaging device 310 is configured so that light from the plurality of through holes 318a enters a set of the condenser lens 21a, the separator lens 23a and the line sensor 24a, and thus, advantageously, the size of one set of the condenser lens 21a, the separator lens 23a and the line sensor 24a is not restricted by the size of pixels. That is, advantageously, the size of one set of the condenser lens 21a, the separator lens 23a and the line sensor 24a does not cause any problem in increasing the resolution of the imaging device 310 by reducing the size of pixels.

Second Embodiment

Next, an imaging unit 201 as an imaging apparatus according to a second embodiment of the present invention will be described. In the imaging unit 201, the configuration of a phase difference detection unit is different from that of the imaging unit 1 of the first embodiment. Therefore, each member also shown in the first embodiment is identified by the same reference character, the description thereof will be omitted, and the configuration of each of different parts will be mainly described.

Figure 9:
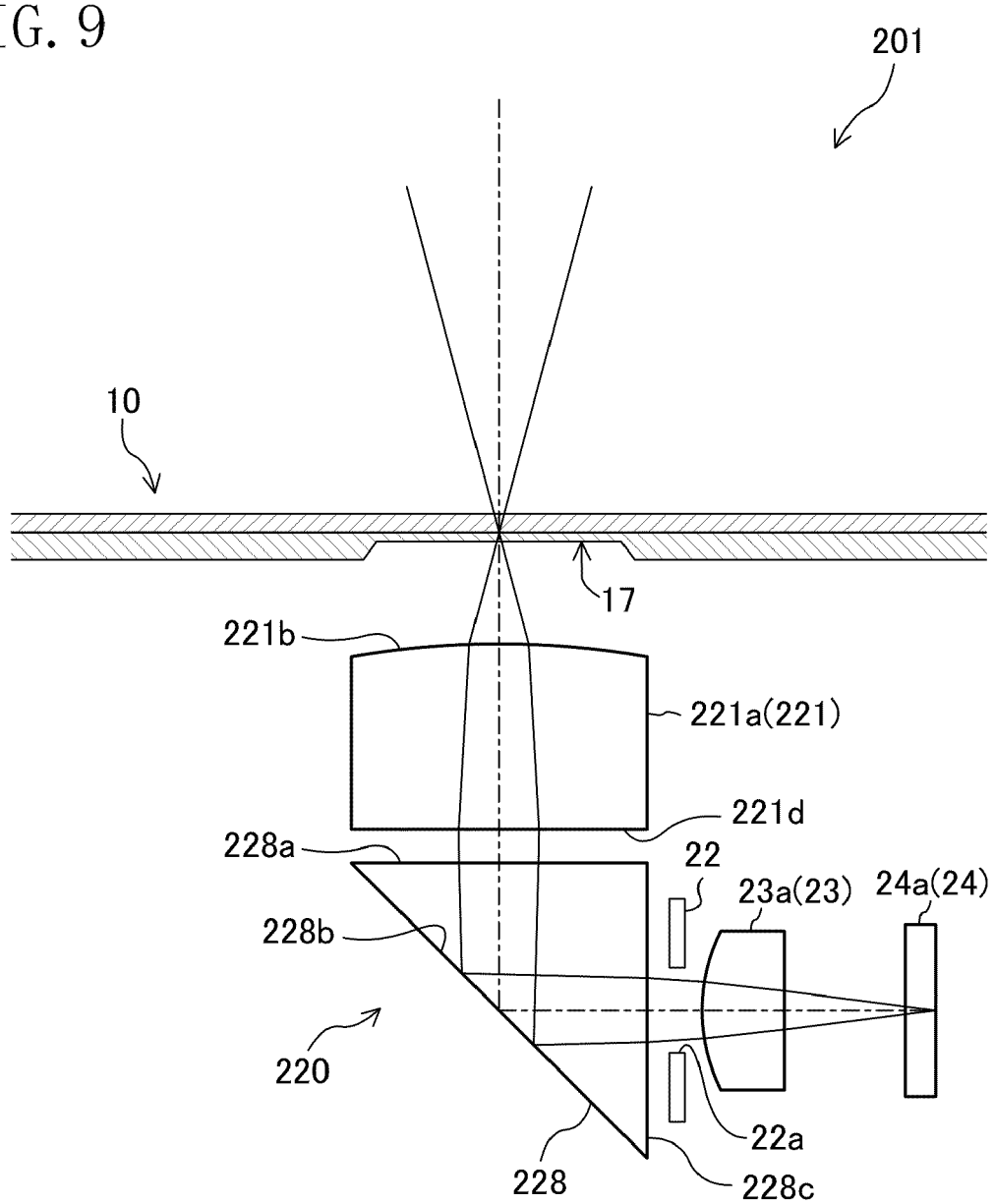
FIG. 9 is a perspective view illustrating a phase difference detection unit of an imaging unit according to a second embodiment of the present invention.

Specifically, as shown in FIG. 9, the imaging unit 201 is configured so that a prism 228 is provided between a condenser lens 221a and a separator lens 23a in a phase difference detection unit 220. Note that a package 31 and a module frame 25 are not shown in the drawings (also not shown in the following embodiments).

The prism 228 is formed to have an isosceles right triangular cross section, and includes an incident surface 228a forming one of two sides of the isosceles right triangular cross section having the same length, a reflection surface 228b forming a hypotenuse of the isosceles right triangular cross section, and an output surface 228c forming the other one of the two sides of the isosceles right triangular cross section. The prism 228 is arranged between a condenser lens unit 221 and the mask member 22 so that the incident surface 228a faces the condenser lens unit 221 and the output surface 228c faces the mask member 22. The prism 228 serves as a bending section.

The condenser lens unit 221 is configured so that a plurality of condenser lenses 221a (only one of the condenser lens 221a is shown in FIG. 9) are integrated into a single unit and, as opposed to the condenser lens unit 21 of the first embodiment, does not include the reflection surface 21c. That is, although light which has entered each of the condenser lenses 221a from an incident surface 221b is collected, the optical path of the light is not bent and the light is output from an output surface 221d.

The configuration and arrangement of the mask member 22, the separator lens unit 23 and the line sensor unit 24 are the same as those in the first embodiment.

The condenser lens unit 221 and the prism 228 are arranged in this order adjacent to the light transmitting portion 17 of the imaging device 10 in the thickness direction of the imaging device 10. The mask member 22, the separator lens unit 23 and the line sensor unit 24 are arranged in this order adjacent to the prism 228 in the direction parallel to the imaging plane of the imaging device 10.

In the phase difference detection unit 220 configured in the above-described manner, light transmitted through the imaging device 10 enters the condenser lens 221a through the incident surface 221b. The light which has entered the condenser lens 221a is collected, and is output from the condenser lens 221a via the output surface 221d. The light transmitted through the condenser lens 221a enters the prism 228 through the incident surface 228a, is reflected by the reflection surface 228b at an angle of about 90 degrees, and is output from the output surface 228c. That is, the optical path of the light transmitting through the prism 228 is bent substantially at a right angle. The light transmitted through the prism 228 is divided into two light beams when passing through each pair of mask openings 22a formed in the mask member 22, and enters each of the separator lens 23a. Thus, light subjected to pupil division is transmitted through the separator lens 23a, and identical object images are formed at two positions on the line sensor 24a.

Therefore, according to this embodiment, the prism 228 is provided between the condenser lens unit 221 and the separator lens unit 23 (specifically, mask member 22), and thereby, the optical path of light which is transmitted through the imaging device 10 and then passes through the condenser lens unit 221, the mask member 22 and the separator lens unit 23 in this order to be directed to the line sensor unit 24 can be bent. Thus, the imaging unit 201 can be configured as a compact size imaging unit. Specifically, by bending the optical path of light transmitted through the imaging device 10, the mask member 22, the separator lens unit 23 and the line sensor unit 24 located behind the prism 228 can be arranged in this order, relative to the imaging device 10, not in the thickness direction of the imaging device 10 but in the direction in which the optical path has been bent. That is, the mask member 22, the separator lens unit 23 and the line sensor unit 24 can be arranged in the direction parallel to the imaging plane of the imaging device 10. As a result, the dimension of the imaging unit 201 in the thickness direction of the imaging device 10 can be reduced.

Also, by arranging the prism 228 to be located behind the condenser lens unit 221, light transmitted through the imaging device 10 can be caused to enter the prism 228 after being collected, so that dimensions of the prism 228 can be reduced.

Furthermore, by bending the optical path at an angle of about 90 degrees by the prism 228, the mask member 22, the separator lens unit 23 and the line sensor unit 24 can be arranged substantially in the direction parallel to the imaging plane of the imaging device 10, so that the dimension of the imaging unit 201 in the thickness direction of the imaging device 10 can be further reduced.

Third Embodiment

Subsequently, an imaging unit 301 as an imaging apparatus according to a third embodiment of the present invention will be described. The imaging unit 301 is different from the imaging unit 201 of the second embodiment in that the imaging unit 301 includes a reflector 329, instead of the prism 228. Therefore, each member also shown in the first and second embodiments is identified by the same reference character, the description thereof will be omitted, and the configuration of each of different parts will be mainly described.

Figure 10:
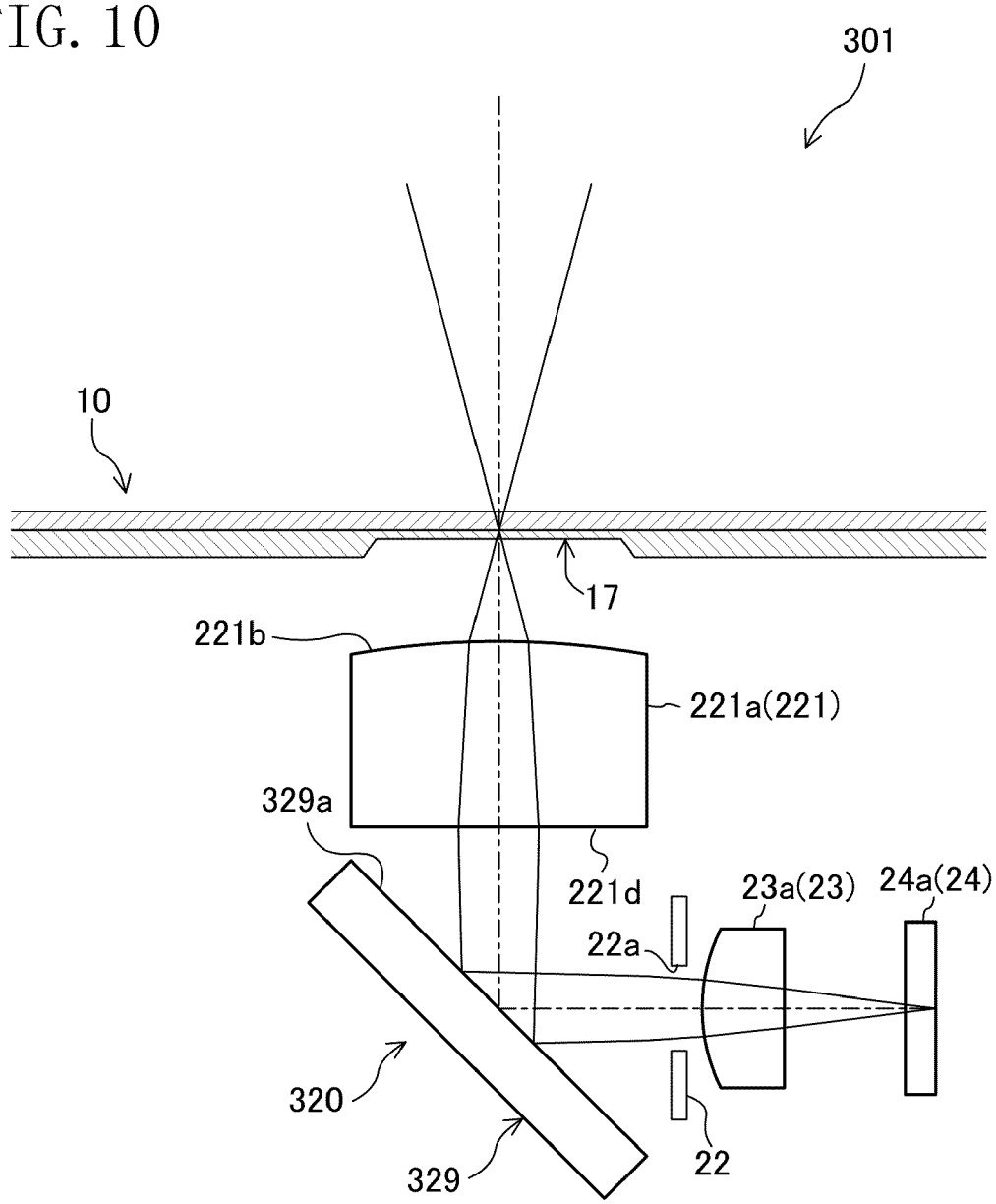
FIG. 10 is a perspective view illustrating a phase difference detection unit of an imaging unit according to a third embodiment of the present invention.

Specifically, as shown in FIG. 10, the imaging unit 301 is configured so that the reflector 329 is provided between the condenser lens 221a and the separator lens 23a (specifically, the mask member 22) in a phase difference detection unit 320.

The reflector 329 includes a reflection surface 329a for reflecting light, and reflects light transmitted through the condenser lens 221a at an angle of about 90 degrees with the reflection surface 329a to direct the light to the separator lens 23a. The reflector 329 serves as a bending section.

The condenser lens unit 221 and the reflector 329 are arranged in this order adjacent to the light transmitting portion 17 of the imaging device 10 in the thickness direction of the imaging device 10. The mask member 22, the separator lens unit 23 and the line sensor unit 24 are arranged in this order adjacent to the reflector 329 in the direction parallel to the imaging plane of the imaging device 10.

In the phase difference detection unit 320 configured in the above-described manner, light transmitted through the imaging device 10 enters the condenser lens 221a through the incident surface 221b. The light which has entered the condenser lens 221a is collected and is output from the condenser lens 221a via the output surface 221d. The light transmitted through the condenser lens 221a enters the reflector 329, and is reflected at an angle of about 90 degrees by the reflection surface 329a. That is, the optical path of the light which has entered the reflector 329 is bent substantially at a right angle. The light reflected by the reflector 329 is divided into two light beams when passing through each pair of mask openings 22a formed in the mask member 22, and enters each of the separator lens 23a. Thus, light subjected to pupil division is transmitted through the separator lens 23a, and identical object images are formed at two positions on the line sensor 24a.

Therefore, according to this embodiment, the reflector 329 is provided between the condenser lens unit 221 and the separator lens unit 23 (specifically, mask member 22), and thereby, the optical path of light which is transmitted through the imaging device 10 and then passes through the condenser lens unit 221, the mask member 22 and the separator lens unit 23 in this order to be directed to the line sensor unit 24 can be bent. Thus, similarly to the second embodiment, the imaging unit 301 can be configured as a compact size imaging unit.

Fourth Embodiment

Subsequently, an imaging unit 401 as an imaging apparatus according to a fourth embodiment of the present invention will be described. The imaging unit 401 is different from the imaging unit 301 of the third embodiment in that the condenser lens 221a and the reflector 329 are arranged in a different manner. Therefore, each member also shown in the first, second and third embodiments is identified by the same reference character, the description thereof will be omitted, and the configuration of each of different parts will be mainly described.

Figure 11:
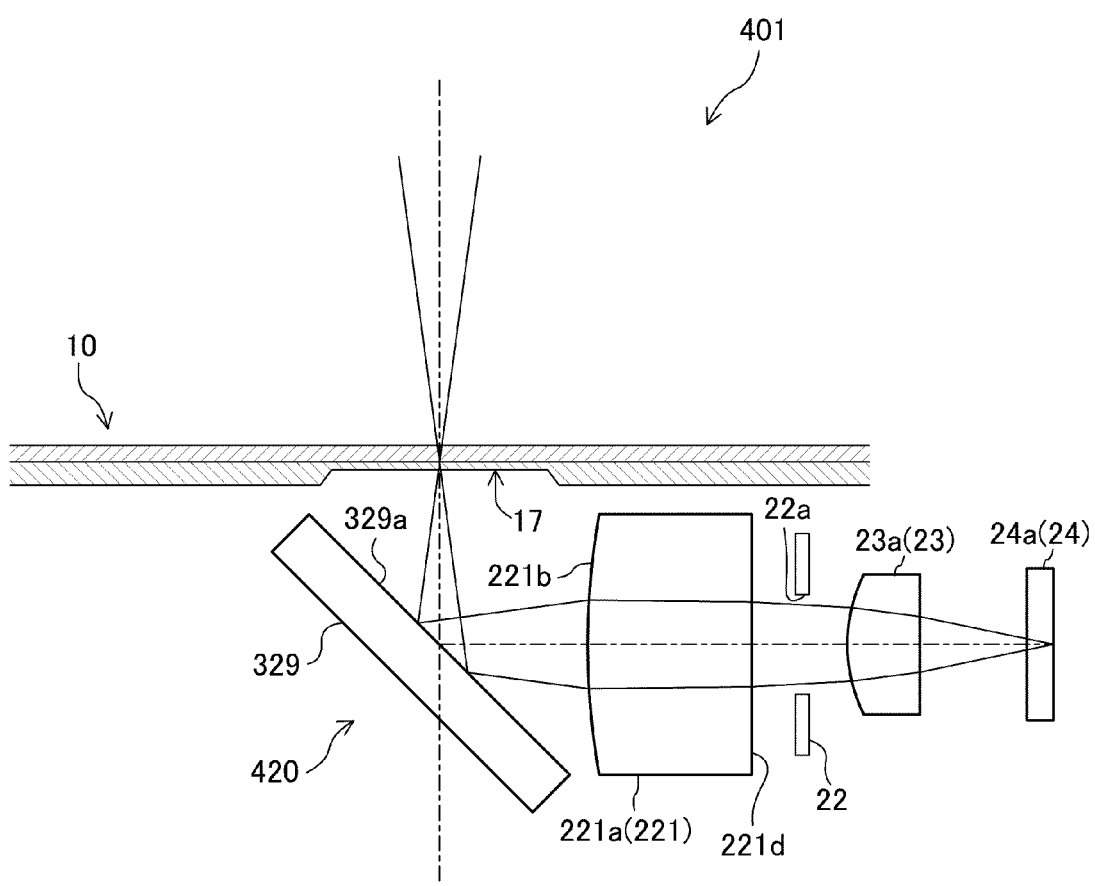
FIG. 11 is a perspective view illustrating a phase difference detection unit of an imaging unit according to a fourth embodiment of the present invention.

Specifically, as shown in FIG. 11, the imaging unit 401 is configured so that the reflector 329 is provided to be located closer to the imaging device 10 than the condenser lens 221a in a phase difference detection unit 420.

That is, in the back surface side of the imaging device 10, the reflector 329 is arranged adjacent to the light transmitting portion 17 of the imaging device 10 in the thickness direction of the imaging device 10. The condenser lens unit 221, the mask member 22, the separator lens unit 23 and the line sensor unit 24 are arranged in this order adjacent to the reflector 329 in the direction parallel to the imaging plane of the imaging device 10.

In this case, the condenser lens 221a is arranged so that the incident surface 221b thereof faces the reflector 329, i.e., an optical axis of the lens extends in parallel to the imaging plane of the imaging device 10.

In the phase difference detection unit 420 configured in the above-described manner, light transmitted through the imaging device 10 enters the reflector 329, and is reflected by the reflection surface 329a at an angle of about 90 degrees. That is, the optical path of the light which has entered the reflector 329 is bent substantially at a right angle. The light reflected by the reflector 329 enters the condenser lens 221a through the incident surface 221b. The light which has entered the condenser lens 221a is output from the condenser lens 221a via the output surface 221d while being collected. The light transmitted through the condenser lens 221a is divided into two light beams when passing through each pair of mask openings 22a formed in the mask member 22, and enters each of the separator lenses 23a. Light subjected to pupil division is transmitted through the separator lens 23a, and identical object images are formed at two positions on the line sensor 24a.

In the above-described configuration, each of the reflector 329, the condenser lens unit 221, the mask member 22, the separator lens unit 23 and the line sensor unit 24 is attached to a module frame so that their respective positions are determined relative to the module frame (not shown) of the phase difference detection unit 420. The imaging device 10 and the phase difference detection unit 420 are joined together so that their respective positions are determined not by the condenser lenses 21a and the openings 31c of the package 31 provided to fit together in the manner of the first embodiment, but by another position determination mechanism.

Therefore, according to this embodiment, the reflector 329 is provided to be located closer to the imaging device 10 than the condenser lens unit 221, and thereby, light transmitted through the imaging device 10 can be bent before entering the condenser lens unit 221. Thus, the condenser lens unit 221, the mask member 22, the separator lens unit 23 and the line sensor unit 24 can be all arranged in the direction parallel to the imaging plane of the imaging device 10. Thus, the imaging unit 401 can be configured as a compact size imaging unit.

Fifth Embodiment

Subsequently, an imaging unit 501 as an imaging apparatus according to a fifth embodiment of the present invention will be described. The imaging unit 501 is different from the imaging unit 1 of the first embodiment in that the configuration of a phase difference detection unit is different from that of the imaging unit 1. Therefore, each member also shown in the first embodiments is identified by the same reference character, the description thereof will be omitted, and the configuration of each of different parts will be mainly described.

Figure 12:
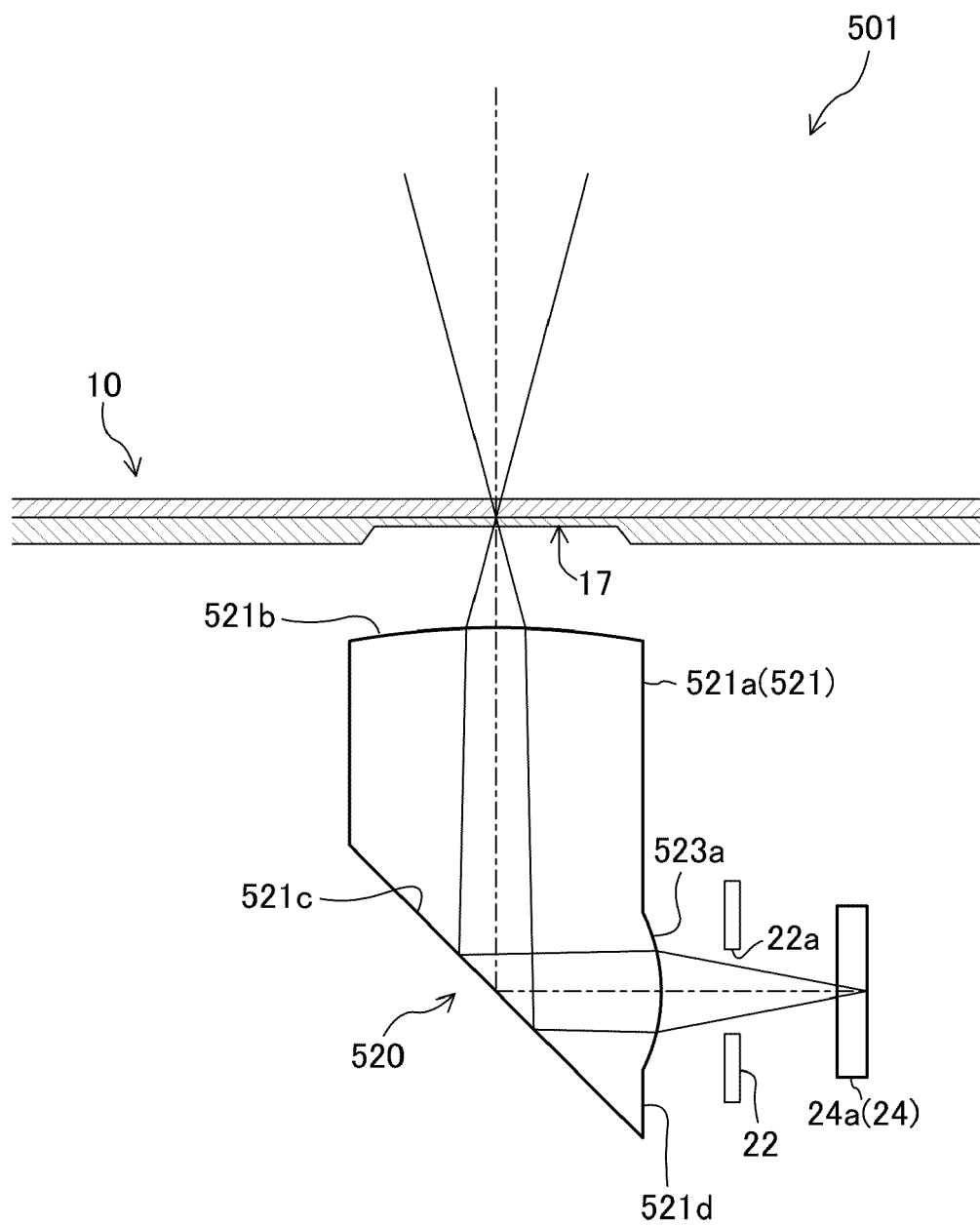
FIG. 12 is a perspective view illustrating a phase difference detection unit of an imaging unit according to a fifth embodiment of the present invention.

Specifically, as shown in FIG. 12, in a phase difference detection unit 520 of the imaging unit 501, a condenser lens unit 521 includes a reflection surface 521c, and a separator lens 523a is formed in an output surface 521d.

Specifically, similarly to the first embodiment, the condenser lens unit 521 includes an incident surface 521b, the reflection surface 521c, and the output surface 521d, and is configured so that incident light through the incident surface 521b of a condenser lens 521a is reflected at an angle of about 90 degrees by the reflection surface 521c and is output from the output surface 521d. In this case, the separator lens 523a is formed in the output surface 521d. Each separator lens 523a includes two convex lens surfaces bulging from the output surface 521d. The condenser lens unit 521, specifically, the condenser lenses 521a serve as a bending section.

The mask member 22 is arranged to face the separator lens 523a, and the line sensor unit 24 is arranged relative to the mask member 22 to be located at a position at an opposite side to the side at which the separator lens 523a is provided.

That is, in the back surface side of the imaging device 10, the condenser lens unit 521 is arranged adjacent to the light transmitting portions 17 of the imaging device 10 in the thickness direction of the imaging device 10. The mask member 22 and the line sensor unit 24 are arranged in this order adjacent to the condenser lens unit 521 in the direction parallel to the imaging plane of the imaging device 10.

In the phase difference detection unit 520 configured in the above-described manner, light transmitted through the imaging device 10 enters the condenser lens unit 521 through the incident surface 521b of the condenser lens 521a. The light which has entered the condenser lens 521a is reflected at an angle of about 90 degrees by the reflection surface 521c while being collected. When being output from the output surface 521d, the light reflected by the reflection surface 521c is divided into two light beams by the separator lens 523a and is further collected. The two light beams obtained through pupil division by the separator lens 523a transmit through the mask openings 22a of the mask member 22, and identical object images are formed at two positions on the line sensor 24a.

Therefore, according to this embodiment, similarly to the first embodiment, the reflection surface 521c is provided to the condenser lens unit 521, and thereby, the optical path of light which is transmitted through the imaging device 10 and then passes through the condenser lens unit 521 and the mask member 22 in this order to be directed to the line sensor unit 24 can be bent. Thus, the dimension of the imaging unit 501 in the thickness direction of the imaging device 10 can be reduced.

Also, the condenser lenses 521*a* and the separator lens 523*a* are integrated as a single unit, and the reflection surface 521*c* is formed in the condenser lens unit 521 (i.e., as the condenser lens 521*a*), so that the imaging unit 501 can be configured as a more compact size imaging unit.

Sixth Embodiment

Subsequently, an imaging unit 601 as an imaging apparatus according to a sixth embodiment of the present invention will be described. The imaging unit 601 is different from the imaging unit 1 of the first embodiment in that the configuration of a phase difference detection unit is different from that of the imaging unit 1. Therefore, each member also shown in the first embodiments is identified by the same reference character, the description thereof will be omitted, and the configuration of each of different parts will be mainly described.

Figure 13:
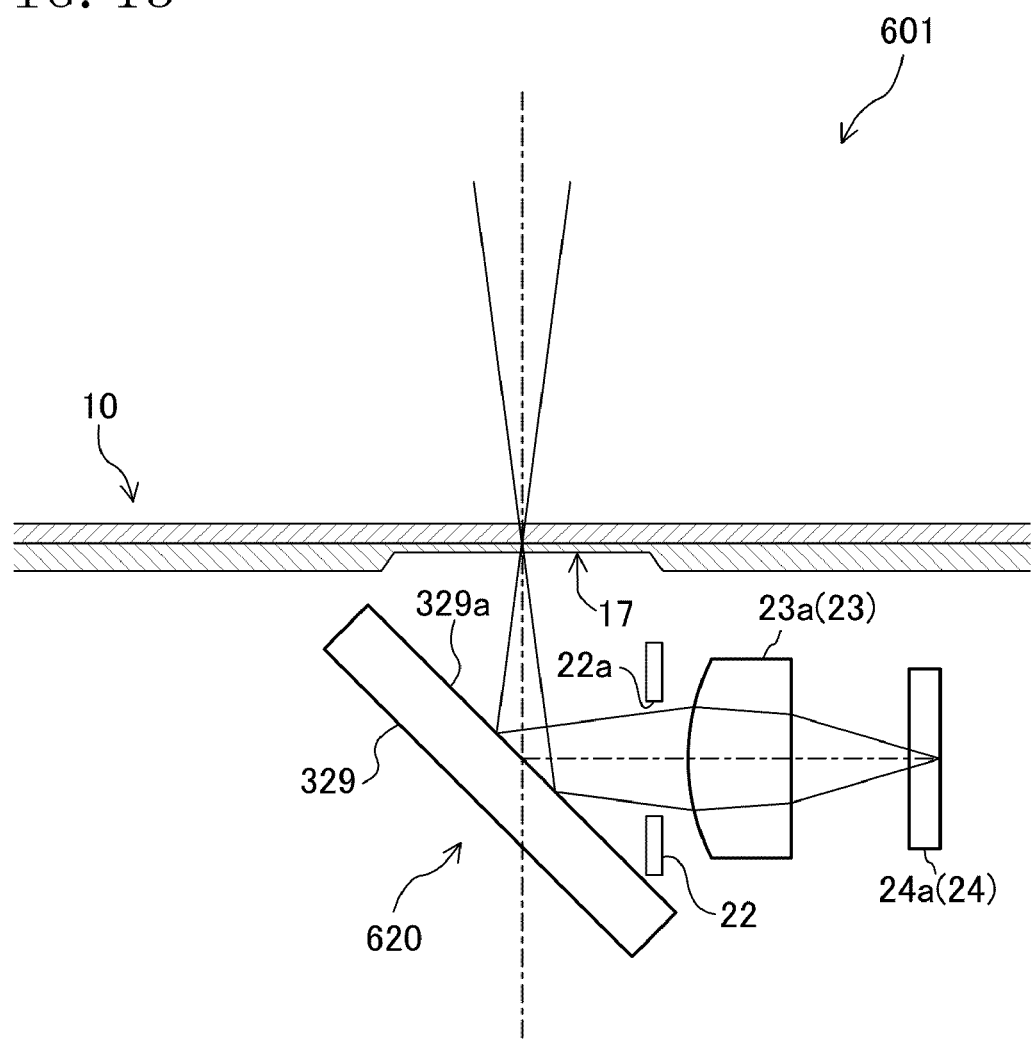
FIG. 13 is a perspective view illustrating a phase difference detection unit of an imaging unit according to a sixth embodiment of the present invention.

Specifically, as shown in FIG. 13, a phase difference detection unit 620 of the imaging unit 601 includes the reflector 329, the mask member 22, the separator lens unit 23 and the line sensor unit 24, but does not include a condenser lens unit.

The reflector 329, the mask member 22, the separator lens unit 23 and the line sensor unit 24 are arranged in this order from the imaging device 10 side. Specifically, in the back surface side of the imaging device 10, the reflector 329 is arranged adjacent to the light transmitting portions 17 of the imaging device 10 in the thickness direction of the imaging device 10. The mask member 22, the separator lens unit 23 and the line sensor unit 24 are arranged adjacent to the reflector 329 in the direction parallel to the imaging plane of the imaging device 10.

In the phase difference detection unit 620 configured in the above-described manner, light transmitted through the imaging device 10 enters the reflector 329, and is reflected at an angle of about 90 degrees by the reflection surface 329*a*, and the optical path of the light is bent to extend in parallel to the imaging plane of the imaging device 10. The light reflected by the reflector 329 is divided into two light beams when passing through each pair of mask openings 22*a* formed in the mask member 22, and enters each of the separator lens 23*a*. The light subjected to pupil division is transmitted through the separator lens 23*a*, and identical object images are formed at two positions on the line sensor 24*a*.

In the above-described configuration, each of the reflector 329, the mask member 22, the separator lens unit 23 and the line sensor unit 24 is attached so that their respective positions are determined relative to a module frame (not shown) of the phase difference detection unit 620. The imaging device 10 and the phase difference detection unit 620 are joined together so that their respective positions are determined not by the condenser lenses 21*a* and the openings 31*c* of the package 31 provided to fit together in the manner of the first embodiment, but by another position determination mechanism.

Therefore, according to this embodiment, the reflector 329 is provided to be located closer to the imaging device 10 than the separator lens unit 23 (specifically, the mask member 22), and thereby, light transmitted through the imaging device 10 can be bent before entering the separator lens unit 23. Thus, the mask member 22, the separator lens unit 23 and the line sensor unit 24 can be all arranged in the direction parallel to the imaging plane of the imaging device 10. Thus, the imaging unit 601 can be configured as a compact size imaging unit.

Note that the prism 228 of the second embodiment may be provided, instead of the reflector 329.

Seventh Embodiment

Subsequently, an imaging unit 701 as an imaging apparatus according to a seventh embodiment of the present invention will be described. The imaging unit 701 is different from the imaging unit 1 of the first embodiment in that the configuration of a phase difference detection unit is different from that of the imaging unit 1. Therefore, each member also shown in the first embodiments is identified by the same reference character, the description thereof will be omitted, and the configuration of each of different parts will be mainly described.

Figure 14:
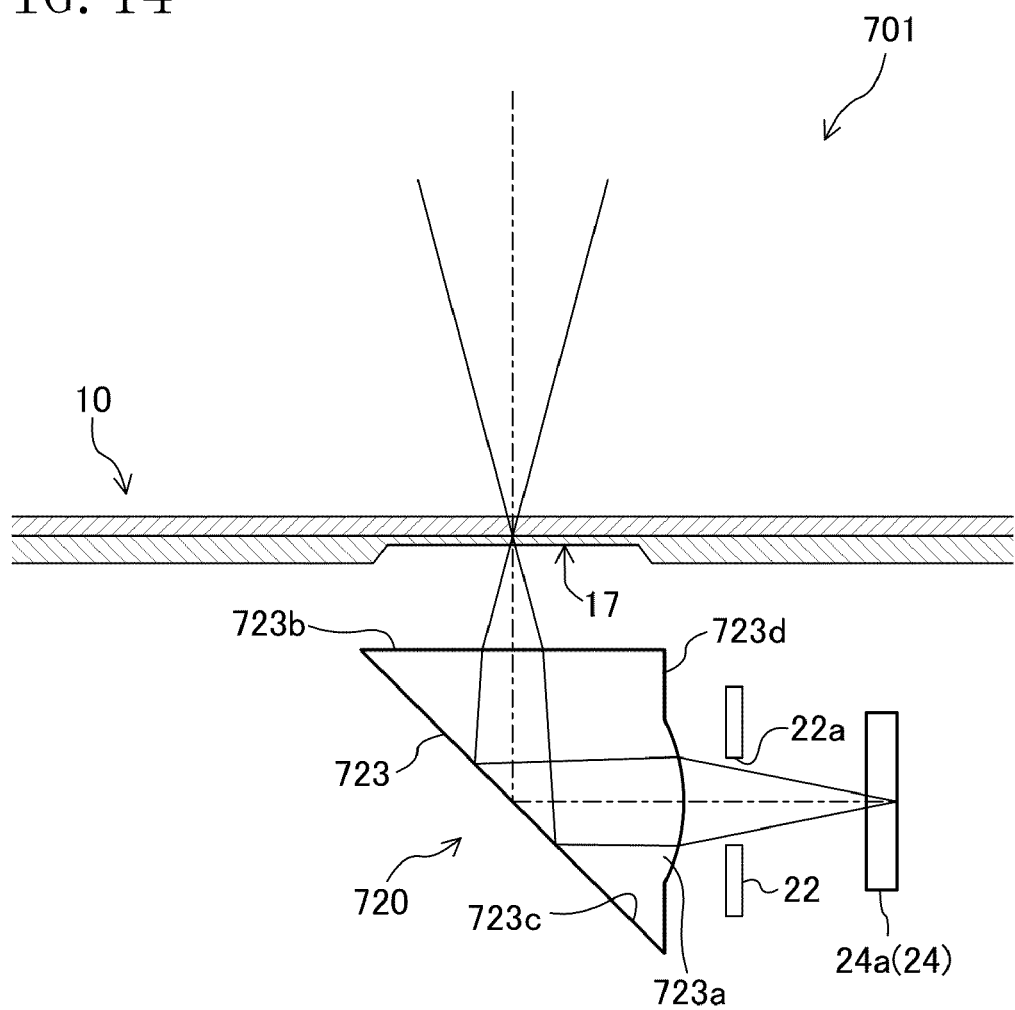
FIG. 14 is a perspective view illustrating a phase difference detection unit of an imaging unit according to a seventh embodiment of the present invention.

Specifically, as shown in FIG. 14, a phase difference detection unit 720 of the imaging unit 701 includes a separator lens unit 723, the mask member 22 and the line sensor unit 24, but does not include a condenser lens unit.

The separator lens unit 723 is formed as a prism, and includes an incident surface 723*b*, a reflection surface 723*c* and an output surface 723*d*. A plurality of separator lenses 723*a* are formed in the output surface 723*d*. Each of the separator lenses 723*a* includes two convex lens surfaces bulging from the output surface 723*d*. The separator lens unit 723, specifically, the separator lenses 723*a* serve as a bending section.

The separator lens unit 723, the mask member 22 and the line sensor unit 24 are arranged in this order from the imaging device 10 side. Specifically, in the back surface side of the imaging device 10, the separator lens unit 723 is arranged adjacent to the light transmitting portions 17 of the imaging device 10 in the thickness direction of the imaging device 10. The mask member 22 and the line sensor unit 24 are arranged in this order adjacent to the separator lens unit 23 in the direction parallel to the imaging plane of the imaging device 10.

In the phase difference detection unit 720 configured in the above-described manner, light transmitted through the imaging device 10 enters the separator lens unit 723 through the incident surface 723*b* of the separator lens unit 723. The light which has entered the separator lens unit 723 is reflected at an angle of about 90 degrees by the reflection surface 723*c*. When being output from the output surface 723*d*, the light reflected by the reflection surface 723*c* is divided into two light beams by the separator lenses 723*a*, and is further collected. The two light beams obtained through pupil division by the separator lenses 723*a* pass through the mask openings 22*a* of the mask member 22, and identical object images are formed at two positions on the line sensor 24*a*.

Therefore, according to this embodiment, similarly to the first embodiment, the reflection surface 723*c* is provided to the condenser lens unit 723, and thereby, the optical path of light transmitted through the imaging device 10 can be bent. Thus, the separator lens unit 723, the mask member 22 and the line sensor unit 24 can be arranged in the direction parallel to the imaging plane of the imaging device 10, and the dimension of the imaging unit 701 in the thickness direction of the imaging device 10 can be reduced.

Furthermore, the reflection surface 723*c* is formed in the separator lens unit 723 (i.e., the separator lens 723*a*), as compared to a configuration in which a prism or a reflector having a reflection surface is additionally provided, the dimension of the imaging unit 701 in the thickness direction of the imaging device 10 can be further reduced.

Eighth Embodiment

Next, a camera as an imaging apparatus according to an eighth embodiment of the present invention will be described.

Figure 15:
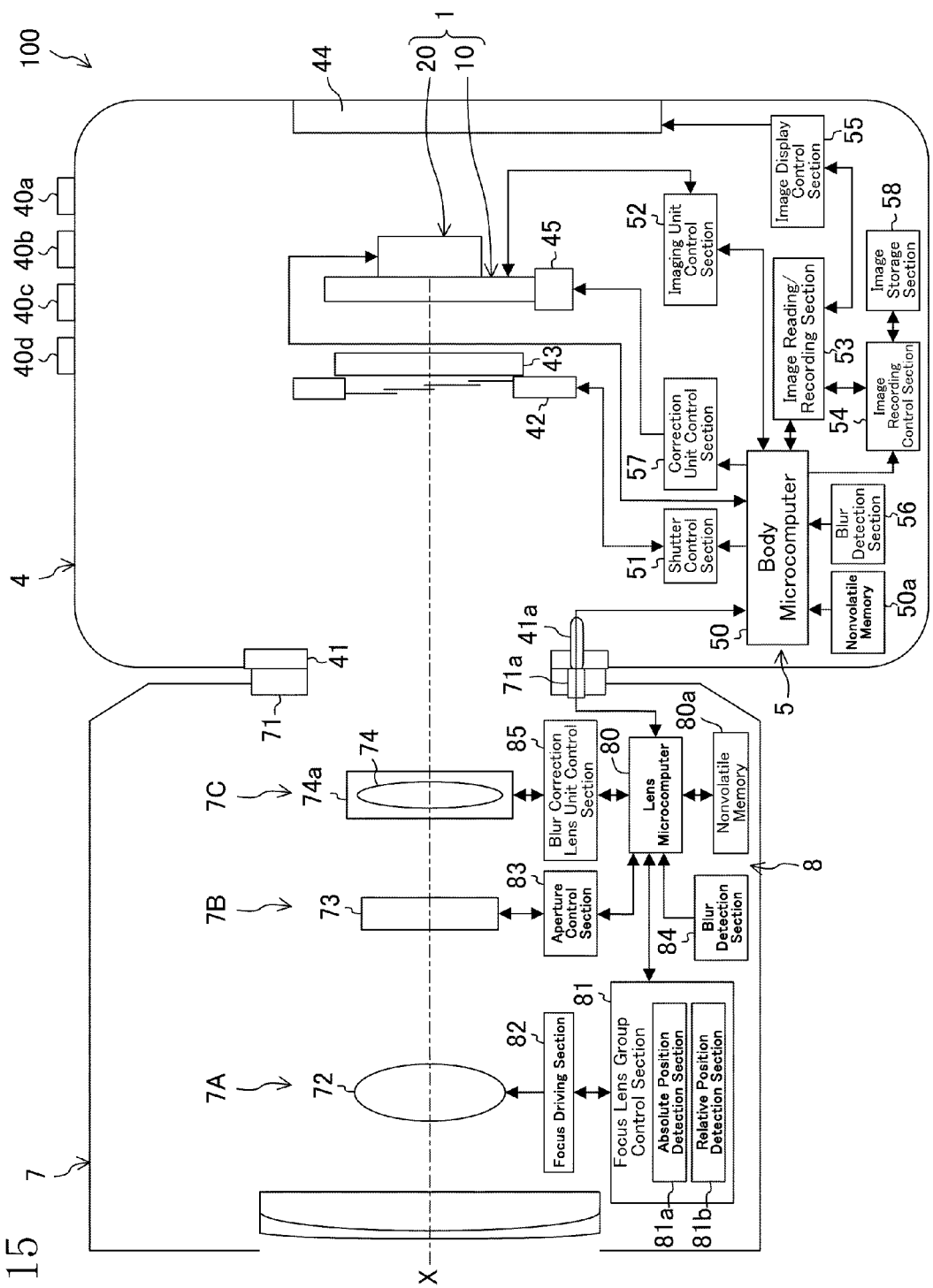
FIG. 15 is a block diagram of a camera according to an eighth embodiment of the present invention.

As shown in FIG. 15, a camera 100 according to the eighth embodiment is a single-lens reflex digital camera with interchangeable lenses and includes, as major components, a camera body 4 having a major function as a camera system, and interchangeable lenses 7 removably attached to the camera body 4. The interchangeable lenses 7 are attached to a body mount 41 provided on a front face of the camera body 4. The body mount 41 is provided with an electric contact piece 41a.

-Configuration of Camera Body-

The camera body 4 includes the imaging unit 1 of the first embodiment for capturing an object image as a shooting image, a shutter unit 42 for adjusting an exposure state of the imaging unit 1, an optical low pass filter (OLPF) 43, serving also as an IR cutter, for removing infrared light of the object image entering the imaging unit 1 and reducing the moire phenomenon, an image display section 44, comprised of a liquid crystal monitor, for displaying a shooting image, a live view image and various pieces of information, and a body control section 5.

In the camera body 4, a power switch 40a for turning on/off the camera system, a release button 40b operated by a user when the user performs focusing and releasing operations, and setting switches 40c and 40d for turning on/off various shooting modes and functions.

When the camera system is turned on by the power switch 40a, power is supplied to each part of the camera body 4 and the interchangeable lens 7.

The release button 40b operates as a two-stage switch. Specifically, autofocusing, AE (Automatic Exposure) or the like, which will be described later, is performed by pressing the release button 40b halfway down, and releasing is performed by pressing the release button 40b all the way down.

An AF setting switch 40c is a switch for switching an autofocus function from one to another of three autofocus functions, which will be described later. The camera body 4 is configured so that the autofocus function is set to be one of the three autofocus functions by switching the AF setting switch 40c.

A continuous shooting mode setting switch 40d is a switch for setting/canceling a continuous shooting mode, which will be described later. The camera body 4 is configured so that a shooting mode can be switched between a normal shooting mode and a continuous shooting mode by operating the continuous shooting mode setting switch 40d.

Clearly, the setting switches 40c and 40d may be selection items in a menu for selecting various camera shooting functions.

The imaging unit 1 is arranged so that the imaging plane thereof in the camera body 4 is perpendicular to the optical axis X. In this case, the thickness direction of the imaging device 10 of the imaging unit 1 corresponds to the optical axis X. That is, to reduce the dimension of the imaging unit 1 in the thickness direction of the imaging device 10 means to reduce the dimension of the imaging unit 1 in the direction along the optical axis X.

The imaging unit 1 is configured to be movable in a plane perpendicular to an optical axis X by a blur correction unit 45.

The body control section 5 includes a body microcomputer 50, a nonvolatile memory 50a, a shutter control section 51 for controlling driving of the shutter unit 42, an imaging unit control section 52 for controlling the operation of the imaging unit 1 and performing A/D conversion of an electrical signal from the imaging unit 1 to output the converted signal to the body microcomputer 50, an image reading/recording section 53 for reading image data from, for example, a card type recording medium or an image storage section 58 which is an internal memory and recording image data in the image storage section 58, an image recording control section 54 for controlling the image reading/recording section 53, an image display control section 55 for controlling display of the image display section 44, a blur detection section 56 for detecting an amount of an image blur generated due to shake of the camera body 4, and a correction unit control section 57 for controlling the blur correction unit 45.

The body microcomputer 50 is a control device for controlling core functions of the camera body 4, and performs control of various sequences. The body microcomputer 50 includes, for example, a CPU, a ROM and a RAM. Programs stored in the ROM are read by the CPU, and thereby, the body microcomputer 50 can execute various functions.

The body microcomputer 50 is configured to receive input signals from the power switch 40a, the release button 40b and each of the setting switches 40c and 40d and output control signals to the shutter control section 51, the imaging unit control section 52, the image reading/recording section 53, the image recording control section 54, the correction unit control section 57 and the like, thereby causing the shutter control section 51, the imaging unit control section 52, the image reading/recording section 53, the image recording control section 54, the correction unit control section 57 and the like to execute respective control operations. The body microcomputer 50 performs inter-microcomputer communication with a lens microcomputer 80, which will be described later.

For example, according to an instruction of the body microcomputer 50, the imaging unit control section 52 performs A/D conversion of an electrical signal from the imaging unit 1 to output the converted signal to the body microcomputer 50. The body microcomputer 50 performs predetermined image processing to the received electrical signal to generate an image signal. Then, the body microcomputer 50 transmits the image signal to the image reading/recording section 53, and also instructs the image recording control section 54 to record and display an image, and thereby, the image signal is stored in the image storage section 58 and is transmitted to the image display control section 55. The image display control section 55 controls the image display section 44 based on the transmitted image signal to cause the image display section 44 to display an image.

As predetermined image processing, the body microcomputer 50 performs correction of an output from the light receiving sections 11b depending on whether or not the light receiving sections 11b are arranged at positions corresponding to the light transmitting portions 17, correction to eliminate or reduce influences of the light transmitting portions 17, and the like in the above-described manner.

In the nonvolatile memory 50a, various pieces of information (unit information) for the camera body 4 are stored. The unit information includes, for example, model information (unit specific information) provided to specify the camera body 4, such as name of a manufacturer, production date and model number of the camera body 4, version information for software installed in the body microcomputer 50 and firmware update information, information regarding whether or not the camera body 4 includes sections for correcting an image blur, such as the blur correction unit 45, the blur detection section 56 and the like, information regarding a detection performance of the blur detection section 56, such as a model number, detection capability and the like, error history and the like. Such information as listed above may be stored in a memory section of the body microcomputer 50, instead of the nonvolatile memory 50a.

The blur detection section 56 includes an angular velocity sensor for detecting the movement of the camera body 4 due to hand shake and the like. The angular velocity sensor outputs a positive/negative angular velocity signal according to the direction in which the camera body 4 is moved, using as a reference an output in a state where the camera body 4 stands still. In this embodiment, two angular velocity sensors are provided to detect two directions, i.e., a yawing direction and a pitching direction. After being subjected to filtering, amplification and the like, the output angular velocity signal is converted into a digital signal by the A/D conversion section, and then, is given to the body microcomputer 50.

-Configuration of Interchangeable Lens-

The interchangeable lens 7 serves as an imaging optical system for forming an object image on the imaging unit 1 in the camera body 4, and includes, as major components, a focus adjustment section 7A for performing focusing, an aperture adjustment section 7B for adjusting an aperture, a lens image blur correction section 7C for adjusting an optical path to correct an image blur, and a lens control section 8 for controlling an operation of the interchangeable lens 7.

The interchangeable lens 7 is attached to the body mount 41 of the camera body 4 via a lens mount 71. The lens mount 71 is provided with an electric contact piece 71a which is electrically connected to the electric contact piece 41a of the body mount 41 when the interchangeable lens 7 is attached to the camera body 4.

The focus adjustment section 7A is comprised of a focus lens group 72 for adjusting a focus. The focus lens group 72 is movable in the direction along the optical axis X in a zone from a closest focus position predetermined as a standard for the interchangeable lens 7 to an infinite focus position. When a focus position is detected using a contrast detection method which will be described later, the focus lens group 72 has to be movable forward and backward from a focus position in the direction along the optical axis X. Therefore, the focus lens group 72 has a lens shift margin zone which allows the focus lens group 72 to move forward and backward in the direction along the optical axis X to a further distance beyond the zone ranging from the closest focus position to the infinite focus position.

The aperture adjustment section 7B is comprised of an aperture section 73 for adjusting an aperture.

The lens image blur correction section 7C includes a blur correction lens 74, and a blur correction lens driving section 74a for moving the blur correction lens 74 in a plane perpendicular to the optical axis X.

The lens control section 8 includes a lens microcomputer 80, a nonvolatile memory 80a, a focus lens group control section 81 for controlling an operation of the focus lens group 72, a focus driving section 82 for receiving a control signal of the focus lens group control section 81 to drive the focus lens group 72, an aperture control section 83 for controlling an operation of the aperture section 73, a blur detection section 84 for detecting a blur of the interchangeable lens 7, and a blur correction lens unit control section 85 for controlling the blur correction lens driving section 74a.

The lens microcomputer 80 is a control device for controlling core functions of the interchangeable lens 7, and is connected to each component mounted on the interchangeable lens 7. Specifically, the lens microcomputer 80 includes a CPU, a ROM, and a RAM and, when programs stored in the ROM are read by the CPU, various functions can be executed.

For example, the lens microcomputer 80 has the function of setting a lens image blur correction system (the blur correction lens driving section 74a or the like) to be a correction possible state or a correction impossible state, based on a signal from the body microcomputer 50. Due to the contact of the electric contact piece 71a provided to the lens mount 71 with the electric contact piece 41a provided to the body mount 41, the body microcomputer 50 is electrically connected to the lens microcomputer 80, so that information can be transmitted/received between the body microcomputer 50 and the lens microcomputer 80.

In the nonvolatile memory 80a, various pieces of information (lens information) for the interchangeable lens 7 are stored. The lens information includes, for example, model information (lens specific information) provided to specify the interchangeable lens 7, such as name of a manufacturer, production date and model number of the interchangeable lens 7, version information for software installed in the lens microcomputer 80 and firmware update information, and information regarding whether or not the interchangeable lens 7 includes sections for correcting an image blur, such as the blur correction lens driving section 74a, the blur detection section 84, and the like. If the interchangeable lens 7 includes sections for correcting an image blur, the lens information further includes information regarding a detection performance of the blur detection section 84 such as a model number, detection capability and the like, information regarding a correction performance (a lens side correction performance information) of the blur correction lens driving section 74a such as a model number, a maximum correctable angle and the like, version information for software for performing image blur correction, and the like. Furthermore, the lens information includes information (lens side power consumption information) regarding necessary power consumption for driving the blur correction lens driving section 74a, and information (lens side driving method information) regarding a method for driving the blur correction lens driving section 74a. The nonvolatile memory 80a can store information transmitted from the body microcomputer 50. The information listed above may be stored in a memory section of the lens microcomputer 80, instead of the nonvolatile memory 80a.

The focus lens group control section 81 includes an absolute position detection section 81a for detecting an absolute position of the focus lens group 72 in the direction along the optical axis, and a relative position detection section 81b for detecting a relative position of the focus lens group 72 in the direction along the optical axis. The absolute position detection section 81a detects an absolute position of the focus lens group 72 provided in a case of the interchangeable lens 7. For example, the absolute position detection section 81a is comprised of a several-bit contact-type encoder substrate and a brush, and is capable of detecting an absolute position. The relative position detection section 81b cannot detect the absolute position of the focus lens group 72 by itself, but can detect a moving direction of the focus lens group 72. The relative position detection section 81b employs, for example, a two-phase encoder. As for the two-phase encoder, two rotary pulse encoders, two MR devices, two hall devices, or the like, for alternately outputting binary signals with an equal pitch according to the position of the focus lens group 72 in the direction along the optical axis are provided so that the phases of their pitches are different from each other. The lens microcomputer 80 calculates the relative position of the focus lens group 72 in the direction along the optical axis from an output of the relative position detection section 81b.

The blur detection section 84 includes an angular velocity sensor for detecting the movement of the interchangeable lens 7 due to hand shake and the like. The angular velocity sensor outputs a positive/negative angular velocity signal according to the direction in which the interchangeable lens 7 moves, using as a reference an output in a state where the interchangeable lens 7 stands still. In this embodiment, two angular velocity sensors are provided to detect two directions, i.e., a yawing direction and a pitching direction. After being subjected to filtering, amplification and the like, the output angular velocity signal is converted into a digital signal by the A/D conversion section, and then, is given to the lens microcomputer 80.

A blur correction lens unit control section 85 includes a moving amount detection section (not shown). The moving amount detection section is a detection section for detecting an actual moving amount of the blur correction lens 74. The blur correction lens unit control section 85 performs feedback control of the blur correction lens 74 based on an output of the moving amount detection section.

An example in which the blur detection sections 56 and 84 and the blur correction units 45 and 74a are provided to both of the camera body 4 and the interchangeable lens 7 has been described. However, such blur detection section and blur correction unit may be provided to either one of the camera body 4 and the interchangeable lens 7. Also, a configuration where such blur detection section and blur correction unit are not provided to either the camera body 4 or the interchangeable lens 7 may be employed (in such a configuration, a sequence regarding the above-described blur correction may be eliminated).

-Operation of Camera-

The camera 100 configured in the above-described manner has various shooting modes and functions. The various shooting modes and functions of the camera 100, and the operation thereof at the time of each of the modes and functions will be described hereinafter.

-AF Function-

When the release button 40b is pressed halfway down, the camera 100 performs AF to focus. To perform AF, the camera 100 has three autofocus functions, i.e., phase difference detection AF, contrast detection AF and hybrid AF. A user can select one of the three autofocus functions to be used by operating the AF setting switch 40c provided to the camera body 4.

Assuming that the camera system is in a normal shooting mode, the shooting operation of the camera system using each of the autofocus functions will be described hereinafter. The "normal shooting mode" is a most basic shooting mode of the camera 100 and is not a shooting mode for continuous shooting, which will be described later, but for normal shooting.

(Phase Difference Detection AF)

Figure 16:
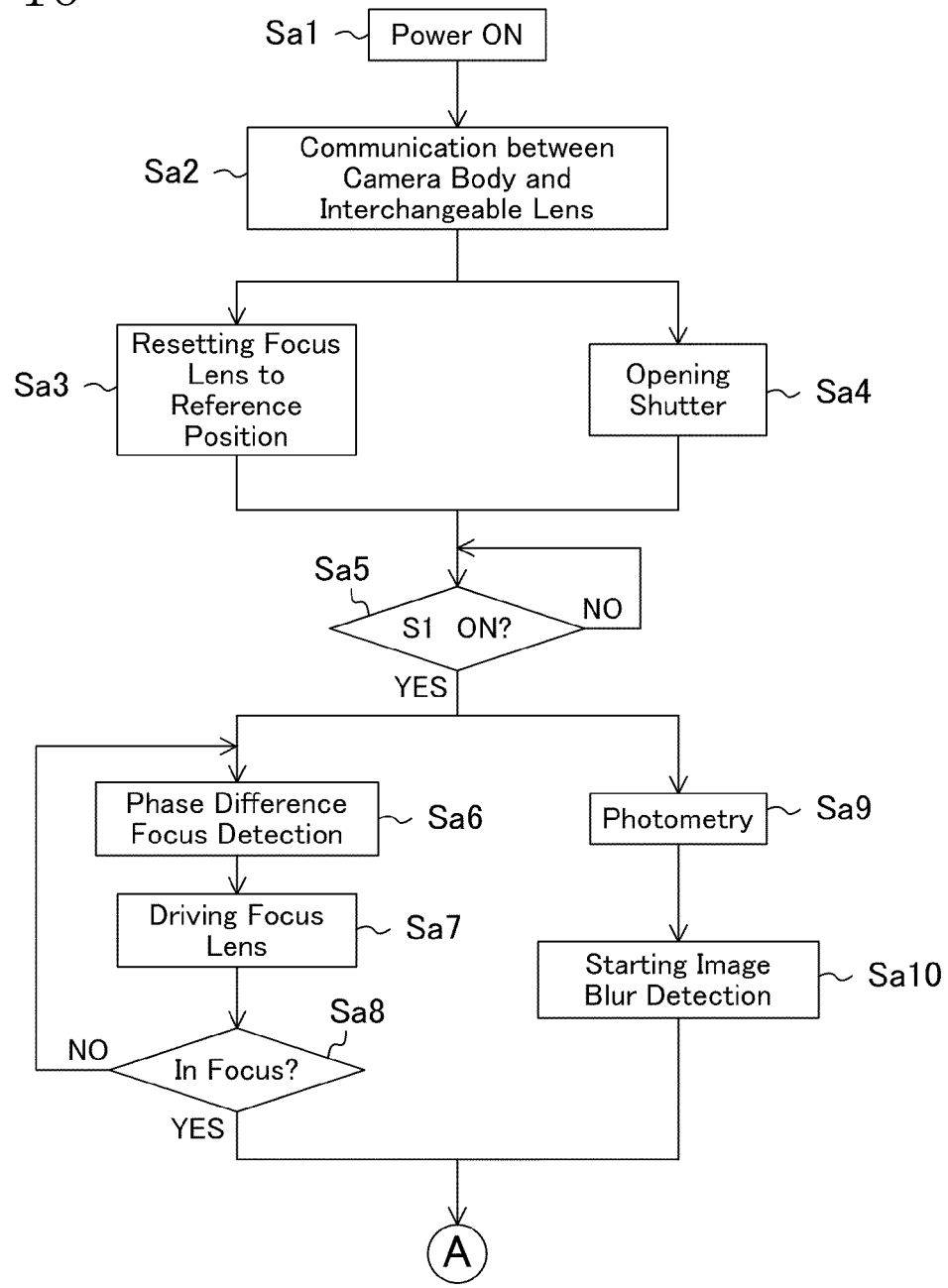
FIG. 16 is a flowchart of the steps in a shooting operation using phase difference detection AF before the release button is pressed all the way down.
Figure 17:
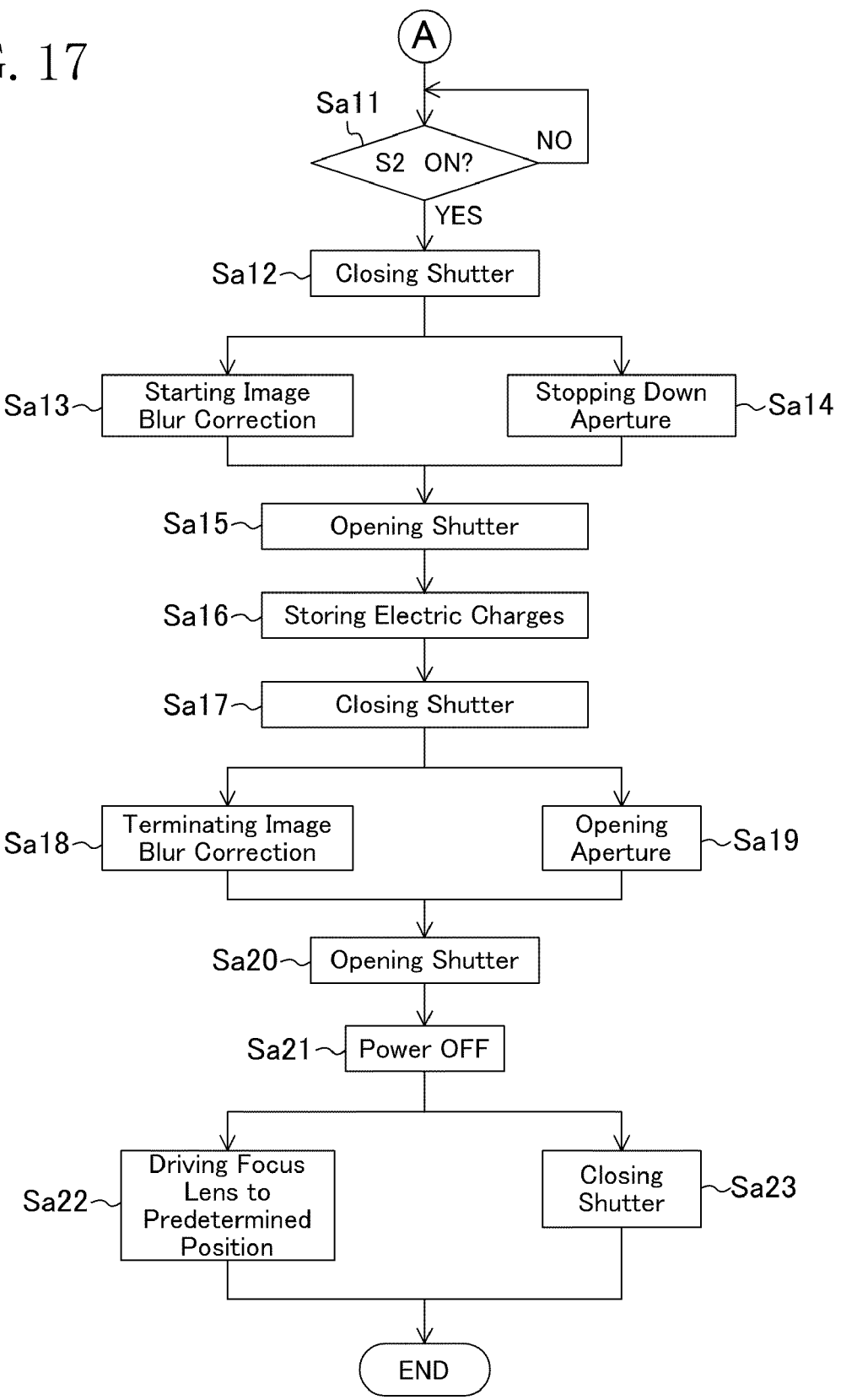
FIG. 17 is a flowchart showing the basic steps in each of shooting operations including a shooting operation using phase difference detection AF after the release button is pressed all the way down.

First, the shooting operation of the camera system using phase difference detection AF will be described with reference of FIGS. 16 and 17.

When the power switch 40a is turned on (Step Sa1), communication between the camera body 4 and the interchangeable lens 7 is performed (Step Sa2). Specifically, power is supplied to the body microcomputer 50 and each of other units in the camera body 4 to start up the body microcomputer 50. At the same time, power is supplied to the lens microcomputer 80 and each of other units in the interchangeable lens 7 via the electric contact pieces 41a and 71a to start up the lens microcomputer 80. The body microcomputer 50 and the lens microcomputer 80 are programmed to transmit/receive information to/from each other at start-up time. For example, lens information for the interchangeable lens 7 is transmitted from the memory section of the lens microcomputer 80 to the body microcomputer 50, and then is stored in the memory section of the body microcomputer 50.

Subsequently, the body microcomputer 50 positions the focus lens group 72 at a predetermined reference position which has been determined in advance by the lens microcomputer 80 (Step Sa3), and also puts the shutter unit 42 into an open state (Step Sa4) in parallel with Step Sa3. Then, the process proceeds to Step Sa5, and the body microcomputer 50 remains in a standby state until the release button 40b is pressed halfway down by the user.

Thus, light which has been transmitted through the interchangeable lens 7 and has entered the camera body 4 passes through the shutter unit 42, is transmitted through the OLPF 43 serving also as an IR cutter, and then enters the imaging unit 1. An object image formed in the imaging unit 1 is displayed at the image display section 44, so that the user can observe an erected image of an object through the image display section 44. Specifically, the body microcomputer 50 reads an electrical signal from the imaging device 10 via the imaging unit control section 52 at constant intervals, and performs predetermined image processing to the electrical signal that has been read. Then, the body microcomputer 50 generates an image signal, and controls the image display control section 55 to cause the image display section 44 to display a live view image.

A part of the light which has entered the imaging unit 1 is transmitted through the light transmitting portions 17 of the imaging device 10, and enters the phase difference detection unit 20.

In this case, when the release button 40b is pressed halfway down (i.e., S1 switch, which is not shown in the drawings, is turned on) by the user (Step Sa5), the body microcomputer 50 amplifies an output from the line sensor 24a of the phase difference detection unit 20, and then performs an operation by the arithmetic circuit, thereby determining whether or not an object image is in focus, at which the front pin or the rear pin an object image is formed, and the Df amount (Step Sa6).

Thereafter, the body microcomputer 50 drives the focus lens group 72 via the lens microcomputer 80 in the defocus direction by the Df amount obtained in Step Sa6 (Step Sa7).

In this case, the phase difference detection unit 20 of this embodiment includes three sets of the condenser lens 21a, the mask openings 22a, separator lens 23a, and the line sensor 24a, i.e., has three distance measurement points at which phase difference detection is performed. In phase difference detection in phase difference detection AF or hybrid AF, the focus lens group 72 is driven based on an output of the line sensor 24a of one of the sets corresponding to a distance measurement point arbitrarily selected by the user.

Alternatively, an automatic optimization algorithm may be installed in the body microcomputer 50 beforehand to select one of the distance measurement points located closest to the camera and drive the focus lens group 72. Thus, the rate of the occurrence of focusing on the background of an object instead of the object can be reduced.

Application of this selection of the distance measurement point is not limited to phase difference detection AF. As long as the focus lens group 72 is driven using the phase difference detection unit 20, this selection can be employed in AF using any method.

Then, whether or not an object image has been brought into focus (Step Sa8). Specifically, if the Df amount obtained based on the output of the line sensor 24a is equal to or smaller than a predetermined value, it is determined that the object image has been brought into focus (YES), and then, the process proceeds to Step Sa11. If the Df amount obtained based on the output of the line sensor 24a is larger than the predetermined value, it is determined that the object has not been brought into focus (NO), the process returns to Step Sa6, and Steps Sa6-Sa8 are repeated.

In the above-described manner, detection of an in-focus state and driving of the focus lens group 72 are repeated and, when the Df amount is equal to or smaller than the predetermined value, it is determined that the object image has been brought into focus, and driving of the focus lens group 72 is halted.

In parallel with phase difference detection AF in Steps Sa6-Sa8, photometry is performed (Step Sa9), and image blur detection is started (Step Sa10).

Specifically, in Step Sa9, the amount of light entering the imaging device 10 is measured by the imaging device 10. That is, in this embodiment, the above-described phase difference detection AF is performed using light which has entered the imaging device 10 and has been transmitted through the imaging device 10, and thus, photometry can be performed using the imaging device 10 in parallel with the above-described phase difference detection AF.

More specifically, the body microcomputer 50 retrieves an electrical signal from the imaging device 10 via the imaging unit control section 52, and measures the intensity of object light based on the electrical signal, thereby performing photometry. According to a predetermined algorithm, the body microcomputer 50 determines, from a result of photometry, a shutter speed and an aperture value, which correspond to a shooting mode at the time of exposure.

When photometry is terminated in Step Sa9, image blur detection is started in Step Sa10. Step Sa9 and Step Sa10 may be performed in parallel.

When the release button 40b is pressed halfway down by the user, various pieces of information for shooting are displayed as well as a shooting image at the image display section 44, and thus, the user can confirm each piece of information through the image display section 44.

In Step Sa11, the body microcomputer 50 remains in a standby state until the release button 40b is pressed all the way down (i.e., a S2 switch, which is not shown in the drawings, is turned on) by the user. When the release button 40b is pressed all the way down by the user, the body microcomputer 50 temporarily puts the shutter unit 42 into a close state (Step Sa12). Then, while the shutter unit 42 is kept in a close state, electrical charges stored in the light receiving sections 11b of the imaging device 10 are transferred for exposure, which will be described later.

Thereafter, the body microcomputer 50 starts correction of an image blur based on communication information between the camera body 4 and the interchangeable lens 7 or any information specified by the user (Step Sa13). Specifically, the blur correction lens driving section 74a in the interchangeable lens 7 is driven based on information of the blur detection section 56 in the camera body 4. According to the intention of the user, any one of (i) use of the blur detection section 84 and the blur correction lens driving section 74a in the interchangeable lens 7, (ii) use of the blur detection section 56 and the blur correction unit 45 in the camera body 4, and (iii) use of the blur detection section 84 in the interchangeable lens 7 and the blur correction unit 45 in the camera body 4 can be selected.

By starting driving of the image blur correction sections at a time when the release button 40b is pressed halfway down, the movement of an object desired to be in focus is reduced, and thus, phase difference detection AF can be performed with higher accuracy.

In parallel with starting of image blur correction, the body microcomputer 50 stops down the aperture section 73 via the lens microcomputer 80 so as to attain an aperture value calculated based on a result of photometry in Step Sa9 (Step Sa14).

Thus, when the image blur correction is started and the aperture operation is terminated, the body microcomputer 50 puts the shutter unit 42 into an open state based on the shutter speed obtained from the result of photometry in Step Sa9 (Step Sa15). In the above-described manner, the shutter unit 42 is put into an open state, so that light from the object enters the imaging device 10, and electrical charges are stored in the imaging device 10 only for a predetermined time (Step Sa16).

The body microcomputer 50 puts the shutter unit 42 into a close state based on the shutter speed, to terminate exposure (Step Sa17). After the termination of the exposure, in the body microcomputer 50, image data is read out from the imaging unit 1 via the imaging unit control section 52 and then, after performing predetermined image processing to the image data, the image data is output to the image display control section 55 via the image reading/recording section 53. Thus, a shooting image is displayed at the image display section 44. The body microcomputer 50 stores the image data in the image storage section 58 via the image recording control section 54 as necessary.

Thereafter, the body microcomputer 50 terminates image blur correction (Step Sa18), and releases the aperture section 73 (Step Sa19). Then, the body microcomputer 50 puts the shutter unit 42 into an open state (Step Sa20).

When a reset operation is terminated, the lens microcomputer 80 notifies the body microcomputer 50 of the termination of the reset operation. The body microcomputer 50 waits to receive reset termination information from the lens microcomputer 80 and also a series of processings after exposure to be terminated. Thereafter, the body microcomputer 50 confirms that the release button 40b is not in a pressed state, and terminates a shooting sequence. Then, the process returns to Step Sa5, and the body microcomputer 50 remains in a standby state until the release button 40b is pressed halfway down.

When the power switch 40a is turned off (Step Sa21), the body microcomputer 50 moves the focus lens group 72 to a predetermined reference position which has been determined in advance (Step Sa22), and puts the shutter unit 42 into a close state (Step Sa23). Then, respective operations of the body microcomputer 50 and other units in the camera body 4, and the lens microcomputer 80 and other units in the interchangeable lens 7 are halted.

As described above, in the shooting operation of the camera system using phase difference detection AF, photometry is performed by the imaging device 10 in parallel with autofocusing based on the phase difference detection unit 20. Specifically, the phase difference detection unit 20 receives light transmitted through the imaging device 10 to obtain defocus information, and thus, whenever the phase difference detection unit 20 obtains defocus information, the imaging device 10 is irradiated with light from an object. Therefore, photometry is performed using light transmitted through the imaging device 10 in autofocusing. By doing so, a photometry sensor does not have to be additionally provided, and photometry can be performed before the release button 40b is pressed all the way down, so that a time (hereinafter also referred to as a "release time lag") from a time point when the release button 40b is pressed all the way down to a time point when exposure is terminated can be reduced.

Moreover, even in a configuration in which photometry is performed before the release button 40b is pressed all the way down, by performing photometry in parallel with autofocusing, increase in processing time after the release button 40*b* is pressed halfway down can be prevented. In such a case, a mirror for guiding light from an object to a photometry sensor or a phase difference detection unit does not have to be provided.

Conventionally, a part of light from an object to an imaging apparatus is directed to a phase difference detection unit provided outside the imaging apparatus by a mirror or the like. In contrast, according to this embodiment, an in-focus state can be detected by the phase difference detection unit 20 using light guided to the imaging unit 1 as it is, and thus, the in-focus state can be detected with very high accuracy.

(Contrast Detection AF)

Figure 18:
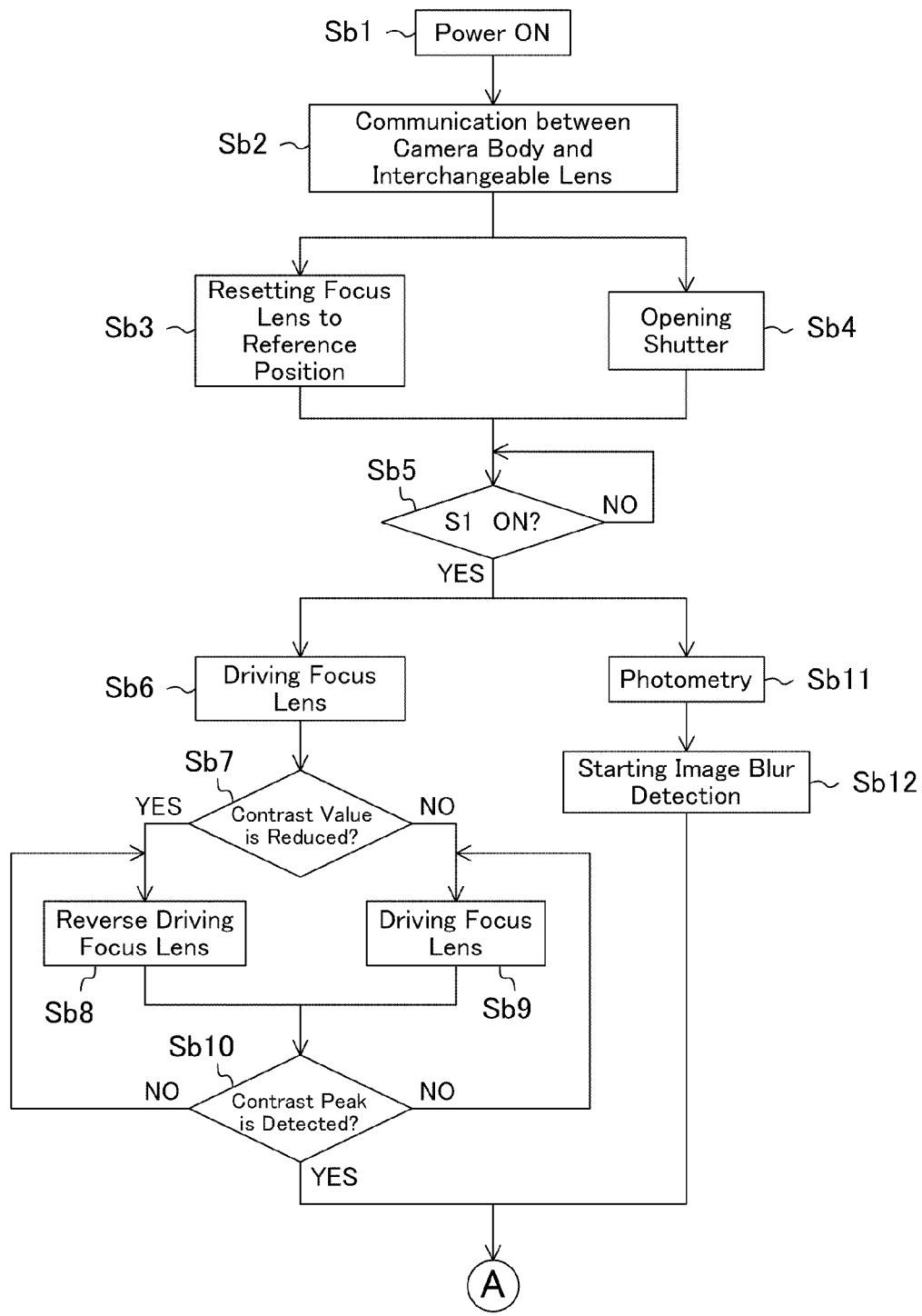
FIG. 18 is a flowchart of the steps in a shooting operation using contrast detection AF before the release button is pressed all the way down.

Next, the shooting operation of the camera system using contrast detection AF will be described with reference to FIG. 18.

When the power switch 40*a* is turned on (Step Sb1), communication between the camera body 4 and the interchangeable lens 7 is performed (Step Sb2), the focus lens group 72 is positioned at a predetermined reference position (Step Sb3), the shutter unit 42 is put into an open state (Step Sb4) in parallel with Step Sb3, and then, the body microcomputer 50 remains in a standby state until the release button 40*b* is pressed halfway down (Step Sb5). The above-described steps are the same as Steps Sa1-Sa5.

When the release button 40*b* is pressed halfway down by the user (Step Sb5), the body microcomputer 50 drives the focus lens group 72 via the lens microcomputer 80 (Step Sb6). Specifically, the body microcomputer 50 drives the focus lens group 72 so that a focal point of an object image is moved in a predetermined direction (e.g., toward an object) along the optical axis.

Then, the body microcomputer 50 obtains a contrast value for the object image, based on an output from the imaging device 10 received by the body microcomputer 50 via the imaging unit control section 52, to determine whether or not the contrast value is reduced (Step Sb7). If the contrast value is reduced (YES), the process proceeds to Step Sb8. If the contrast value is increased (NO), the process proceeds to Step Sb9.

Reduction in contrast value means that the focus lens group 72 is driven in an opposite direction to the direction in which the object image is brought into focus. Therefore, when the contrast value is reduced, the focus lens group 72 is reversely driven so that the focal point of the object image is moved in an opposite direction to the predetermined direction (e.g., toward the opposite side to the object) along the optical axis (Step Sb8). Thereafter, whether or not a contrast peak has been detected is determined (Step Sb10). If the contrast peak has not been detected (NO), reverse driving of the focus lens group 72 (Step Sb8) is repeated. If the contrast peak has been detected (YES), reverse driving of the focus lens group 72 is halted, and the focus lens group 72 is moved to a position where the contrast value has reached the peak. Then, the process proceeds to Step Sa11.

On the other hand, when the focus lens group 72 is driven in Step Sb6 and the contrast value is increased, the focus lens group 72 is driven in the direction in which the object image is brought into focus. Therefore, driving of the focus lens group 72 is continued (Step Sb9), and whether or not a peak of the contrast value has been detected is determined (Step Sb10). If the contrast peak has not been detected (NO), driving of the focus lens group 72 (Step Sb9) is repeated. If the contrast peak has been detected (YES), driving of the focus lens group 72 is halted, and the focus lens group 72 is moved to a position where the contrast value has reached the peak. Then, the process proceeds to Step Sa11.

As has been described, in the contrast detection method, the focus lens group 72 is tentatively driven (Step Sb6). Then, if the contrast value is reduced, the focus lens group 72 is reversely driven to search for the peak of the contrast value (Steps Sb8 and Sb10). If the contrast value is increased, driving of the focus lens group 72 is continued to search for the peak of the contrast value (Steps Sb9 and Sb10).

In parallel with this contrast detection AF (Steps Sb6-Sb10), photometry is performed (Step Sb11), and image blur detection is started (Step Sb12). Steps Sb11 and Sb12 are the same as Step Sa9 and Step Sa10 in phase difference detection AF.

In Step Sa11, the body microcomputer 50 remains in a standby state until the release button 40*b* is pressed all the way down by the user. A flow of steps after the release button 40*b* is pressed all the way down is the same as that of phase difference detection AF.

In this contrast detection AF, a contrast peak can be directly obtained, and thus, as opposed to phase difference detection AF, various correction operations such as release back correction (for correcting an out-of-focus state due to the degree of aperture) and the like are not necessary, so that a highly accurate focusing performance can be achieved. However, to detect the peak of a contrast value, the focus lens group 72 has to be driven until the focus lens group 72 passes through a position where the contrast value reaches its peak. Accordingly, the focus lens group 72 has to be moved beyond the position where the contrast value has reached the peak first and then be moved back to the position corresponding to the peak of the contrast value, and thus, a backlash generated in a focus lens group driving system due to the operation of driving the focus lens group 72 in back and forth directions has to be removed.

(Hybrid AF)

Figure 19:
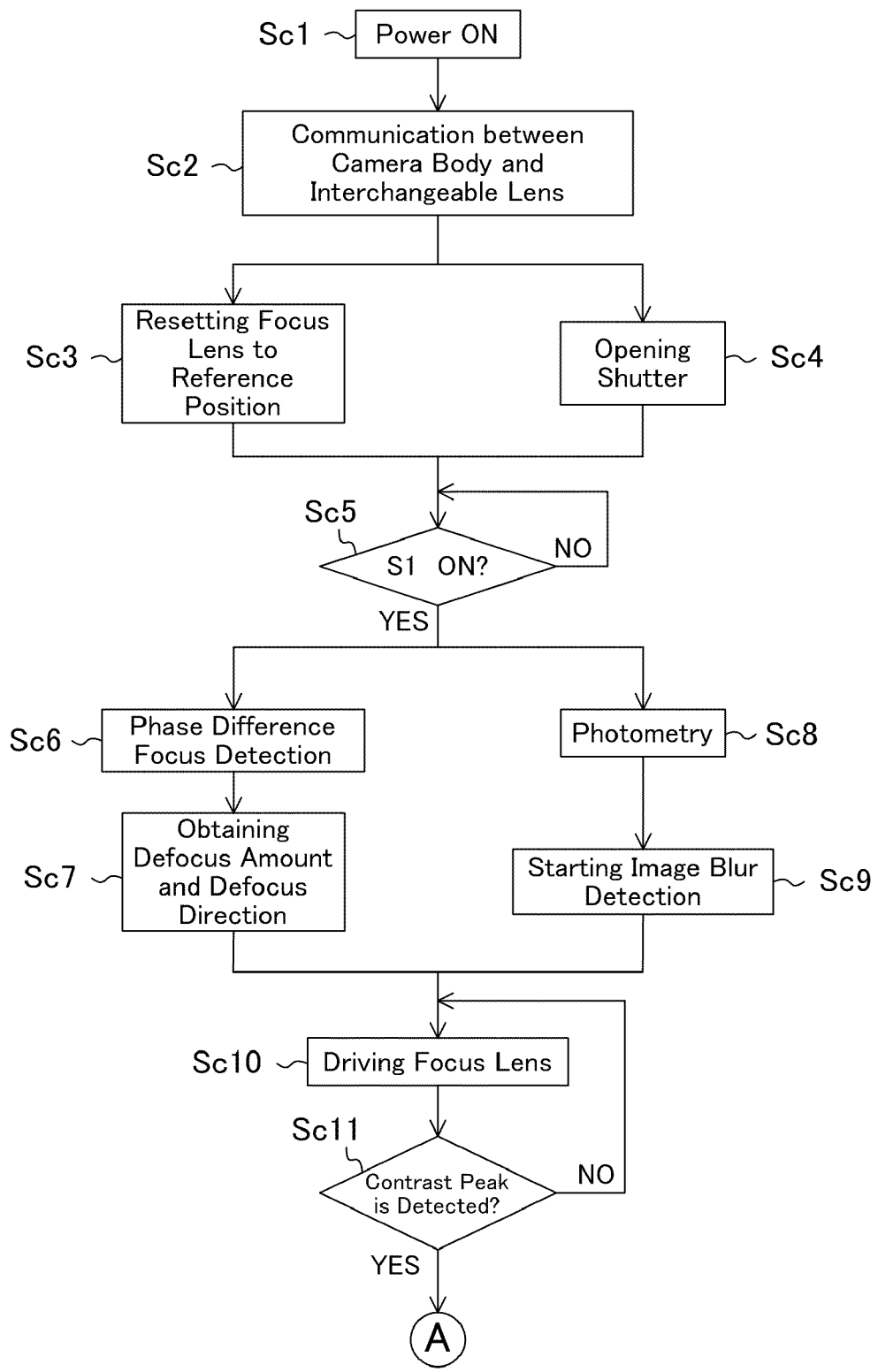
FIG. 19 is a flowchart of the steps in a shooting operation using hybrid AF before the release button is pressed all the way down.

Subsequently, the shooting operation of the camera system using hybrid AF will be described with reference to FIG. 19.

Steps (Steps Sc1-Sc5) from the step in which the power switch 40*a* is turned on to the step in which the body microcomputer remains in a standby state until the release button 40*b* is pressed halfway down are the same as Steps Sa1-Sa5 in phase difference detection AF.

When the release button 40*b* is pressed halfway down by the user (Step Sc5), the body microcomputer 50 amplifies an output from the line sensor 24*a* of the phase difference detection unit 20, and then performs an operation by the arithmetic circuit, thereby determining whether or not an object image is in focus (Step Sc6). Furthermore, the body microcomputer 50 determines at which the front pin or the rear pin an object image is formed and the Df amount, and then, obtains defocus information (Step Sc7). Thereafter, the process proceeds to Step Sc10.

In parallel with Steps Sc6 and Sc7, photometry is performed (Step Sc8), and image blur detection is started (Step Sc9). Steps Sc6 and Sc7 are the same as Steps Sa9 and Sa10 in phase difference detection AF. Thereafter, the process proceeds to Step Sc10. Note that, after Step Sc9, the process may also proceed to Step Sa11, instead of Sc10.

As decried above, in this embodiment, using light which has entered the imaging device 10 and has been transmitted through the imaging device 10, the above-described focus detection based on a phase difference is performed. Thus, in parallel with the above-describe focus detection, photometry can be performed using the imaging device 10.

In Step Sc10, the body microcomputer 50 drives the focus lens group 72 based on the defocus information obtained in Step Sc7.

The body microcomputer 50 determines whether or not a contrast peak has been detected (Step Sc11). If the contrast peak has not been detected (NO), driving of the focus lens group 72 (Step Sc10) is repeated. If the contrast peak has been detected (YES), driving of the focus lens group 72 is halted, and the focus lens group 72 is moved to a position where the contrast value has reached the peak. Then, the process proceeds to Step Sa11.

Specifically, in Steps Sc10 and Sc11, it is preferable that, based on the defocus direction and the defocus amount calculated in Step Sc7, the focus lens group 72 is moved at high speed, and then, the focus lens group 72 is moved at lower speed than the high speed to detect the contrast peak.

In this case, it is preferable that an moving amount of the focus lens group 72 which is moved based on the calculated defocus amount (i.e., a position to which the focus lens group 72 is to be moved) is set to be different from that in Step Sa7 in phase difference detection AF. Specifically, in Step Sa7 in phase difference detection AF, the focus lens group 72 is moved to a position which is estimated as a focus position, based on the defocus amount. In contrast, in Step Sc10 in hybrid AF, the focus lens group 72 is driven to a position shifted forward or backward from the position estimated as a focus position based on the defocus amount. Thereafter, in hybrid AF, the contrast peak is detected while the focus lens group 72 is driven toward the position estimated as the focus position.

In Step Sa11, the body microcomputer 50 remains in a standby state until the release button 40b is pressed all the way down by the user. A flow of steps after the release button 40b is pressed all the way down is the same as that of phase difference detection AF.

As has been described, in hybrid AF, first, defocus information is obtained by the phase difference detection unit 20, and the focus lens group 72 is driven based on the defocus information. Then, the position of the focus lens group 72 at which the contrast value calculated based on an output from the imaging device 10 reaches a peak is detected, and the focus lens group 72 is moved to the position. Thus, defocus information can be detected before driving the focus lens group 72, and therefore, as opposed to contrast detection AF, the step of tentatively driving the focus lens group 72 is not necessary. This allows reduction in processing time for autofocusing. Moreover, an object image is brought into focus by contrast detection AF eventually, and therefore, particularly, an object having a repetitive pattern, an object image having extremely low contrast, and the like can be brought into focus with higher accuracy than in phase difference detection AF.

Since defocus information is obtained by the phase difference detection unit 20 using light transmitted through the imaging device 10, photometry by the imaging device 10 can be performed in parallel with obtaining defocus information by the phase difference detection unit 20, although hybrid AF includes phase difference detection. As a result, a mirror for dividing a part of light from an object does not have to be provided for phase difference detection, and also, a photometry sensor does not have to be additionally provided. Furthermore, photometry can be performed before the release button 40b is pressed all the way down, so that a release time lag can be reduced. In the configuration in which photometry is performed before the release button 40b is pressed all the way down, photometry can be performed in parallel with obtaining defocus information, thereby preventing increase in processing time after the release button 40b is pressed halfway down.

-Variations-

In the above description, after the release button 40b is pressed all the way down, stopping down is performed immediately before exposure. In the following description, a variation configured so that, in phase difference detection AF and hybrid AF, before the release button 40b is pressed all the way down, stopping down is performed before autofocusing will be described.

(Phase Difference Detection AF)

Figure 20:
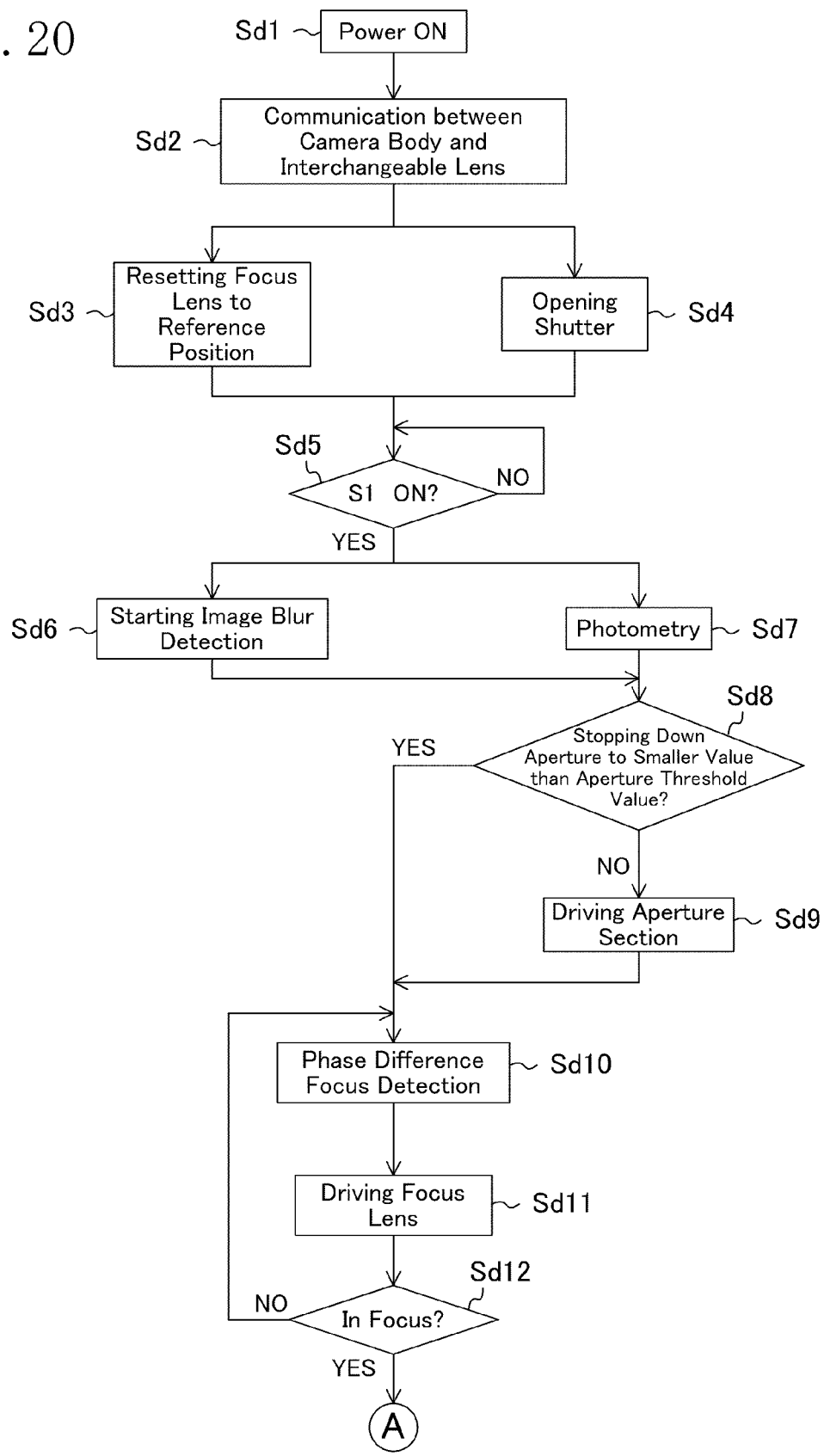
FIG. 20 is a flowchart of the steps in a shooting operation using phase difference detection AF according to the variation before the release button is pressed all the way down.

Specifically, first, the shooting operation of the camera system in phase difference detection AF according to the variation will be described with reference to FIG. 20.

Steps (Steps Sd1-Sd5) from the step in which the power switch 40a is turned on to the step in which the body microcomputer remains in a standby state until the release button 40b is pressed halfway down are the same as Steps Sa1-Sa5 in phase difference detection AF which have been described above.

When the release button 40b is pressed halfway down by a user (Step Sd5), image blur detection is started (Step Sd6), and in parallel with Step Sd6, photometry is performed (Step Sd7). Steps Sd5 and Sd6 are the same as Steps Sa9 and Sa10 in phase difference detection AF.

Thereafter, an aperture value at the time of exposure is obtained based on a result of photometry in Step Sd7, and whether or not the obtained aperture value is larger than a predetermined aperture threshold value is determined (Step Sd8). Then, when the obtained aperture value is larger than the predetermined aperture threshold value (YES), the process proceeds to Step Sd10. When the obtained value is equal to or smaller than the predetermined aperture threshold value (NO), the process proceeds to Step Sd9. In Step Sd9, the body microcomputer 50 drives the aperture section 73 via the lens microcomputer 80 to attain the obtained aperture value.

In this case, the predetermined aperture threshold value is set to be about an aperture value at which defocus information can be obtained based on an output of the line sensor 24a of the phase difference detection unit 20. That is, assuming that the aperture value obtained based on the result of photometry is larger than the aperture threshold value, if the aperture section 73 is stopped down to the aperture value, defocus information cannot be obtained by the phase difference detection unit 20. Therefore, the aperture section 73 is not stopped down, and the process proceeds to Step Sd10. On the other hand, when the aperture value obtained based on the result of photometry is equal to or smaller than the aperture threshold value, the aperture section 73 is stopped down to the aperture value, and then, the process proceeds to Step Sd10.

In Steps Sd10-Sd12, similarly to Steps Sa6-Sa8 in phase difference detection AF described above, the body microcomputer 50 obtains defocus information based on an output from the line sensor 24a of the phase difference detection unit 20 (Step Sd10), drives the focus lens group 72 based on the defocus information (Step Sd11), and determines whether or not an object image has been brought into focus (Step Sd12). After an object image has been brought into focus, the process proceeds to Step Sa11.

In Step Sa11, the body microcomputer remains in a standby state until the release button 40b is pressed all the way down by the user. A flow of steps after the release button 40b is pressed all the way down is the same as that of phase difference detection AF described above.

It should be noted that only when it is determined in Step Sd8 that the aperture value obtained based on the result of photometry is larger than the predetermined aperture threshold value, stopping down of the aperture section 73 is performed in Step Sa14. That is, when it is determined in Step Sd8 that the aperture value obtained based on the result of photometry is equal to or smaller than the predetermined aperture threshold value, Step Sa14 does not have to be performed because stopping down of the aperture section 73 is performed beforehand in Step Sd9.

As described above, in the shooting operation of the camera system in phase difference detection AF according to the variation, when the aperture value at the time of exposure obtained based on the result of photometry is about a value at which phase difference detection AF can be performed, the aperture section 73 is stopped down in advance of exposure before autofocusing. Thus, stopping down of the aperture section 73 does not have to be performed after the release button 40b is pressed all the way down, so that a release time lag can be reduced.

(Hybrid AF)

Figure 21:
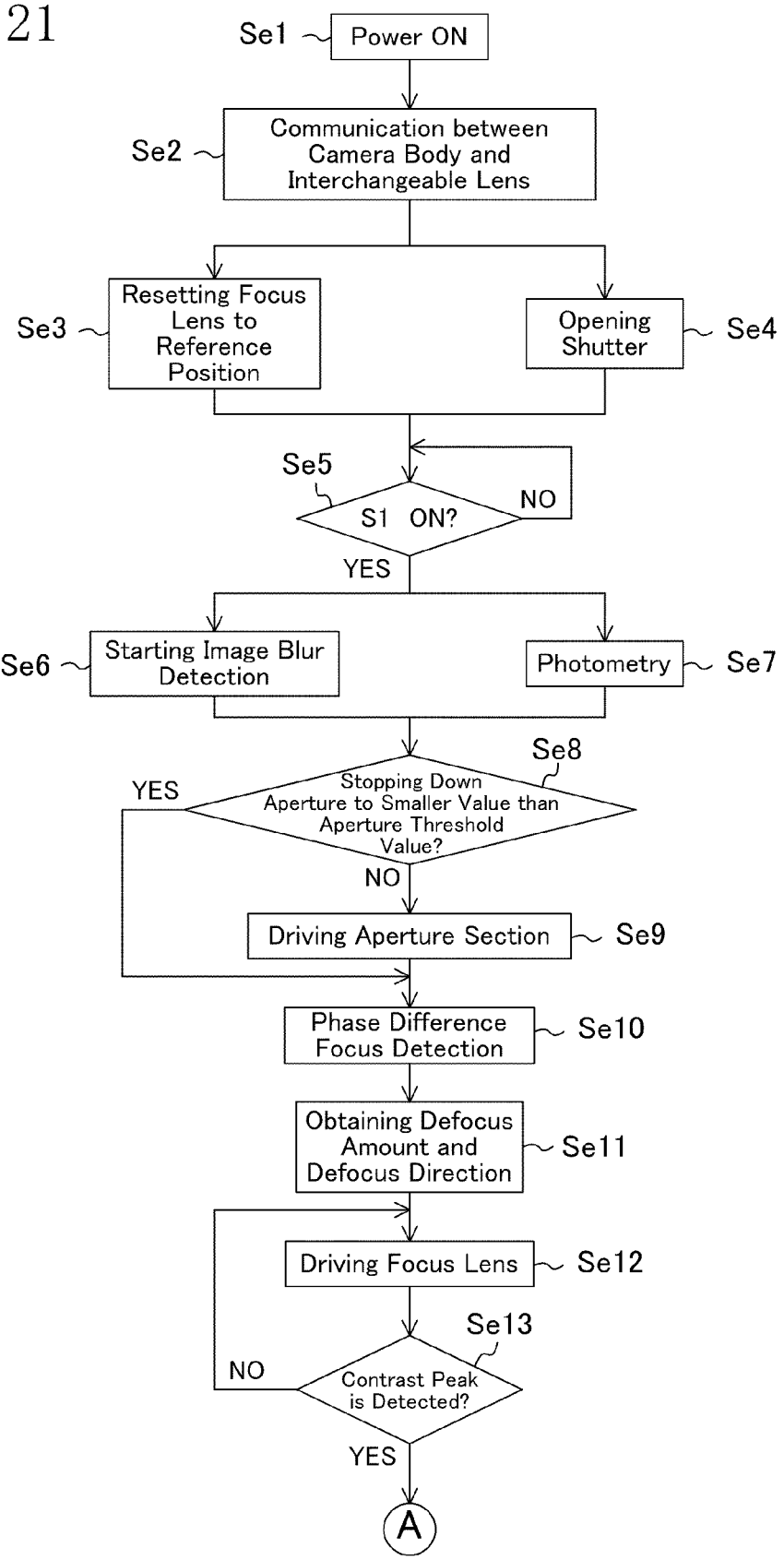
FIG. 21 is a flowchart of the steps in a shooting operation using hybrid AF according to the variation before the release button is pressed all the way down.

Next, the shooting operation of the camera system in hybrid AF according to the variation will be described with reference to FIG. 21.

Steps (Steps Se1-Se5) from the step in which the power switch 40a is turned on to the step in which the body microcomputer remains in a standby state until the release button 40b is pressed halfway down are the same as Steps Sa1-Sa5 in phase difference detection AF which have been described above.

When the release button 40b is pressed halfway down by a user (Step Se5), image blur detection is started (Step Se6), and in parallel with Step Se6, photometry is performed (Step Se7). Steps Se6 and Se7 are the same as Steps Sa9 and Sa10 in phase difference detection AF.

Thereafter, an aperture value at the time of exposure is obtained based on a result of photometry in Step Se7, and whether or not the obtained aperture value is larger than a predetermined aperture threshold value is determined (Step Se8). Then, when the obtained aperture value is larger than the predetermined aperture threshold value (YES), the process proceeds to Step Se10. When the obtained value is equal to or smaller than the predetermined aperture threshold value (NO), the process proceeds to Step Se9. In Step Se9, the body microcomputer 50 drives the aperture section 73 via the lens microcomputer 80 to attain the obtained aperture value.

In this case, the predetermined aperture threshold value is set to be about an aperture value at which a peak of a contrast value calculated from an output of the imaging device 10 can be detected. That is, assuming that the aperture value obtained based on the result of photometry is larger than the aperture threshold value, if the aperture section 73 is stopped down to the aperture value, contrast peak detection, which will be described later, cannot be performed. Therefore, the aperture section 73 is not stopped down, and the process proceeds to Step Se10. On the other hand, when the aperture value obtained based on the result of photometry is equal to or smaller than the aperture threshold value, the aperture section 73 is stopped down to the aperture value, and then, the process proceeds to Step Se10.

In Steps Se10-Se12, similarly to Steps Sc6, Sc7, Sc10 and Sc11 in normal hybrid AF described above, the body microcomputer 50 obtains defocus information based on an output from the line sensor 24a of the phase difference detection unit 20 (Steps Se10 and Se11), drives the focus lens group 72 based on the defocus information (Step Se12), and detects the contrast peak to move the focus lens group 72 to a position where the contrast value has reached the peak (Step Se13).

Thereafter, in Step Sa11, the body microcomputer remains in a standby state until the release button 40b is pressed all the way down by the user. A flow of steps after the release button 40b is pressed all the way down is the same as that of normal phase difference detection AF described above.

It should be noted that only when it is determined in Step Se8 that the aperture value obtained based on the result of photometry is larger than the predetermined aperture threshold value, stopping down of the aperture section 73 is performed in Step Sa14. That is, when it is determined in Step Se8 that the aperture value obtained based on the result of photometry is equal to or smaller than the predetermined aperture threshold value, Step Sa14 does not have to be performed because stopping down of the aperture section 73 is performed beforehand in Step Se9.

As described above, in the shooting operation of the camera system in hybrid AF according to the variation, when the aperture value at the time of exposure obtained based on the result of photometry is about a value at which contrast detection AF can be performed, the aperture section 73 is stopped down in advance of exposure before autofocusing. Thus, stopping down of the aperture section 73 does not have to be performed after the release button 40b is pressed all the way down, and therefore, a release time lag can be reduced.

-Continuous Shooting Mode-

In the above description, each time the release button 40b is pressed all the way down, a single image is shot. The camera 100 has a continuous shooting mode in which a plurality of images are shot by pressing the release button 40b all the way down once.

Figure 22:
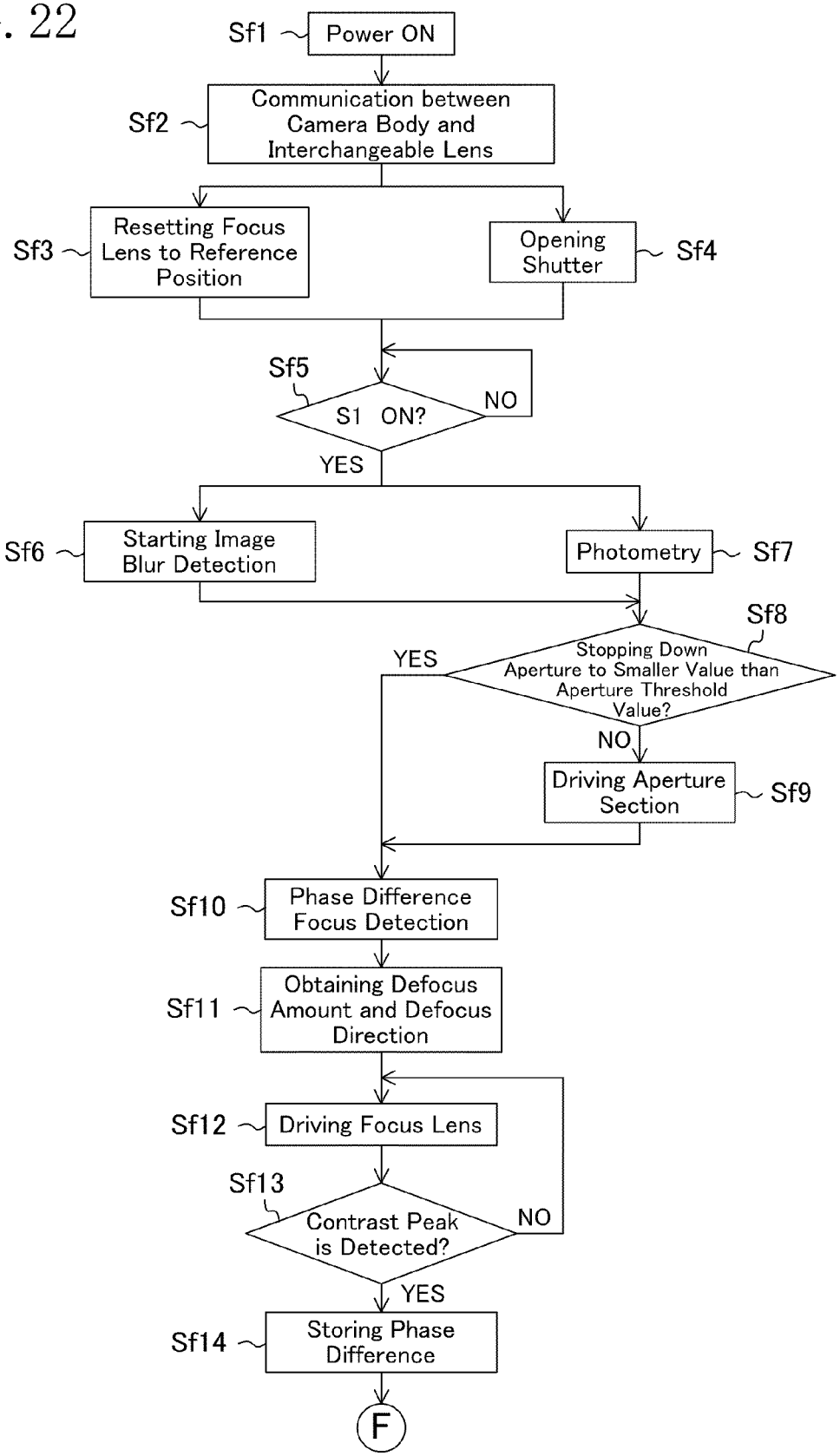
FIG. 22 is a flowchart of the steps in a shooting operation in a continuous shooting mode before the release button is pressed all the way down.
Figure 23:
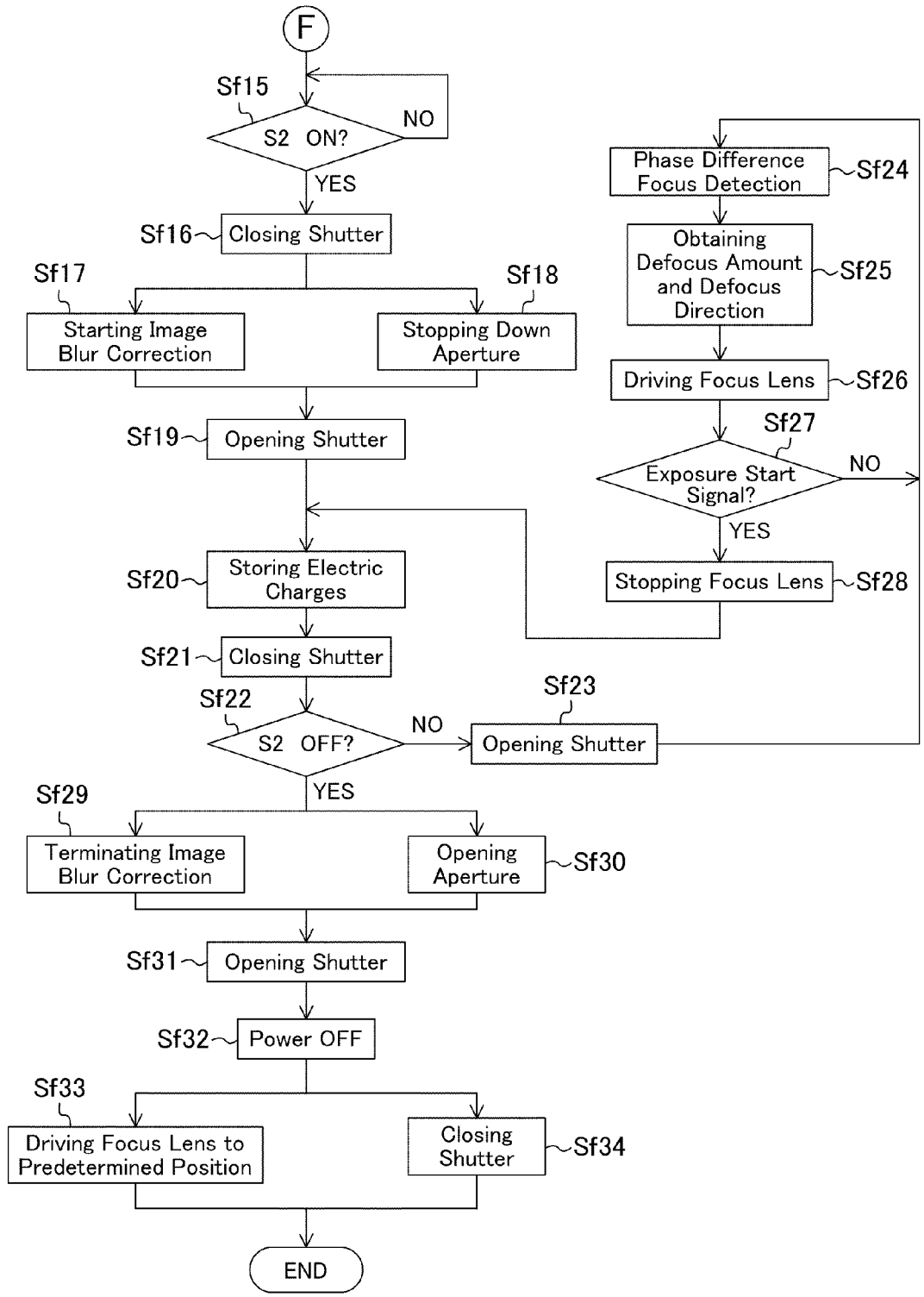
FIG. 23 is a flowchart of the steps in a shooting operation in the continuous shooting mode after the release button is pressed all the way down.

The continuous shooting mode will be described hereinafter with reference to FIGS. 22 and 23. In the following description, it is assumed that hybrid AF according to the variation is performed. Note that the continuous shooting mode is not limited to hybrid AF according to the variation, but can be employed in any configuration using phase difference detection AF, contrast detection AF, hybrid AF, phase difference detection AF according to the variation, or the like.

Steps (Steps Sf1-Sf13) from the step in which the power switch 40a is turned on to the step in which a release button 40b is pressed halfway down and the focus lens group 72 is moved to the position where the contrast value has reached the peak are the same as Steps Se1-Se13 in hybrid AF according to the variation.

After the focus lens group 72 is moved to the position where the contrast value has reached the peak, the body microcomputer 50 causes the memory section to store a distance between two object images formed on the line sensor 24a at that time (i.e., when an object image has been brought into focus using contrast detection AF) (Step Sf14).

Thereafter, in Step Sf15, the body microcomputer remains in a standby state until the release button 40b is pressed all the way down by the user. When the release button 40b is pressed all the way down by the user, exposure is performed in the same manner as in Steps Sa12-Sa17 in phase difference detection AF.

Specifically, the body microcomputer 50 temporarily puts the shutter unit 42 into a close state (Step Sf16), image blur correction is started (Step Sf17), and if the aperture section 73 is not stopped down in Step Sf9, the aperture section 73 is stopped down based on a result of photometry (Step Sf18). Thereafter, the shutter unit 42 is put into an open state (Step Sf19), exposure is started (Step Sf20), and the shutter unit 42 is put into a close state (Step Sf21) to terminate the exposure.

After the exposure is terminated, whether or not the release button 40b has been released from being pressed all the way down is determined (Step Sf22). When the release button 40b has been released (YES), the process proceeds to Steps Sf29 and Sf30. On the other hand, when the release button 40b is continuously pressed all the way down (NO), the process proceeds to Step Sf23 to perform continuous shooting.

When the release button 40b is continuously pressed all the way down, the body microcomputer 50 puts the shutter unit 42 into an open state (Step Sf23), and phase difference detection AF is performed (Steps Sf24-Sf26).

Specifically, an in-focus state of an object image in the imaging device 10 is detected via the phase difference detection unit 20 (Step Sf24), defocus information is obtained (Step Sf25), and the focus lens group 72 is driven based on the defocus information (Step Sf26).

In this case, in hybrid AF before the release button 40b is pressed all the way down, a distance between two object images formed on the line sensor 24a is compared to a reference distance which has been set beforehand to obtain the defocus information (Step Sf11). In contrast, in Steps Sf24 and Sf25 after the release button 40b is pressed all the way down, the distance between two object images formed on the line sensor 24a is compared to the distance of two object images formed on the line sensor 24a which has been stored in Step Sf14 after contrast detection AF in hybrid AF to obtain an in-focus state and defocus information.

After phase difference detection AF is performed in the above-described manner, the body microcomputer 50 determines whether or not it is a timing of outputting a signal (i.e., an exposure start signal) for starting exposure from the body microcomputer 50 to the shutter control section 51 and the imaging unit control section 52 (Step Sf27). This output timing of the exposure start signal is a timing of performing continuous shooting in continuous shooing mode. When it is not the output timing of the exposure start signal (NO), phase distance detection AF is repeated (Steps Sf24-Sf26). On the other hand, when it is the output timing of the exposure start signal (YES), driving of the focus lens group 72 is halted (Step Sf28) to perform exposure (Step Sf20).

Note that after the focus lens group 72 is halted, it is necessary to sweep out, before starting exposure, electrical charges accumulated in the light receiving sections 11b of the imaging device 10 during phase difference detection AF. Therefore, electrical charges in the light receiving sections 11b are swept out using an electronic shutter, or the shutter unit 42 is temporarily put into a close state to sweep out electrical charges in the light receiving sections 11b, and then the shutter unit 42 is put into an open state to start exposure.

After the exposure is terminated, whether or not the release button 40b has been released from being pressed all the way down is determined again (Step Sf22). As long as the release button 40b is pressed all the way down, phase difference detection AF and exposure are repeated (Steps Sf23-Sf28 and Steps Sf20 and Sf21).

When the release button 40b has been released from being pressed all the way down, image blur correction is terminated (Step Sf29), and also, the aperture section 73 is opened up (Step Sf30) to put the shutter unit 42 into an open state (Step Sf31).

After completing resetting, when a shooting sequence is terminated, the process returns to Step Sa5, and the body microcomputer remains in a standby state until the release button 40b is pressed halfway down.

When the power switch 40a is turned off (Step Sf32), the body microcomputer 50 moves the focus lens group 72 to a predetermined reference position which has been set beforehand (Step Sf33), and puts the shutter unit 42 into a close state (Step Sf34). Then, respective operations of the body microcomputer 50 and other units in the camera body 4, and the lens microcomputer 80 and other units in the interchangeable lens 7 are halted.

As described above, in the shooting operation of the camera system in the continuous shooting mode, phase difference detection AF can be performed between exposures during continuous shooting, so that a high focus performance can be realized.

Also, since autofocusing is performed using phase difference detection AF in this case, the defocus direction can be instantly obtained, and thus, even in a short time between shootings continuously performed, an object image can be instantly brought into focus.

Furthermore, as opposed to a known technique, even in phase difference detection AF, a movable mirror for phase difference detection does not have to be provided. Thus, a release time lag can be reduced, and also, power consumption can be reduced. Moreover, according to the known technique, a release time lag corresponding to the vertical movement of the movable mirror is generated, and thus, when an object is a moving object, it is necessary to predict the movement of the moving object during the release time lag and then shoot an image. However, according to this embodiment, there is no release time lag corresponding to the vertical movement of the movable mirror, and therefore, focus can be achieved while following the movement of an object until immediately before exposure.

In phase difference detection AF during continuous shooting, as the reference distance between two object images formed on the line sensor 24a based on which whether or not an object image has been brought into focus is determined, the distance between two object images formed on the line sensor 24a when the release button 40b is pressed halfway down and the object image has been brought into focus by contrast detection AF is used. Thus, highly accurate autofocusing which corresponds to actual equipment and actual shooting conditions can be performed.

In shooting the first frame in the continuous shooting mode, the autofocusing method is not limited to hybrid AF. Phase difference detection AF or contrast detection AF may be used. Note that when phase difference detection AF is used, Step Sf14 is not performed, the distance between two object images formed on the line sensor 24a is compared to the reference distance which has been set beforehand to obtain an in-focus state and defocus information.

Not only in the continuous shooting mode but also in normal shooting, the camera system may be configured so that, when an object is a moving object, phase difference detection AF is performed until the release button 40b is pressed all the way down even after an object image has been brought into focus.

-Low Contrast Mode-

The camera 100 of this embodiment is configured so that the autofocusing method is switched according to the contrast of an object. That is, the camera 100 has a low contrast mode in which shooting is performed under a low contrast condition.

Figure 24:
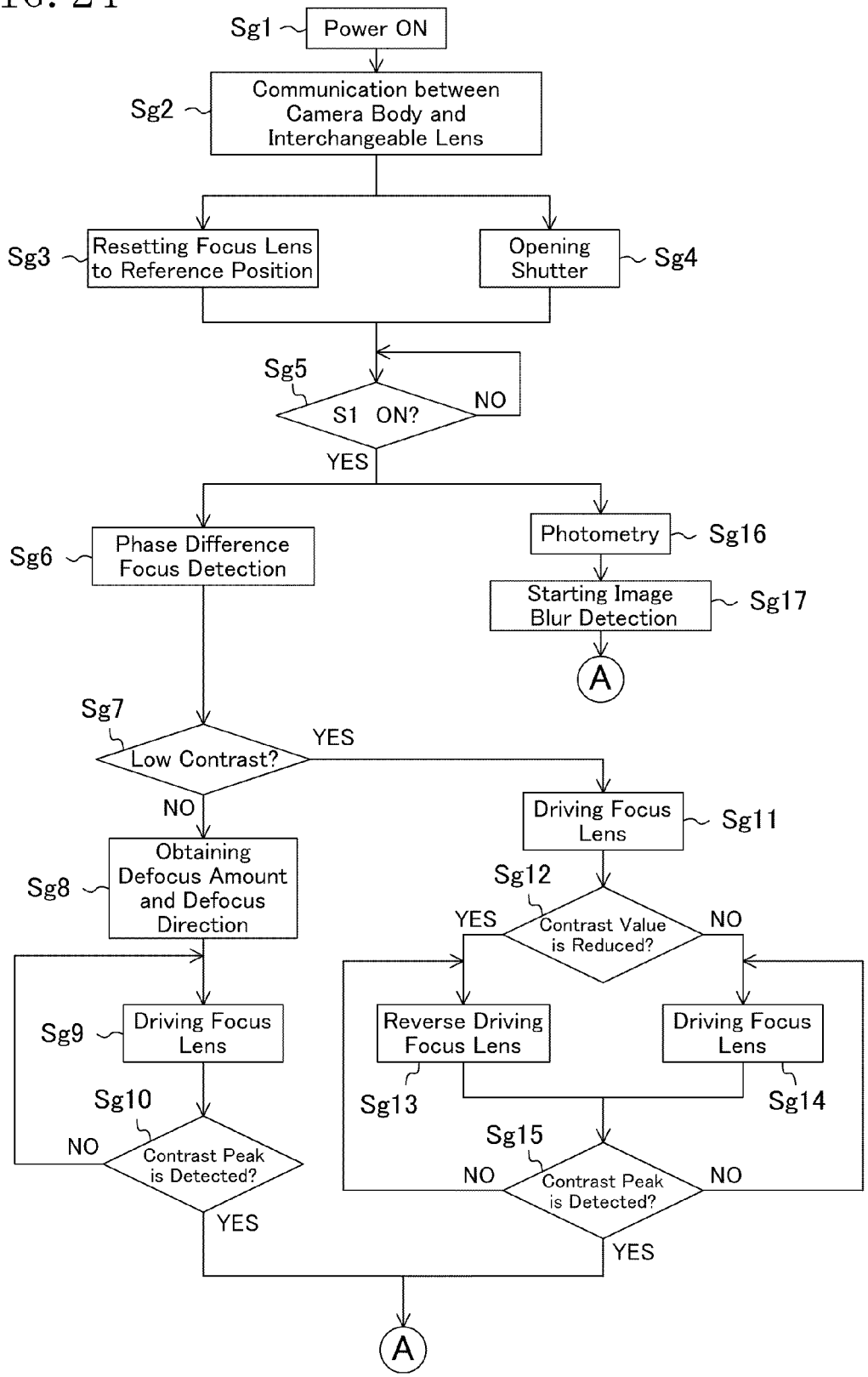
FIG. 24 is a flowchart of the steps in a shooting operation in a low contrast mode before the release button is pressed all the way down.

The low contrast mode will be described hereinafter with reference to FIG. 24. In the following description, it is assumed that hybrid AF is performed. Note that the low contrast mode is not limited to hybrid AF, but can be employed in any configuration using phase difference detection AF, contrast detection AF, phase difference detection AF according to the variation, hybrid AF according to the variation, or the like.

Steps (Steps Sg1-Sg5) from the step in which the power switch 40a is turned on to the step in which the body microcomputer remains in a standby state until the release button 40b is pressed halfway down are the same as Steps Sa1-Sa5 in phase difference detection AF.

When the release button 40b is pressed halfway down by a user (Step Sg5), the body microcomputer 50 amplifies an output from the line sensor 24a of the phase difference detection unit 20, and then performs an operation by the arithmetic circuit (Step Sg6). Then, whether or not a low contrast state has occurred is determined (Step Sg7). Specifically, it is determined whether or not a contrast value is high enough to detect respective positions of two object images formed on the line sensor 24a based on the output from the line sensor 24a.

When the contrast value is high enough to detect the positions of the two object images (NO), it is determined that a low contrast state has not occurred, and the process proceeds to Step Sg8 to perform hybrid AF. Note that Steps Sg8-Sg10 are the same as Steps Sc7, Sc10 and Sc11 in hybrid AF.

On the other hand, when the contrast value is not high enough to detect the position of the two object images (YES), it is determined that a low contrast state has occurred, and the process proceeds to Step Sg11 to perform contrast detection AF. Note that Steps Sg11-Sg15 are the same as Steps Sb6-Sb10 in contrast detection AF.

After hybrid AF or contrast detection AF is preformed in the above-described manner, the process proceeds to Step Sa11.

In parallel with this autofocus operation (Steps Sg6-Sg15), photometry is performed (Step Sg16), and image blur detection is started (Step Sg17). Steps Sg16 and Sg17 are the same as Steps Sa9 and Sa10 in phase difference detection AF. Thereafter, the process proceeds to Step Sa11.

In Step Sa11, the body microcomputer remains in a standby state until the release button 40b is pressed all the way down by the user. A flow of steps after the release button 40b is pressed all the way down is the same as that of normal hybrid detection AF.

That is, in the low contrast mode, when the contrast at the time of shooting is high enough to perform phase difference detection AF, hybrid AF is performed. On the other hand, when the contrast at the time of shooting is so low that phase difference detection AF cannot be performed, contrast detection AF is performed.

In this embodiment, first, it is determined whether or not an in-focus state can be detected using phase difference detection based on the output of the line sensor 24a of the phase difference detection unit 20, and then, hybrid AF or contrast detection AF is selected. However, the present invention is not limited thereto. For example, the camera system may be configured so that after the release button 40b is pressed halfway down, the contrast value is obtained from an output of the imaging device 10 to determine whether or not the contrast value obtained from the output of the imaging device 10 is higher than a predetermined value before a phase difference focus is detected (i.e., between Steps Sg5 and Sg6 in FIG. 24). The predetermined value is set to be about a contrast value at which a position of an object image formed on the line sensor 24a can be detected. That is, the camera system may be configured so that, when the contrast value obtained from the output of the imaging device 10 is approximately equal to or larger than a value at which an in-focus state can be detected using phase difference detection, hybrid AF is performed and, on the other hand, when the contrast value obtained from the output of the imaging device 10 is smaller than the value at which an in-focus state can be detected using phase difference detection, contrast detection AF is performed.

Also, in this embodiment, when an in-focus state can be detected using phase difference detection, hybrid AF is performed. However, the camera system may be configured so that, when an in-focus state can be detected using phase difference detection, phase difference detection AF is performed.

As described above, in the camera 100 including the imaging unit 1 for receiving light transmitting through the imaging device 10 by the phase difference detection unit 20, the movable mirror of the known technique for guiding light to the phase difference detection unit is not provided, but phase difference detection AF (including hybrid AF) and contrast detection AF can be performed. Thus, a highly accurate focus performance can be realized by selecting one of phase difference detection AF and contrast detection AF according to the contrast.

-AF Switching According to Interchangeable Lens-

Furthermore, the camera 100 of this embodiment is configured so that the autofocusing method is switched according to the type of the interchangeable lens 7 attached to the camera body 4.

Figure 25:
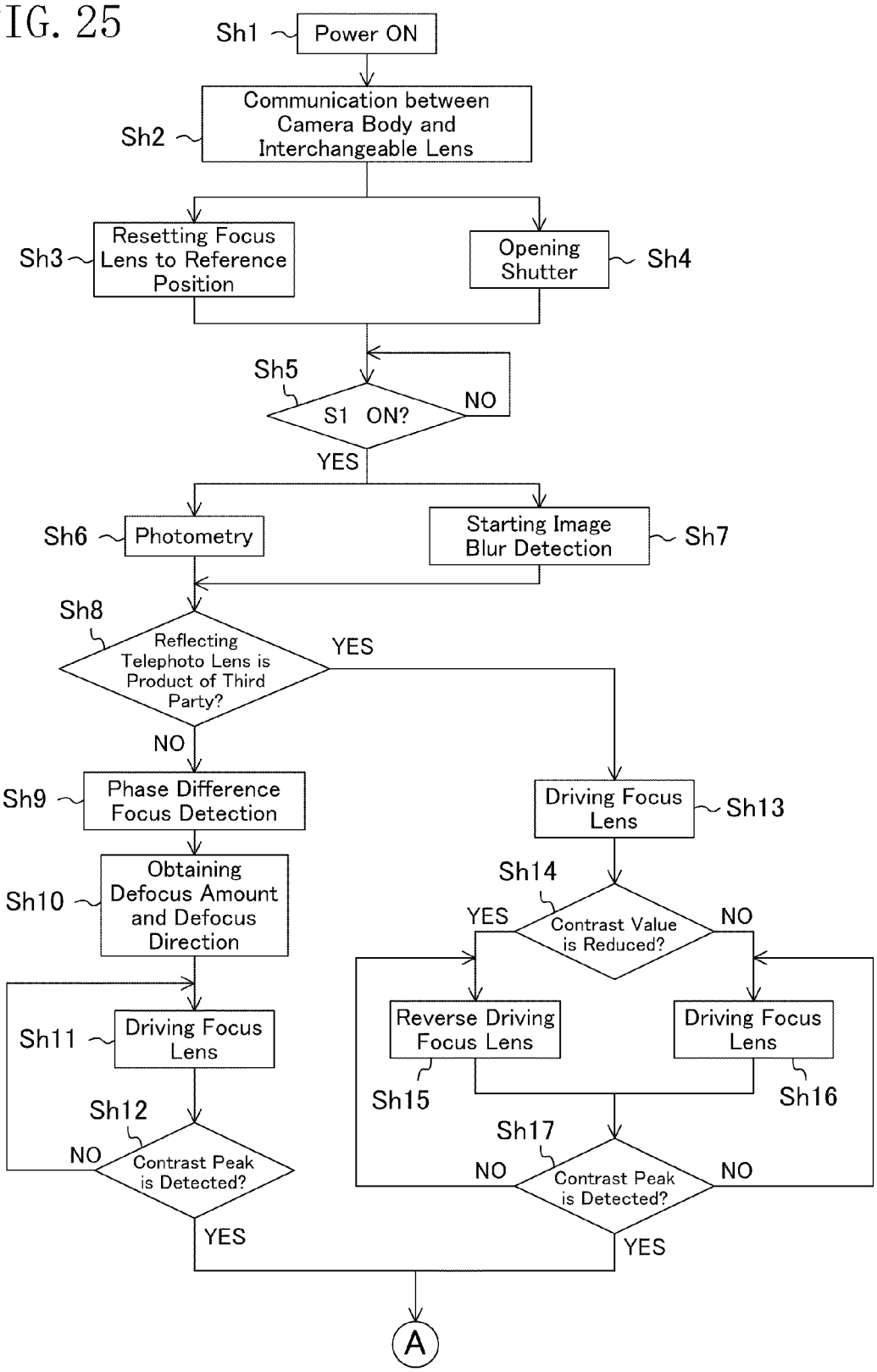
FIG. 25 is a flowchart of the steps in a shooting operation in which AF function is switched according to a type of an interchangeable lens before the release button is pressed all the way down.

An AF switching function according to the type of the interchangeable lens will be described hereinafter with reference to FIG. 25. In the following description, it is assumed that hybrid AF is performed. Note that the AF switching function is not limited to hybrid AF, but can be employed in any configuration using phase difference detection AF, contrast detection AF, phase difference detection AF according to the variation, hybrid AF according to the variation, or the like.

Steps (Steps Sh1-Sh5) from the step in which the power switch 40a is turned on to the step in which the body microcomputer remains in a standby state until the release button 40b is pressed halfway down are the same as Steps Sa1-Sa5 in phase difference detection AF.

When the release button 40b is pressed halfway down by a user (Step Sh5), photometry is performed (Step Sh6), and in parallel with Step Sh6, image blur detection is started (Step Sh7). Steps Sh6 and Sh7 are the same as Steps Sa9 and Sa10 in phase difference detection AF. Note that the photometry and image blur detection may be performed in parallel with an autofocus operation which will be described later.

Thereafter, the body microcomputer 50 determines whether or not the interchangeable lens 7 is a reflecting telephoto lens produced by a third party or a smooth trans focus (STF) lens based on information from the lens microcomputer 80 (Step Sh8). When the interchangeable lens 7 is a reflecting telephoto lens produced by a third party or a STF lens (YES), the process proceeds to Step Sh13 to perform contrast detection AF. Note that Steps Sh13-Sh17 are the same as Steps Sb6-Sb10 in contrast detection AF.

On the other hand, when the interchangeable lens 7 is not either a reflecting telephoto lens produced by a third party or a STF lens (NO), the process proceeds to Step Sh9 to perform hybrid AF. Note that Steps Sh9-Sh12 are the same as Steps Sc6, Sc7, Sc10 and Sc11 in hybrid AF.

After contrast detection AF or hybrid AF is performed in the above-described manner, the process proceeds to Step Sa11.

In Step Sa11, the body microcomputer remains in a standby state until the release button 40b is pressed all the way down by the user. A flow of steps after the release button 40b is pressed all the way down is the same as that of hybrid AF.

That is, when the interchangeable lens 7 is a reflecting telephoto lens produced by a third party or a STF lens, phase difference detection might not be performed with high accuracy, and therefore, hybrid AF (specifically, phase difference detection AF) is not performed, but contrast detection AF is performed. On the other hand, when the interchangeable lens 7 is not either a reflecting telephoto lens produced by a third party or a STF lens, hybrid AF is performed. That is, the body microcomputer 50 determines whether or not it is ensured that an optical axis of the interchangeable lens 7 properly extends so that phase difference detection AF can be performed. Then, only when it is ensured that the optical axis of the interchangeable lens 7 properly extends so that phase difference detection AF can be performed, hybrid AF is performed. If it is not ensured that the optical axis of the interchangeable lens 7 properly extends so that phase difference detection AF can be performed, contrast detection AF is performed.

As described above, in the camera 100 including the imaging unit 1 for receiving light transmitting through the imaging device 10 by the phase difference detection unit 20, the movable mirror of the known technique for guiding light to the phase difference detection unit is not provided, but phase difference detection AF (including hybrid AF) and contrast detection AF can be performed. Thus, a highly accurate focus performance can be realized by selecting one of phase difference detection AF and contrast detection AF according to the type of the interchangeable lens 7.

According to this embodiment, it is determined which of hybrid AF and contrast detection AF is to be performed depending on whether or not the interchangeable lens 7 is a reflecting telephoto lens produced by a third party or a STF lens. However, AF method determination is not limited thereto. The camera system may be configured to determine which of hybrid AF and contrast detection AF is performed depending on only whether or not the interchangeable lens 7 is produced by a third party, regardless of whether or not the interchangeable lens 7 is a reflecting telephoto lens or a STF lens.

Also, according to this embodiment, the camera system is configured so that when the interchangeable lens 7 is not either a reflecting telephoto lens produced by a third party or a STF lens, hybrid AF is performed. However, the camera system may be configured so that when the interchangeable lens 7 is not either a reflecting telephoto lens produced by a third party or a STF lens, phase difference detection AF is performed.

Ninth Embodiment

Next, a camera 200 as an imaging apparatus according to a ninth embodiment will be described.

Figure 26:
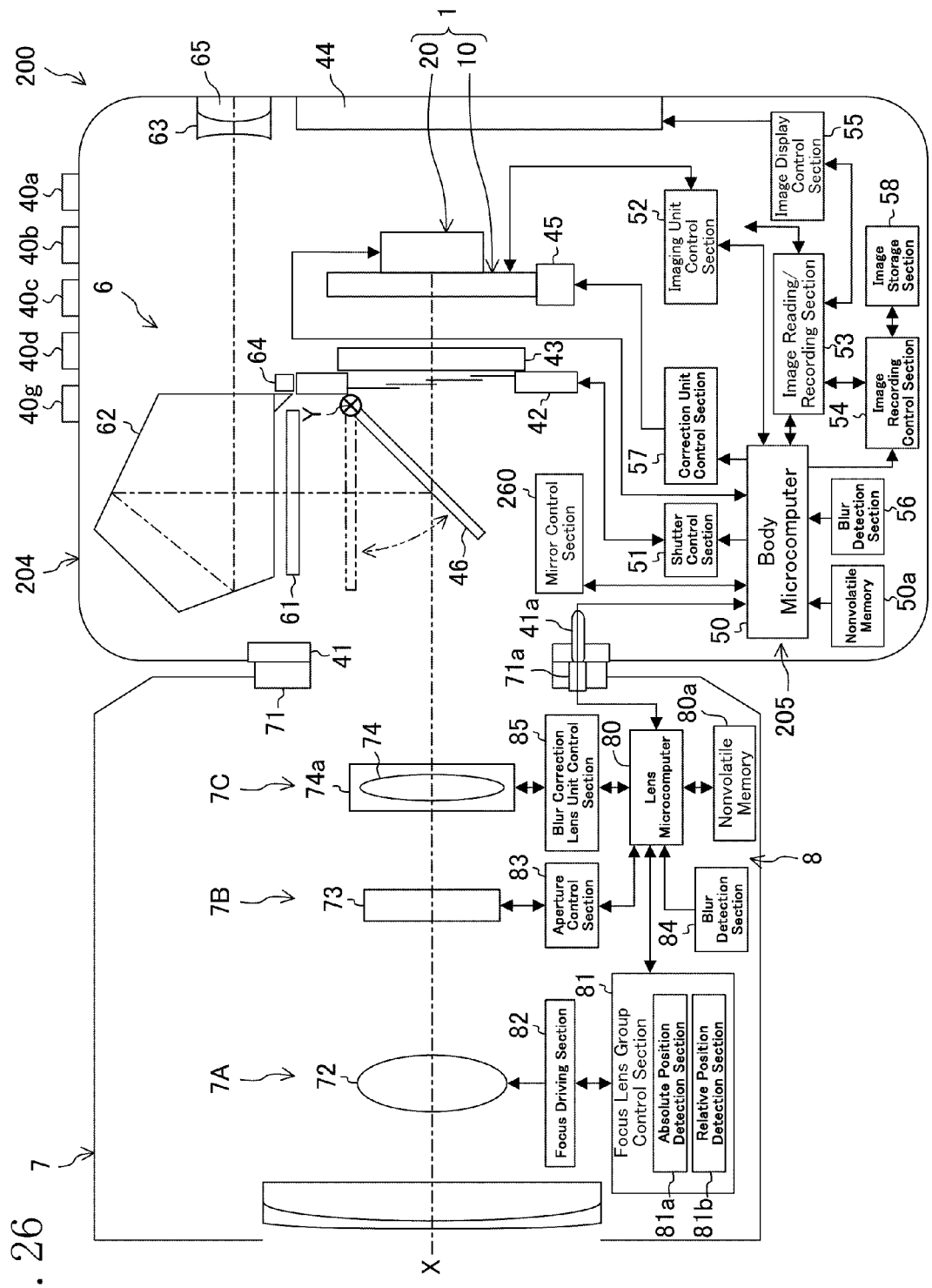
FIG. 26 is a block diagram of a camera according to a ninth embodiment of the present invention.

As shown in FIG. 26, the camera 200 includes a finder optical system 6.

-Configuration of Camera Body-

A camera body 204 further includes, in addition to components of the camera body 4 of the eighth embodiment, a finder optical system 6 for visually identifying an object image through a finder 65, and a semi-transparent quick return mirror 46 for guiding incident light from the interchangeable lens 7 to the finder optical system 6.

The camera body 204 has a finder shooting mode in which shooting is performed while a user visually identifies an object image through the finder optical system 6, and a live view shooting mode in which shooting is performed while a user visually identifies an object image through the image display section 44. The camera body 204 is provided with a finder mode setting switch 40g. The finder shooting mode is set by turning on the finder mode setting switch 40g, and the live view shooting mode is set by turning off the finder mode setting switch 40g.

The finder optical system 6 includes a finder screen 61 on which reflected light from the quick return mirror 46 forms an image, a pentaprism 62 for converting an object image projected on the finder screen 61 into an erected image, an eye lens 63 for enlarging the projected object image for visual identification, an in-finder display section 64 for displaying various kinds of information within a finder viewing field, and a finder 65 provided on a back surface side of the camera body 204.

That is, the user can observe an object image formed on the finder screen 61 through the finder 65 via the pentaprism 62 and the eye lens 63.

A body control section 205 further includes, in addition to components of the body control section 5 of the eighth embodiment, a mirror control section 260 for controlling flip-up of the quick return mirror 46, which will be described later, based on a control signal from the body microcomputer 50.

The quick return mirror 46 is a semi-transparent mirror capable of reflecting and transmitting incident light, and is configured to be capable of pivotally moving in front of the shutter unit 42 between a reflection position (see a solid line of FIG. 26) which is on the optical path X extending from an object to the imaging unit 1 and a retracted position (see a chain double-dashed line of FIG. 26) which is off the optical path X and is located adjacent to the finder optical system 6. At the reflection position, the quick return mirror 46 divides incident light into reflected light toward the finder optical system 6 and transmitted light to the back surface side of the quick return mirror 46.

Specifically, the quick return mirror 46 is arranged in front of the shutter unit 42 (i.e., at an object side), and pivotally supported about an axis Y which is located above and in front of the shutter unit 42 and horizontally extends. The quick return mirror 46 is biased toward a retracted position by a bias spring (not shown). The quick return mirror 46 is moved to the reflection position by the bias spring being wound up by a motor (not shown) for opening and closing the shutter unit 42. The quick return mirror 46 which has been moved to the reflection position is engaged with an electromagnet or the like at the refection position. Then, this engagement is released, thereby causing the quick return mirror 46 to be pivotally moved to the retracted position by force of the bias spring.

That is, to guide a part of incident light to the finder screen 61, the bias spring is wound up by the motor, thereby causing the quick return mirror 46 to be positioned at the reflection position. To guide the entire incident light to the imaging unit 1, the engagement with the electromagnet or the like is released, thereby causing the quick return mirror 46 to be pivotally moved to the retracted position by elastic force of the bias spring.

As shown in FIGS. 27(A)-27(C), a light shielding plate 47 is connected to the quick return mirror 46. The light shielding plate 47 is configured to interact with the quick return mirror 46, and covers, when the quick return mirror 46 is positioned at the retracted position, the quick return mirror 46 from below (i.e., from a side closer to an optical path X extending from the object to the imaging unit 1). Thus, when the quick return mirror 46 is positioned at the retracted position, light entering from the finder optical system 6 is prevented from reaching the imaging unit 1.

Specifically, the light shielding plate 47 includes a first light shielding plate 48 pivotally connected to an end portion of the quick return mirror 46 located at an opposite side to the pivot axis Y, and a second light shielding plate 49 pivotally connected to the first shielding plate 48. The first light shielding plate 48 includes a first cam follower 48a. In the camera body 204, a first cam groove 48b with which the first cam follower 48a is to be engaged is provided. The second light shielding plate 49 includes a second cam follower 49a. In the camera body 204, a second cam groove 49b with which the second cam follower 49a is to be engaged is provided.

That is, when the quick return mirror 46 is pivotally moved, the first light shielding plate 48 is moved to follow the quick return mirror 46, and the second light shielding plate 49 is moved to follow the first light shielding plate 48. In this case, the first and second light shielding plates 48 and 49 move in conjunction with the quick return mirror 46 while the first and second cam followers 48a and 49a are guided respectively by the first and second cam grooves 48b and 49b.

As a result, when the quick return mirror 46 is positioned at the retracted position, as shown in FIG. 27(A), the first and second light shielding plates 48 and 49 are arranged below the quick return mirror 46 as a single flat plate to shield light between the quick return mirror 46 and the shutter unit 42, i.e., the imaging unit 1. In this case, similarly to the quick return mirror 46, the first and second light shielding plates 48 and 49 are located off the optical path X. Therefore, the first and second light shielding plates 48 and 49 do not influence light entering the imaging unit 1 from the object.

As the quick return mirror 46 is moved from the retracted position to the reflection position, as shown in FIG. 27(B), the first and second light shielding plates 48 and 49 arranged as a single flat plane are bent. When the quick return mirror 46 is pivotally moved to the reflection position, as shown in FIG. 27(C), the first and second light shielding plates 48 and 49 are bent at an angle that allows them to face each other. In this state, the first and second light shielding plates 48 and 49 are off the optical path X and are located at an opposite side to the finder screen 61 across the optical path X. Therefore, when the quick return mirror 46 is positioned at the reflection position, the first and second light shielding plates 48 and 49 do not influence light reflected toward the finder optical system 6 by the quick return mirror 46 and light transmitting through the quick return mirror 46.

As described above, with the semi-transparent quick return mirror 46 and the shielding plate 47 provided, in the finder shooting mode, the user can visually identify an object image with the finder optical system 6 before shooting, and light can be caused to reach the imaging unit 1. Also, when shooting is performed, incident light from the finder optical system 6 can be prevented from reaching the imaging unit 1 by the light shielding plate 47 while light from an object is directed to the imaging unit 1. In the live view shooting mode, incident light from the finder optical system 6 can be prevented from reaching the imaging unit 1 by the light shielding plate 47.

-Operation of Camera-

The camera 200 configured in the above-described manner has the two shooting modes, i.e., the finder shooting mode and the live view shooting mode which employ different methods for visually identifying an object. The operations of the two shooting modes of the camera 200 will be described hereinafter.

-Finder Shooting Mode-

Figure 28:
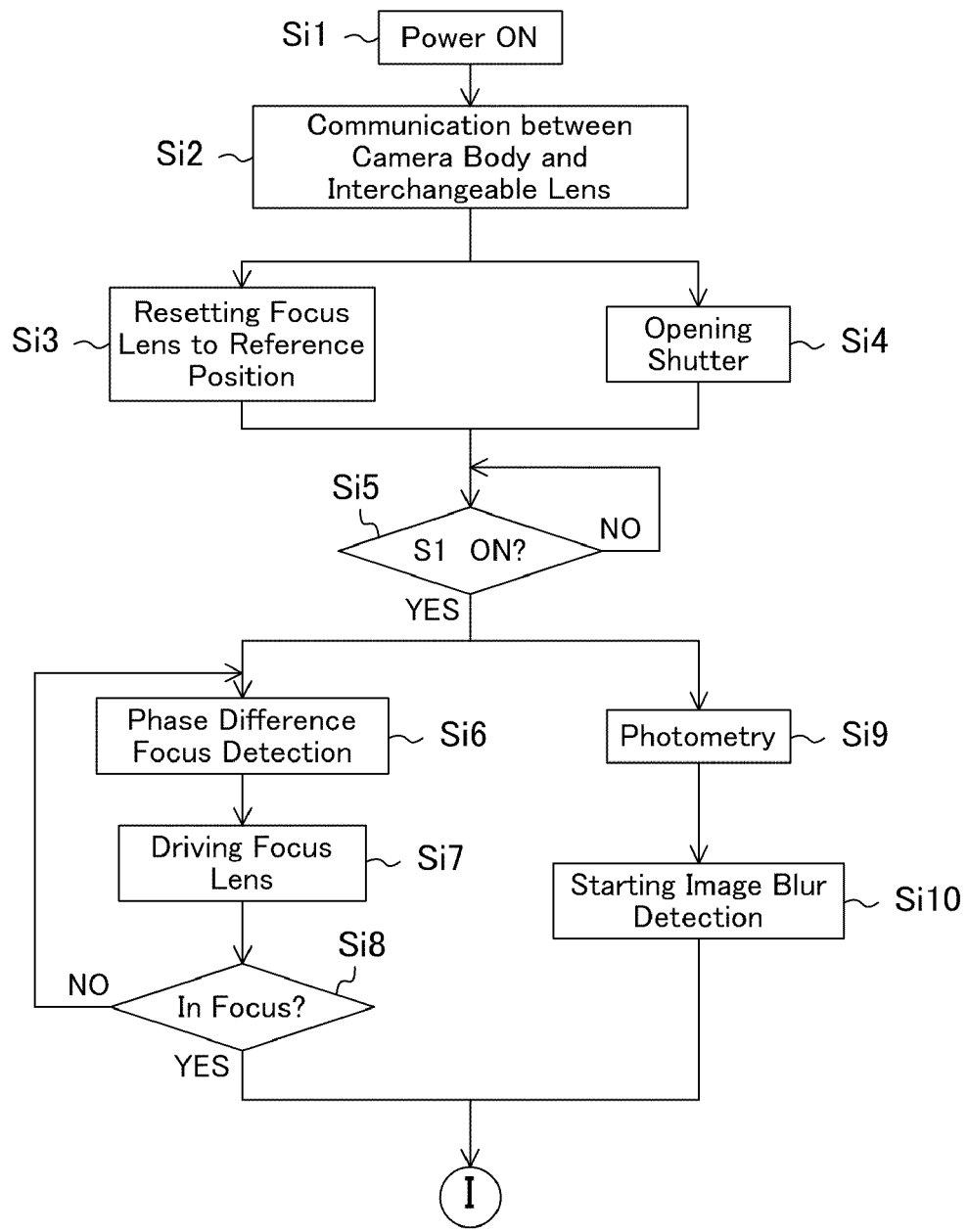
FIG. 28 is a flowchart of the steps in a finder shooting mode before the release button is pressed all the way down.
Figure 29:
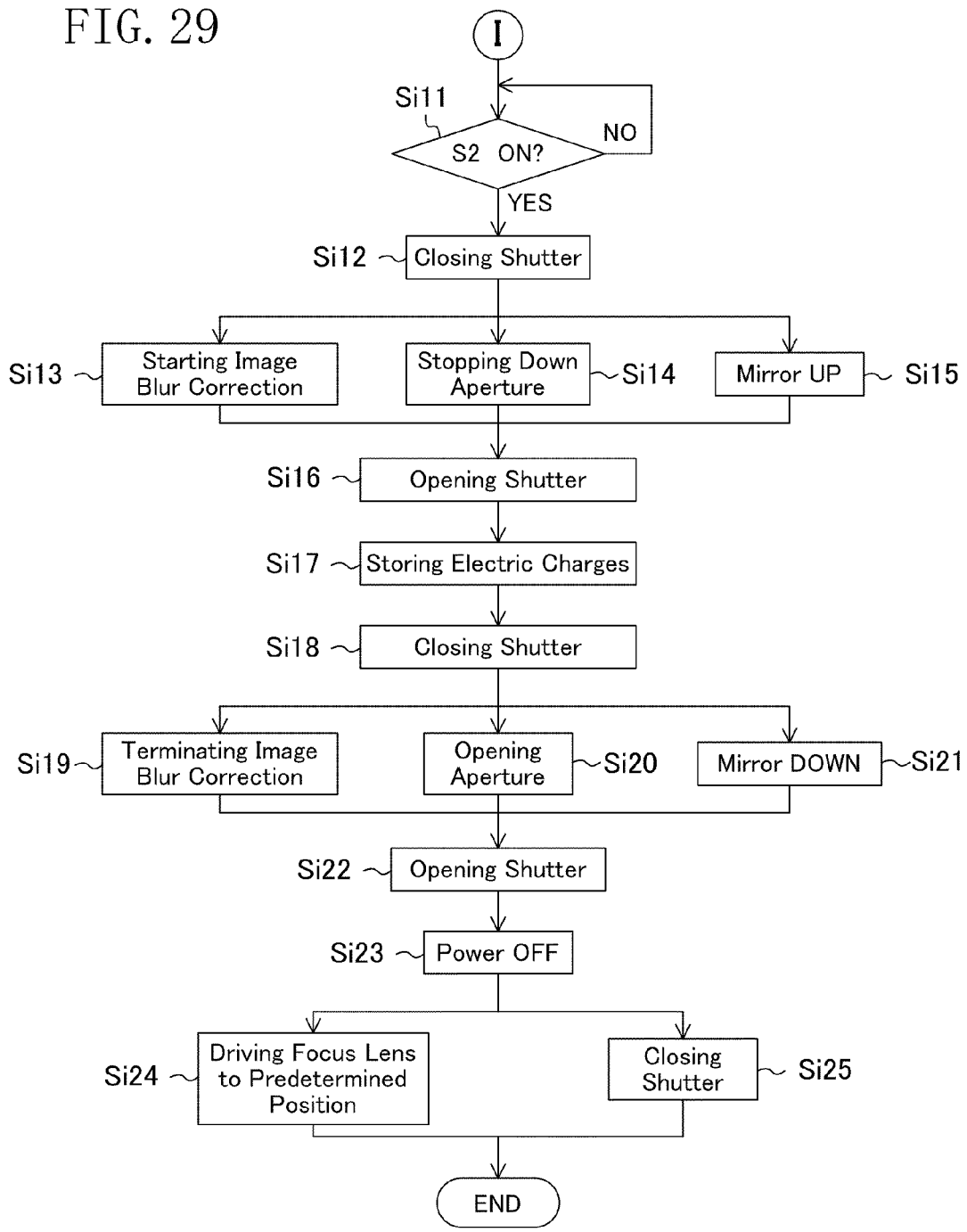
FIG. 29 is a flowchart of the steps in the finder shooting mode after the release button is pressed all the way down.

First, the shooting operation of the camera system in the finder shooting mode will be described hereinafter with reference to FIGS. 28 and 29.

The power switch 40a is turned on (Step Si1), the release button 40b is pressed halfway down by a user (Step Si5), and then, the release button 40b is pressed all the way down by the user (Step Si11), so that the shutter unit 42 is temporarily put into a close state (Step Si12). The above-described Steps Si1-Si12 are basically the same as Steps Sa1-Sa12 in phase difference detection AF of the eighth embodiment.

When the power switch 40a is turned on, the quick return mirror 46 is positioned at the reflection position on the optical path X. Thus, a part of light which has entered the camera body 204 is reflected and enters the finder screen 61.

Light which has entered the finder screen 61 is formed as an object image. The object image is converted into an erected image by the pentaprism 62, and enters the eye lens 63. That is, as opposed to the eighth embodiment, the object image is not displayed at the image display section 44, but the user can observe the erected image of the object through the eye lens 63. In this case, at the image display section 44, the object image is not displayed, but various pieces of information regarding shooting are displayed.

Then, when the release button 40b is pressed halfway down by the user (Step Si5), various pieces of information (such as information regarding AF and photometry which will be described later, and the like) regarding shooting are displayed at the in-finder display section 64 which the user can observe through the eye lens 63. That is, the user can identify each piece of information regarding shooting with not only the image display section 44 but also the in-finder display section 64.

In this case, since the quick return mirror 46 is semi-transparent, a part of light which has entered the camera body 204 is directed to the finder optical system 6 by the quick return mirror 46, but the rest of the light is transmitted through the quick return mirror 46 to enter the shutter unit 42. Then, when the shutter unit 42 is put into an open state (Step Si4), light transmitted through the quick return mirror 46 enters the imaging unit 1. As a result, visual identification of the object image through the finder optical system 6 is allowed, and autofocusing by the imaging unit 1 (Steps Si6-Si8) and photometry (Step Si9) can be performed.

Specifically, in Steps Si6-Si8, phase difference detection AF is performed based on an output from the phase difference detection unit 20 of the imaging unit 1 and, in parallel with phase difference detection AF, photometry can be performed based on an output of the imaging device 10 of the imaging unit 1 in Step Si9.

In phase difference detection in Step Si6, the object image light is transmitted through the quick return mirror 46, and accordingly, an optical length is increased by an amount corresponding to the thickness of the quick return mirror 46. Thus, a phase detection width of the phase difference detection section defers between when the quick return mirror 46 is retracted from an object image optical path and is put into an image capturing state and when the quick return mirror 46 is positioned at a reflection position. Therefore, in the finder shooting mode in which the quick return mirror 46 is interposed in the object image optical path, defocus information is output with a phase detection width obtained by changing the phase detection width in phase difference focus detection of the first embodiment (i.e., a phase detection width in phase difference focus detection of hybrid AF in the live view shooting mode which will be described later) by a predetermined amount. Note that the phase detection width means a reference phase difference used for determining that a calculated defocus amount is 0, i.e., an object is in focus.

Steps Si6-Si8 of performing phase difference detection AF is the same as Steps Sa6-Sa8 in phase difference detection AF of the eighth embodiment.

In Step Si9, the amount of light entering the imaging device 10 is measured by the imaging device 10. Note that in this embodiment, as opposed to the eighth embodiment, not the entire light from an object enters the imaging device 10, and thus, the body microcomputer 50 corrects an output from the imaging device 10 based on reflection characteristics of the quick return mirror 46 to obtain the amount of light from the object.

Then, after the release button 40b is pressed all the way down by the user (Step Si11) and the shutter unit 42 is temporarily put into a close state (Step Si12), in parallel with starting of image blur correction (Step Si13) and stopping down of the aperture section 73 (Step Si14), the quick return mirror 46 is flipped up to the retracted position in Step Si15.

Thereafter, in Steps Si16-Si18, similarly to Steps Sa15-Sa17 in phase difference detection AF of the eighth embodiment, exposure is performed.

After the exposure is terminated, in parallel with terminating of image blur correction (Step Si19) and opening of the aperture section 73 (Step Si20), the quick return mirror 46 is moved to the reflection position in Step Si21. Thus, the user can visually identify an object image through the finder optical system 6 again.

Thereafter, the shutter unit 42 is put into an open state (Step Si22). When a shooting sequence is terminated after resetting is completed, the process returns to Step Si5, and the body microcomputer remains in a standby state until the release button 40b is pressed halfway down by the user.

Steps Si23-Si25 after the power switch 40a is turned off are the same as Steps Sa21-Sa23 in phase difference detection AF of the eighth embodiment.

As described above, the phase difference detection unit 20 for detecting a phase difference using light transmitted through the imaging device 10 is provided to the imaging unit 1. Thus, even with the configuration in which light from an object is directed to the finder optical system 6 by the quick return mirror 46 and thereby an object image can be visually identified through the finder optical system 6, phase difference detection AF and photometry can be performed in parallel while allowing visual identification of the object image through the finder optical system 6 by employing the semi-transparent quick return mirror 46 and thus causing a part of light entering the quick return mirror 46 to reach the imaging unit 1. Therefore, there is no need to additionally provide a reflecting mirror for phase difference detection AF and a sensor for photometry, and also, photometry can be performed in parallel with autofocusing, so that a release time lag can be reduced.

-Live View Shooting Mode-

Figure 30:
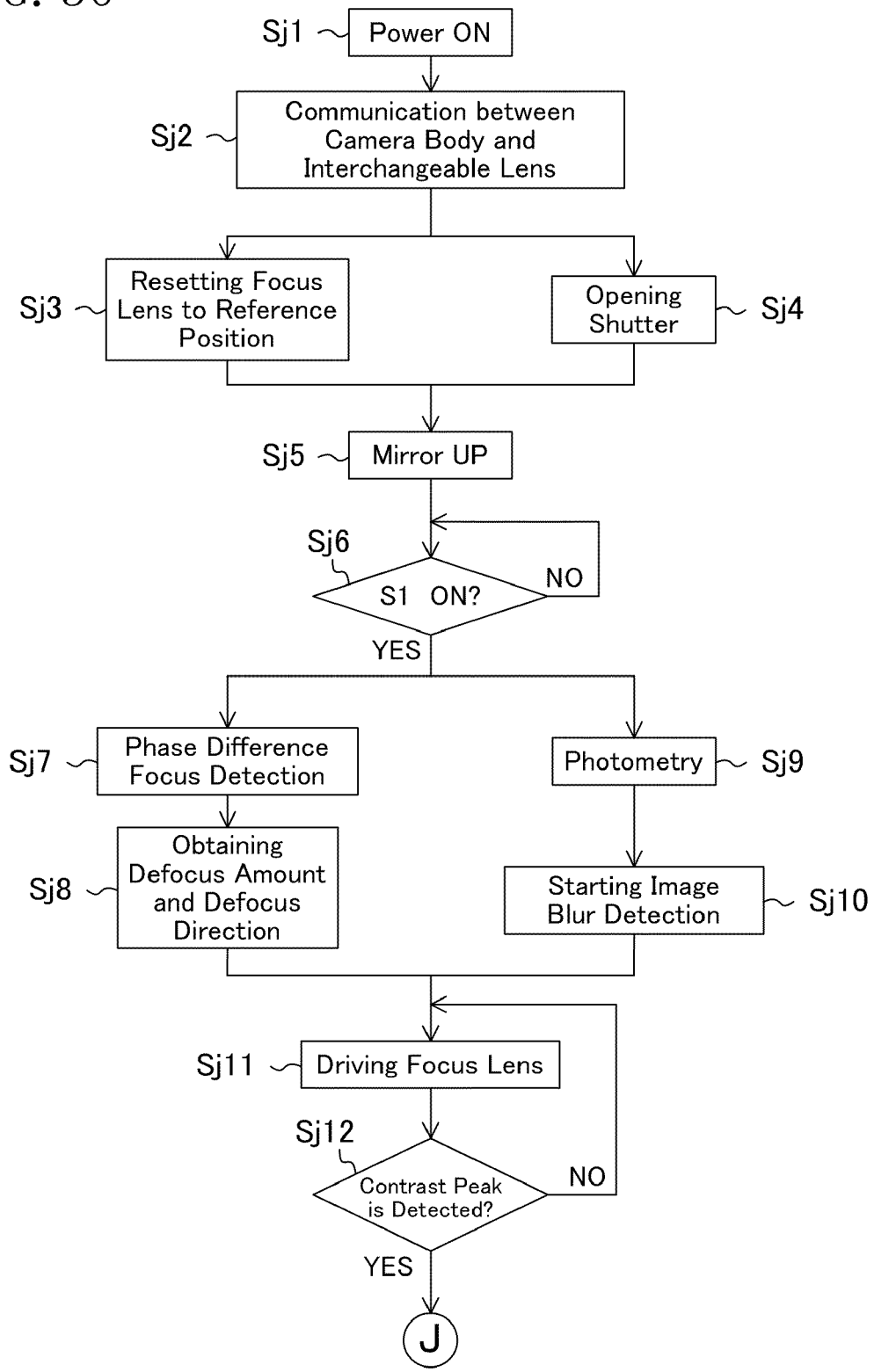
FIG. 30 is a flowchart of the steps in a live view shooting mode before the release button is pressed all the way down.
Figure 31:
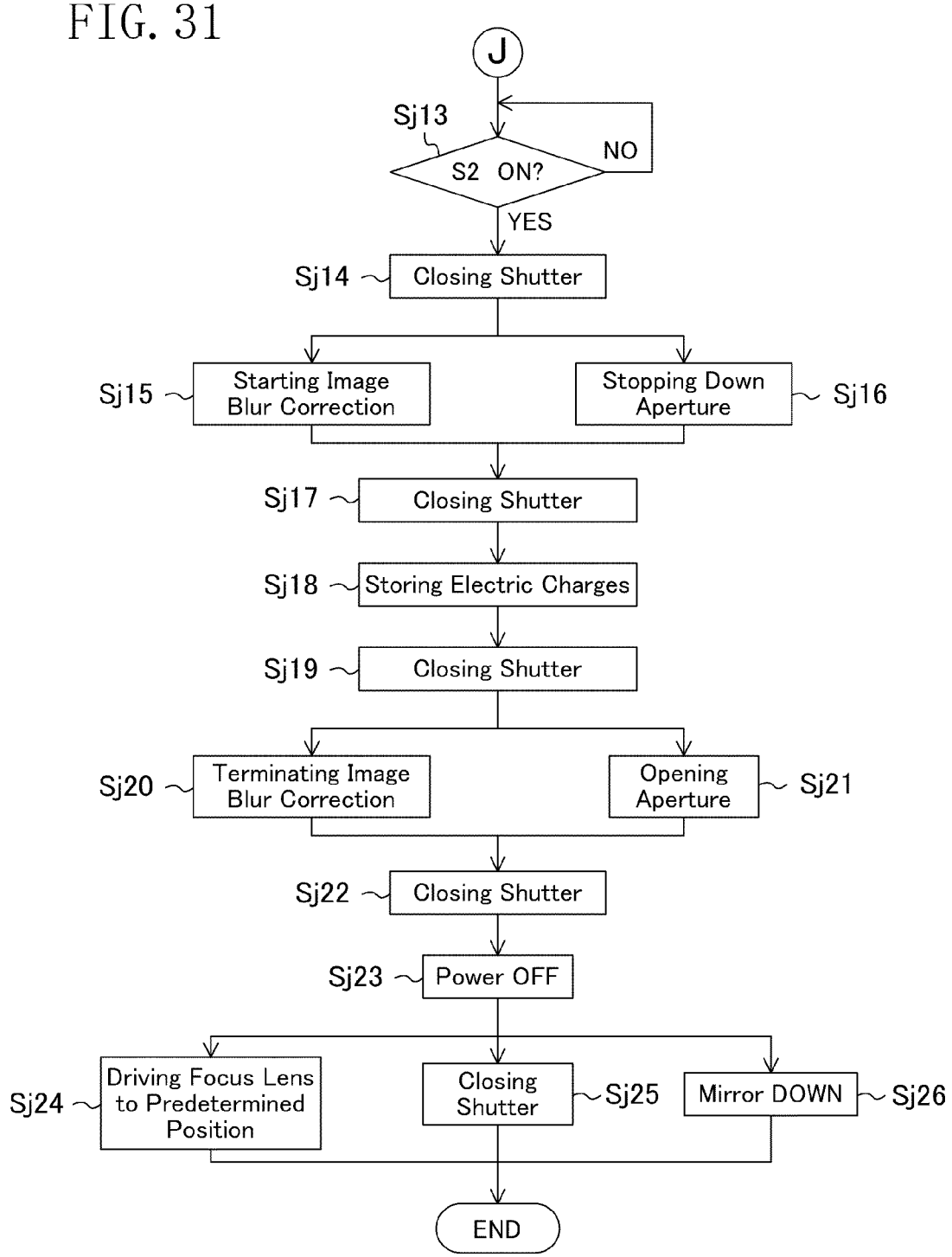
FIG. 31 is a flowchart of the steps in the live view shooting mode after the release button is pressed all the way down.

Next, the shooting operation of the camera system in a live view shooting mode will be described with reference to FIGS. 30 and 31.

First, in steps (Steps Sj1-Sj4) from the step in which the power switch 40a is turned on to the step in which the shutter unit 42 is put into an open state, the same operation as the operation in hybrid AF of the eighth embodiment is performed.

In this case, in the camera 200, immediately after the power switch 40a is turned on, the quick return mirror 46 is positioned at the reflection position, and thus, in Step Sj5, the body microcomputer 50 flips up the quick return mirror 46 to the retracted position.

As a result, light entering the camera body 204 from an object is not divided to be directed to the finder optical system 6, but passes through the shutter unit 42, is transmitted through the OLPF 43 serving also an IR cutter, and then, enters the imaging unit 1. An object image formed at the imaging unit 1 is displayed at the image display section 44, so that the user can observe the object image via the image display section 44. A part of light which has entered to the imaging unit 1 is transmitted through the imaging device 10 and enters the phase difference detection unit 20.

Then, when the release button 40b is pressed halfway down by the user (Step Sj6), as opposed to the finder shooting mode, hybrid AF is performed. Steps Sj7, Sj8, Sj11 and Sj12 according to this hybrid AF are the same as Steps Sc6, Sc7, Sc10 and Sc11 in hybrid AF of the eighth embodiment.

Note that the autofocusing method employed in this case is not limited to hybrid AF, but contrast detection AF or phase difference detection AF may be performed.

In parallel with hybrid AF, photometry is performed (Step Sj9), and image blur detection is started (Step Sj10). Steps Sj9 and Sj10 are the same as Steps Sc8 and Sc9 in hybrid AF of the eighth embodiment.

Thus, when the release button 40b is pressed halfway down by the user, various pieces of information regarding shooting (such as information regarding AF and photometry and the like) are displayed at the image display section 44.

Thereafter, the steps from the step (Step Sj13) in which the release button 40b is pressed all the way down by the user to the step (Step Sj22) in which exposure is terminated to complete resetting are basically the same as Steps Si11-Si22 in the finder shooting mode, except that the step (corresponding to Step Si15) of moving the quick return mirror 46 to the retracted position after the shutter unit 42 is put into a close state is not included, and that the step (corresponding to Step Si21) of moving the quick return mirror 46 to the reflection position after the shutter unit 42 is put into a close state to terminate exposure is not included.

According to this embodiment, when the power switch 40a is turned off (Step Sj23), the focus lens group 72 is moved to the reference position (Step Sj24) and, in parallel with putting the shutter unit 42 into a close state (Step Sj25), the quick return mirror 46 is moved to the reflection position in Step Sj26. Thereafter, respective operations of the body microcomputer 50 and other units in the camera body 204, and the lens microcomputer 80 and other units in the interchangeable lens 7 are halted.

The shooting operation of the camera system in the live view shooting mode is the same as the shooting operation of the camera 100 of the eighth embodiment, except the operation of the quick return mirror 46. That is, in the description above, hybrid AF has been described, but various shooting operations according to the eighth embodiment can be performed, and the same functional effects and advantages as those of the eighth embodiment can be achieved.

Other Embodiments

In connection with the above-described embodiments, the following configurations may be employed.

Specifically, according to the ninth embodiment, the finder optical system 6 is provided, but the configuration of the ninth embodiment is not limited thereto. For example, a configuration including an electronic view finder (EVF), instead of the finder optical system 6, may be employed. More specifically, a compact image display section comprised of a liquid crystal display or the like is arranged in the camera body 204 to be located at a position where the user can view the image display section through the finder, and image data obtained by the imaging unit 1 is displayed at the image display section. Thus, even if the complex finder optical system 6 is not provided, shooting while viewing through the finder can be realized. In such a configuration, the quick return mirror 46 is not necessary. The shooting operation is the same as that of the camera 100 of the eighth embodiment, although two image display sections are provided.

In each of the above-described eighth and ninth embodiments, the configuration in which the imaging unit 1 is mounted on a camera has been described. However, the present invention is not limited thereto. For example, the imaging unit 1 can be mounted on a video camera.

An example shooting operation of a video camera will be described. When the power switch 40a is turned on, an aperture section and a shutter unit are opened, and image capturing is started in the imaging device 10 of the imaging unit 1. Then, optimal photometry and white balance adjustment for displaying a live view are performed to display a live view image at the image display section. Thus, in parallel with image capturing by the imaging device 10, an in-focus state is detected based on an output of the phase difference detection unit 20 mounted in the imaging unit 1 and driving of the focus lens group is continued according to the movement of an object or the like. In this manner, the video camera remains in a standby state until a REC button is pressed while continuing to display a live view image and perform phase difference detection AF. When the REC button is operated, image data captured by the imaging device 10 is recorded while phase difference detection AF is repeated. Thus, an in-focus state can be maintained at all the time, and as opposed to a known digital camera, micro driving of a focus lens in an optical direction (wobbling) does not have to be performed, so that an actuator such as a motor and the like, which has a large electric load, does not need to be driven.

Also, the configuration in which when the release button 40b is pressed halfway down by the user (i.e., the S1 switch is turned on), AF is started has been described. However, AF may be performed before the release button 40b is pressed halfway down. Moreover, the configuration in which AF is terminated when it is determined that an object image has been brought into focus has been described. However, AF may be continued after focus determination, and also AF may be continuously performed without performing focus determination. A specific example will be described hereinafter. In FIGS. 16 and 17, after the shutter unit 42 is opened in Step Sa4, phase difference focus detection of Step Sa6 and focus lens driving of Step Sa7 are performed repeatedly. In parallel with this operation, determination of Step Sa5, photometry of Step Sa9, image blur detection of Step Sa10, and determination of Step Sa11 are performed. Thus, an in-focus state can be achieved even before the release button 40b is pressed halfway down by the user. For example, by using this operation with live view image display, display of a live view image in an in-focus state is allowed. If phase difference detection AF is used, live view image display and phase difference detection AF can be used together. The above-described operation may be added as a "continuous AF mode" to the function of a camera. A configuration in which the "continuous AF mode" is changeable between on and off may be employed.

In each of the above-described embodiments, the configuration in which the imaging unit 1 is mounted in a camera has been described. However, the present invention is not limited to the above-described configuration. The camera in which the imaging unit 1 is mounted is an example of cameras in which exposure of an imaging device and phase difference detection by a phase difference detection unit can be simultaneously performed. A camera according to the present invention is not limited thereto, but may have a configuration in which object light is guided to both of an imaging device and a phase difference detection unit, for example, by an optical isolation device (such as, for example, a prism, a semi-transparent mirror, and the like) for isolating light to the image device. Moreover, a camera in which a part of each microlens of an imaging device is used as a separator lens and is arranged so that pupil-divided object light can be received at light receiving sections may be employed.

Note that the above-described embodiments are essentially preferable examples which are illustrative and do not limit the present invention, its applications and the scope of use of the invention.

INDUSTRIAL APPLICABILITY

As has been described, the present invention is useful particularly for an imaging apparatus including an imaging device for performing photoelectric conversion.

The invention claimed is:

1. An imaging apparatus, comprising:
    an imaging device for receiving light to perform photoelectric conversion, the device being configured so that light passes through the imaging device;
    a phase difference detection section including a sensor for receiving the light which has passed through the imaging device to perform phase difference detection; and
    a bending section, provided between the imaging device and the sensor, for bending an optical path of the light which has passed through the imaging device to direct the light to the sensor.

2. The imaging apparatus of claim 1, wherein
    the phase difference detection section further includes a separator lens for dividing the light which has passed through the imaging device, and is configured to detect a phase difference between the light beams divided by the separator lens using the sensor, and
    the bending section is provided between the imaging device and the separator lens.

3. The imaging apparatus of claim 1, wherein
    the phase difference detection section further includes a separator lens for bending an optical path of the light which has passed through the imaging device and dividing the light, and is configured to detect a phase difference between the light beams divided by the separator lens using the sensor, and
    the bending section is the separator lens.

4. The imaging apparatus of claim 1, wherein
    the phase difference detection section further includes a condenser lens for collecting the light which has passed through the imaging device and a separator lens for dividing the light collected by the condenser lens, and is configured to detect a phase difference between the light beams divided by the separator lens using the sensor, and
    the bending section is provided between the imaging device and the condenser lens.

5. The imaging apparatus of claim 1, wherein
    the phase difference detection section further includes a condenser lens for collecting the light which has passed through the imaging device and a separator lens for dividing the light collected by the condenser lens, and is configured to detect a phase difference between the light beams divided by the separator lens using the sensor, and
    the bending section is provided between the condenser lens and the separator lens.

6. The imaging apparatus of claim 1, wherein
    the phase difference detection section further includes a condenser lens for collecting the light which has passed through the imaging device and bending an optical path of the light and a separator lens for dividing the light collected by the condenser lens, and is configured to detect a phase difference between the light beams divided by the separator lens using the sensor, and
    the bending section is the condenser lens.

* * * * *